(12) United States Patent
Shiau et al.

(10) Patent No.: US 7,176,074 B1
(45) Date of Patent: Feb. 13, 2007

(54) MANUFACTURING METHOD OF THIN FILM TRANSISTOR ARRAY SUBSTRATE

(75) Inventors: Fu-Yuan Shiau, Chiayi (TW); Yu-Liang Wen, Taipei (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 0 days.

(21) Appl. No.: 11/463,595

(22) Filed: Aug. 10, 2006

(51) Int. Cl.
*H01L 21/84* (2006.01)
(52) U.S. Cl. ............... 438/164; 438/950; 257/E21.412
(58) Field of Classification Search ........ 438/151–166, 438/950; 257/E21.412
See application file for complete search history.

(56) References Cited

U.S. PATENT DOCUMENTS 5,953,582 A * 9/1999 Yudasaka et al. ............. 438/29
7,122,830 B2 * 10/2006 Ishikawa et al. .............. 257/59

2003/0178650 A1   9/2003   Sonoda et al.
2004/0086807 A1   5/2004   Peng et al.

* cited by examiner

*Primary Examiner*—Richard A. Booth
(74) *Attorney, Agent, or Firm*—Jianq Chyun IP Office

(57) ABSTRACT

A manufacturing method of thin film transistor array substrate is provided. A substrate, whereon first, second, and third poly-silicon islands, a gate insulating layer, a plurality of first, second, and third gates, and a first passivation layer have been formed, is provided. A third patterned photoresist layer is formed on the first passivation layer by using a third half-tone mask. A first ion implantation process is performed with the third patterned photoresist layer as mask to form first sources/drains. A portion of the thickness of the third patterned photoresist layer is removed, and then portions of the first passivation layer and the gate insulating layer are removed with the third patterned photoresist layer as mask to form the first patterned passivation layer. The third patterned photoresist layer is removed. First, second and third source/drain conductive layers, a second patterned passivation layer, and pixel electrodes are formed in sequence.

21 Claims, 33 Drawing Sheets

MANUFACTURING METHOD OF THIN FILM TRANSISTOR ARRAY SUBSTRATE

BACKGROUND OF THE INVENTION

1. Field of the Invention

The present invention relates to a manufacturing method of active component array substrate. More particularly, the present invention relates to a manufacturing method of thin film transistor array substrate.

2. Description of Related Art

Low temperature poly-silicon thin film transistor (LTPS TFT) overcomes the problem of electron mobility, and furthermore, provides the complementary circuit technology, thus, LTPS TFT has great advantages in device minimization, aperture ratio, image quality and resolution. Besides, presently, the design of LTPS TFT integrates driving circuit into glass, and the increase in system integration further allows the panel has the characteristics of narrow frame size and high image quality. Moreover, LTPS TFT has such advantages as low power consumption, low electromagnetic interference etc., thus, development and improvement in the manufacturing process of LTPS TFT have been highly focused. Below two conventional manufacturing methods of LTPS TFT will be described.

FIGS. 1A~1E are diagrams illustrating a conventional manufacturing flow of a LTPS TFT array substrate. Referring to FIG. 1A first, the conventional manufacturing method of LTPS TFT array substrate includes following steps. First, a array region 110b. Next, a buffer layer 120 is formed on the substrate 110. After that, a plurality of first poly-silicon islands 130a, a plurality of second poly-silicon islands 130b, and a plurality of third poly-silicon islands 130c are formed on the buffer layer 120. Wherein, the first and the second poly-silicon islands 130a and 130b are disposed on the peripheral region 110a and the third poly-silicon islands 130c are disposed on the array region 110b. A patterned photoresist layer 210 is formed above the substrate 110 to cover the first poly-silicon islands 130a. Then, a channel doping process S110 is performed to the second and the third poly-silicon islands 130b and 130c with the patterned photoresist layer 210 as mask. Next, the patterned photoresist layer 210 is removed.

Referring to FIG. 1B, a patterned photoresist layer 220b is formed above the substrate 110 to cover the first poly-silicon islands 130a and portions of the second and the third poly-silicon islands 130b and 130c. Then, a second ion implantation process S120b is performed to the second and the third poly-silicon islands 130b and 130c with the patterned photoresist layer 220b as mask, so as to form a second source/drain 132b in each of the second poly-silicon islands 130b and a third source/drain 132c in each of the third poly-silicon islands 130c. In addition, a second channel region 134b is between each second source/drain 132b, and a third channel region 134c is between each third source/drain 132c. Next, the patterned photoresist layer 220b is removed.

Referring to FIG. 1C, a gate insulating layer 140 is formed on the buffer layer 120 to cover the first, the second, and the third poly-silicon islands 130a, 130b, and 130c. Next, a plurality of first gates 150a, a plurality of second gates 150b, a plurality of third gates 150c, and a plurality of capacitance electrodes 150d are formed on the gate insulating layer 140. After that, a lightly doped drain ion implantation process S130 is performed to the second and the third poly-silicon islands 130b and 130c to form a plurality of second lightly doped drains 136b and a plurality of third lightly doped drains 136c.

Referring to FIG. 1D, a patterned photoresist layer 220a is formed above the substrate 110 to cover the second and the third poly-silicon islands 130b and 130c. Next, a first ion implantation process S120a is performed to the first poly-silicon islands 130a to form a plurality of first sources/drains 132a. Besides, a first channel region 134a is between each first source/drain 132a. Next, the patterned photoresist layer 220a is removed.

Referring to FIG. 1E, a first patterned passivation layer 160 is formed on the gate insulating layer 140 and which exposes portions of each of the first sources/drains 132a, portions of each of the second sources/drains 132b, and portions of each of the third sources/drains 132c. Next, a plurality of first source/drain conductive layers 170a, a plurality of second source/drain conductive layers 170b, and a plurality of third source/drain conductive layers 170c are formed on the first patterned passivation layer 160. Wherein, each of the first source/drain conductive layers 170a is electrically connected to the first source/drain 132a, and each of the second source/drain conductive layers 170b is electrically connected to the second source/drain 132a. In addition, each of the third source/drain conductive layers 170c is electrically connected to the third source/drain 132c.

Next, a second patterned passivation layer 180 is formed on the first patterned passivation layer 160 and which exposes portions of the third source/drain conductive layers 170c. After that, a plurality of pixel electrodes 190 is formed on the second patterned passivation layer 180 and each pixel electrode is electrically connected to the corresponding third source/drain conductive layer 170c. Here the conventional manufacturing flow of the LTPS TFT array substrate 100 is about completed. Below another conventional manufacturing method of LTPS TFT array substrate will be described.

FIGS. 2A~2E are diagrams illustrating another conventional manufacturing flow of a LTPS TFT array substrate. Referring to FIGS. 2A~2B, the content of FIGS. 2A~2B is approximately the same as that of FIGS. 1A~1B. In short, the buffer layer 120, the first poly-silicon islands 130a, the second poly-silicon islands 130b, the third poly-silicon islands 130c, the channel doping process S110, and the second ion implantation process S120b are completed on the substrate 110 in sequence.

Referring to FIG. 2C, a gate insulating layer 140 is formed on the buffer layer 120 and which covers the first, the second, and the third poly-silicon islands 130a, 130b, and 130c. Then, a patterned conductive material layer 150 and a plurality of first gates 150a are formed on the gate insulating layer 140. The patterned conductive material layer 150 covers the second poly-silicon islands 130b and the third poly-silicon islands 130c. Next, a first ion implantation process S120a is performed to the first poly-silicon islands 130a with the first gates 150a as mask to form a plurality of first sources/drains 132a. Besides, a first channel region 134a is between each of the first sources/drains 132a.

Referring to FIG. 2D, a patterned metal layer 150 is patterned to form a plurality of second gates 150b, a plurality of third gates 150c, and a plurality of capacitance electrodes 150d. Next, a lightly doped drain ion implantation process S130 is performed to form a plurality of second lightly doped drains 136b and a plurality of third lightly doped drains 136c.

Refer to FIG. 2E, whose content is similar to that of FIG. 1E. In short, after performing the lightly doped drain ion implantation process S130, the first patterned passivation layer 160, the first source/drain conductive layers 170a, the second source/drain conductive layers 170b, the third source/drain conductive layers 170c, the second patterned passivation layer 180, and the pixel electrode 190 are formed in sequence to complete the conventional manufacturing process of LTPS TFT array substrate 100.

LTPS TFT array substrate has advantages such as high aperture ratio and narrow frame size since the driving circuit is integrated to the glass substrate. However, compared to the 5 photo mask processes of typical amorphous silicon TFT (a-Si TFT) array substrate, the 9 photo mask processes of LTPS TFT array substrate is more complex. Accordingly, it is difficult to increase the panel size of the conventional manufacturing process of LTPS TFT array substrate and to control product qualified rate, which may further cause the problem of high manufacturing cost.

SUMMARY OF THE INVENTION

Accordingly, the present invention is directed to provide a manufacturing method of thin film transistor (TFT) array substrate to reduce the number of masks.

To achieve the aforementioned or other objectives, the present invention provides a manufacturing method of TFT array substrate including following steps. First, a substrate whereon a plurality of first poly-silicon islands, a plurality of second poly-silicon islands, a plurality of third poly-silicon islands, a gate insulating layer, a plurality of first gates, a plurality of second gates, a plurality of third gates, and a first passivation layer have been formed is provided. Wherein the substrate has a peripheral region and an array region, the first poly-silicon islands and the second poly-silicon islands are disposed on the peripheral region, and the third poly-silicon islands are disposed on the array region. The gate insulating layer covers the first poly-silicon islands, the second poly-silicon islands, and the third poly-silicon islands. The first gates, the second gates, and the third gates are respectively disposed on the gate insulating layers over the first poly-silicon islands, the second poly-silicon islands, and the third poly-silicon islands. The first passivation layer covers the first gates, the second gates, and the third gates, a second source/drain has been formed in each of the second poly-silicon islands, and a third source/drain has been formed in each of the third poly-silicon islands. Moreover, ions have been implanted into the second poly-silicon islands and the third poly-silicon islands. Then, a third patterned photoresist layer is formed on the first passivation layer by using a third half-tone mask, wherein the third patterned photoresist layer exposes portions of the first passivation layer above the first poly-silicon islands. Next, a first ion implantation process is performed with the third patterned photoresist layer as mask to form a first source/drain in each of the first poly-silicon islands, wherein a first channel region is between the first source/drain. Next, a portion of the thickness of the third patterned photoresist layer is removed to expose portions of the first passivation layer above the poly-silicon islands and the third poly-silicon islands. After that, a portion of the first passivation layer and the gate insulating layer are removed with the third patterned photoresist layer as mask to expose a portion of each of the first source/drain, a portion of each of the second source/drain, and a portion of each of the third source/drain and to form a first patterned passivation layer, then the third patterned photoresist layer is removed. A plurality of first source/drain conductive layers, a plurality of second source/drain conductive layers, and a plurality of third source/drain conductive layers are formed on the first patterned passivation layer, wherein the first source/drain conductive layers are electrically connected to the first sources/drains respectively, the second source/drain conductive layers are electrically connected to the second sources/drains respectively, and the third source/drain conductive layers are electrically connected to the third sources/drains respectively. Next, a second patterned passivation layer is formed on the first patterned passivation layer, wherein the second patterned passivation layer exposes a portion of each of the third source/drain conductive layers. After that, a plurality of pixel electrodes is formed on the second patterned passivation layer, wherein each of the pixel electrodes is electrically connected to the corresponding third source/drain conductive layer.

According to an embodiment of the present invention, the method for forming the first poly-silicon islands, the second poly-silicon islands, and the third poly-silicon islands includes following steps. A poly-silicon layer is formed on the substrate, and then, a first patterned photoresist layer is formed on the poly-silicon layer by using a first half-tone mask. A portion of the poly-silicon layer is removed with the first patterned photoresist layer as mask to form the first poly-silicon islands, the second poly-silicon islands, and the third poly-silicon islands. The first patterned photoresist layer on the second poly-silicon islands and the third poly-silicon islands is removed, then a channel doping process is performed to implant ions into the second poly-silicon islands and the third poly-silicon islands, and then the first patterned photoresist layer is removed.

According to an embodiment of the present invention, following steps are further included after removing the first patterned photoresist layer. A second ion implantation process is performed to form a second source/drain in each of the second poly-silicon islands and a third source/drain in each of the third poly-silicon islands. Wherein, a second channel region is between the second source/drain, and a third channel region is between the third source/drain. Next, a gate insulating layer is formed above the substrate to cover the first poly-silicon islands, the second poly-silicon islands, and the third poly-silicon islands. After that, the first gates, the second gates, and the third gates are formed on the gate insulating layer, wherein the first gates, the second gates, and the third gates are respectively disposed above the first poly-silicon islands, the second poly-silicon islands, and the third poly-silicon islands. Next, a first passivation layer is formed above the substrate to cover the first gates, the second gates, and the third gates.

According to an embodiment of the present invention, a lightly doped drain ion implantation process is further performed after forming the first gates, the second gates, and the third gates to form a second light doped drain between each second source/drain and the second channel region and a third lightly doped drain between each third source/drain and the third channel region.

According to an embodiment of the present invention, the method for forming the second sources/drains and the third sources/drains includes following steps. First, the first poly-silicon islands, the second poly-silicon islands, and the third poly-silicon islands are formed on the substrate. Next, a second patterned photoresist layer is formed on the first poly-silicon islands, the second poly-silicon islands, and the third poly-silicon islands by using a second half-tone mask. After that, a second ion implantation process is performed to form a second source/drain in each of the second poly-silicon islands and a third source/drain in each of the third poly-silicon islands. Wherein, a second channel region is between the second source/drain and a third channel region is between the third source/drain. Next, the second patterned photoresist layer on the second poly-silicon islands and the third poly-silicon islands is removed. Next, a channel doping process is performed to implant ions into the second poly-silicon islands and the third poly-silicon islands. Next, the second patterned photoresist layer is removed.

According to an embodiment of the present invention, following steps are further included after removing the second patterned photoresist layer. A gate insulating layer is formed above the substrate first to cover the first poly-silicon islands, the second poly-silicon islands, and the third poly-silicon islands. Next, the first gates, the second gates, and the third gates are formed on the gate insulating layer. Wherein the first gates, the second gates, and the third gates are respectively disposed above the first poly-silicon islands, the second poly-silicon islands, and the third poly-silicon islands. After that, a first passivation layer is formed above the substrate to cover the first gates, the second gates, and the third gates.

According to an embodiment of the present invention, a lightly doped drain ion implantation process is further performed after forming the first gates, the second gates, and the third gates to form a second lightly doped drain between the second source/drain and the second channel region and a third lightly doped drain between the third source/drain and the third channel region.

To achieve the aforementioned or other objectives, the present invention provides another manufacturing method of TFT array substrate, which includes following steps. First, a substrate whereon a plurality of first poly-silicon islands, a plurality of second poly-silicon islands, a plurality of third poly-silicon islands, and a gate insulating layer have been formed is provided. Wherein, the substrate has a peripheral region and an array region, the first poly-silicon islands and the second poly-silicon islands are disposed on the peripheral region and the third poly-silicon islands are disposed on the array region. The gate insulating layer covers the first poly-silicon islands, the second poly-silicon islands, and the third poly-silicon islands. Moreover, ions have been implanted into the second poly-silicon islands and the third poly-silicon islands. Furthermore, a second source/drain has been formed in each of the second poly-silicon islands and a third source/drain has been formed in each of the third poly-silicon islands. Besides, a second channel region is between the second source/drain and a third channel region is between the third source/drain. Next, a conductive material layer is formed on the gate insulating layer, and a fourth patterned photoresist layer is formed on the conductive material layer by using a fourth half-tone mask. After that, portions of the conductive material layer are removed with the fourth patterned photoresist layer as mask to form a plurality of first gates. Then a first ion implantation process is performed with the fourth patterned photoresist layer as mask to form a first source/drain in each of the first poly-silicon islands, wherein a first channel region is between the first source/drain. Next, a portion of the thickness of the fourth patterned photoresist layer is removed to expose portions of the gate insulating layer above the second poly-silicon islands and the third poly-silicon islands. Then portions of the conductive material layer is removed with the fourth patterned photoresist layer as mask to form a plurality of second gates and a plurality of third gates, and then the fourth patterned photoresist layer is removed. A first patterned passivation layer is formed on the gate insulating layer to cover the first gates, the second gates, and the third gates, wherein the first patterned passivation layer exposes portions of the gate insulating layer on the first poly-silicon islands, the second poly-silicon islands, and the third poly-silicon islands. Next, portions of the gate insulating layer are removed with the first patterned passivation layer as mask to expose portions of each of the first sources/drains, portions of each of the second sources/drains, and portions of each of the third sources/drains. After that, a plurality of first source/drain conductive layers, a plurality of second source/drain conductive layers, and a plurality of third source/drain conductive layers are formed on the first patterned passivation layer. Wherein, the first source/drain conductive layers are electrically connected to the first sources/drains respectively, the second source/drain conductive layers are electrically connected to the second sources/drains respectively, and the third source/drain conductive layers are electrically connected to the third sources/drains respectively. A second patterned passivation layer is formed on the first patterned passivation layer, wherein the second patterned passivation layer exposes a portion of each of the third source/drain conductive layers. Next, a plurality of pixel electrodes is formed on the second patterned passivation layer, wherein each of the pixel electrodes is electrically connected to the corresponding third source/drain conductive layer.

According to another embodiment of the present invention, a lightly doped drain ion implantation process is further performed after removing the fourth patterned photoresist layer to form a second lightly doped drain between each of the second sources/drains and the second channel region and a third lightly doped drain between each of the third sources/drains and the third channel region.

According to another embodiment of the present invention, the method for forming the first poly-silicon islands, the second poly-silicon islands, and the third poly-silicon islands includes following steps. A poly-silicon layer is formed on the substrate, and then a first patterned photoresist layer is formed on the poly-silicon layer by using a first half-tone mask. Portions of the poly-silicon layer are removed with the first patterned photoresist layer as mask to form the first poly-silicon islands, the second poly-silicon islands, and the third poly-silicon islands. The first patterned photoresist layer on the second poly-silicon islands and the third poly-silicon islands is removed, and then a channel doping process is performed to implant ions into the second poly-silicon islands and the third poly-silicon islands. Next the first patterned photoresist layer is removed.

According to another embodiment of the present invention, following steps are further included after removing the first patterned photoresist layer. A second ion implantation process is performed to form the second source/drain in each of the second poly-silicon islands and the third source/drain in each of the third poly-silicon islands. Next, a gate insulating layer is formed above the substrate to cover the first poly-silicon islands, the second poly-silicon islands, and the third poly-silicon islands.

According to another embodiment of the present invention, the method for forming the second sources/drains and the third sources/drains includes following steps. First, the first poly-silicon islands, the second poly-silicon islands, and the third poly-silicon islands are formed on the substrate. Next, a second patterned photoresist layer is formed on the first poly-silicon islands, the second poly-silicon islands, and the third poly-silicon islands by using a second half-tone mask. After that, a second ion implantation process is performed to form a second source/drain in each of the second poly-silicon islands and a third source/drain in each of the third poly-silicon islands. Next, the second patterned photoresist layer on the second poly-silicon islands and the third poly-silicon islands is removed. After that, a channel doping process is performed to implant ions into the second poly-silicon islands and the third poly-silicon islands. Next, the second patterned photoresist layer is removed.

According to another embodiment of the present invention, a gate insulating layer is further formed above the substrate after removing the second patterned photoresist layer to cover the first poly-silicon islands, the second poly-silicon islands, and the third poly-silicon islands.

To achieve the aforementioned or other objectives, the present invention further provides a manufacturing method of TFT array substrate, which includes following steps. First, a poly-silicon layer is formed on a substrate and the substrate has a peripheral region and an array region. Next, a first patterned photoresist layer is formed on the poly-silicon layer by using a first half-tone mask. Then portions of the poly-silicon layer are removed with the first patterned photoresist layer as mask to form a plurality of first poly-silicon islands, a plurality of second poly-silicon islands, and a plurality of third poly-silicon islands. Wherein, the first poly-silicon islands and the second poly-silicon islands are disposed on the peripheral region and the third poly-silicon islands are disposed on the array region. Next, the first patterned photoresist layer on the second poly-silicon islands and the third poly-silicon islands is removed. After that, a channel doping process is performed to implant ions into the second poly-silicon islands and the third poly-silicon islands. Next, the first patterned photoresist layer is removed. A second ion implantation process is performed to form a second source/drain in each of the second poly-silicon islands and a third source/drain in each of the third poly-silicon islands. Wherein a second channel region is between the second source/drain and a third channel region is between the third source/drain. Next, a gate insulating layer is formed above the substrate to cover the first poly-silicon islands, the second poly-silicon islands, and the third poly-silicon islands. After that, a plurality of first gates, a plurality of second gates, and a plurality of third gates are formed on the gate insulating layer. Wherein the first gates, the second gates, and the third gates are respectively disposed above the first poly-silicon islands, the second poly-silicon islands, and the third poly-silicon islands. Next, a first ion implantation process is performed to form a first source/drain in each of the first poly-silicon islands, and a first channel region is between the first source/drain. A first patterned passivation layer is formed above the substrate to cover the first gates, the second gates, and the third gates. Next, portions of the gate insulating layer are removed with the first patterned passivation layer as mask to expose portions of each of the first sources/drains, portions of each of the second sources/drains, and portions of each of the third sources/drains. After that, a plurality of first source/drain conductive layers, a plurality of second source/drain conductive layers, and a plurality of third source/drain conductive layers are formed on the first patterned passivation layer. Wherein, the first source/drain conductive layers are electrically connected to the first sources/drains respectively, the second source/drain conductive layers are electrically connected to the second sources/drains respectively, and the third source/drain conductive layers are electrically connected to the third sources/drains respectively. Next, a second patterned passivation layer is formed on the first patterned passivation layer. Wherein the second patterned passivation layer exposes a portion of each of the third source/drain conductive layers. After that, a plurality of pixel electrodes is formed on the second patterned passivation layer. Wherein each pixel electrode is electrically connected to the corresponding third source/drain conductive layer.

According to yet another embodiment of the present invention, a lightly doped drain ion implantation process is further performed after forming the first gates, the second gates, and the third gates to form a second lightly doped drain between each of the second sources/drains and the second channel region and a third lightly doped drain between each of the third sources/drains and the third channel region.

To achieve the aforementioned or other objectives, the present invention further provides a manufacturing method of TFT array substrate, which includes following steps. First, a plurality of first poly-silicon islands, a plurality of second poly-silicon islands, and a plurality of third poly-silicon islands are formed on a substrate. Wherein the substrate has a peripheral region and an array region, and the first poly-silicon islands and the second poly-silicon islands are disposed on the peripheral region and the third poly-silicon islands are disposed on the array region. Next, a second patterned photoresist layer is formed on the first poly-silicon islands, the second poly-silicon islands, and the third poly-silicon islands by using a second half-tone mask. After that, a second ion implantation process is performed to form a second source/drain in each of the second poly-silicon islands and a third source/drain in each of the third poly-silicon islands. Wherein a second channel region is between the second source/drain and a third channel region is between the third source/drain. Next, the second patterned photoresist layer on the second poly-silicon islands and the third poly-silicon islands is removed. A channel doping process is performed to implant ions into the second poly-silicon islands and the third poly-silicon islands. Next, the second patterned photoresist layer is removed. A gate insulating layer is formed above the substrate to cover the first poly-silicon islands, the second poly-silicon islands, and the third poly-silicon islands. Next, a plurality of first gates, a plurality of second gates, and a plurality of third gates are formed on the gate insulating layer. Wherein, the first gates, the second gates, and the third gates are respectively disposed above the first poly-silicon islands, the second poly-silicon islands, and the third poly-silicon islands. After that, a first ion implantation process is performed to form a first source/drain in each of the first poly-silicon islands, and a first channel region is between the first source/drain. Next, a first patterned passivation layer is formed above the substrate to cover the first gates, the second gates, and the third gates. Next, portions of the gate insulating layer are removed with the first patterned passivation layer as mask to expose portions of each of the first sources/drains, portions of each of the second sources/drains, and portions of each of the third sources/drains. Next, a plurality of first source/drain conductive layers, a plurality of second source/drain conductive layers, and a plurality of third source/drain conductive layers are formed on the first patterned passivation layer. Wherein the first source/drain conductive layers are electrically connected to the first sources/drains respectively, the second source/drain conductive layers are electrically connected to the second sources/drains respectively, and the third source/drain conductive layers are electrically connected to the third sources/drains respectively. Next, a second patterned passivation layer is formed on the first patterned passivation layer. Wherein the second patterned passivation layer exposes a portion of each of the third source/drain conductive layers. Next, a plurality of pixel electrodes is formed on the second patterned passivation layer. Wherein each pixel electrode is electrically connected to the corresponding third source/drain conductive layer.

According to yet another embodiment of the present invention, a lightly doped drain ion implantation process is further performed after forming the first gates, the second gates, and the third gates to form a second lightly doped drain between each second source/drain and the second channel region and a third light doped drain between each third source/drain and the third channel region.

To achieve the aforementioned or other objectives, the present invention further provides a manufacturing method of TFT array substrate, which includes following steps. First, a poly-silicon layer is formed on a substrate, and the substrate has a peripheral region and an array region. A first patterned photoresist layer is formed on the poly-silicon layer by using a first half-tone mask. Next, portions of the poly-silicon layer are removed with the first patterned photoresist layer as mask to form a plurality of first poly-silicon islands, a plurality of second poly-silicon islands, and a plurality of third poly-silicon islands. Wherein the first poly-silicon islands and the second poly-silicon islands are disposed on the peripheral region and the third poly-silicon islands are disposed on the array region. After that, the first patterned photoresist layer on the second poly-silicon islands and the third poly-silicon islands is removed. Next, a channel doping process is performed to implant ions into the second poly-silicon islands and the third poly-silicon islands. Next, the first patterned photoresist layer is removed. After that, a second ion implantation process is performed to form a second source/drain in each of the second poly-silicon islands and a third source/drain in each of the third poly-silicon islands. Wherein, a second channel region is between the second source/drain and a third channel region is between the third source/drain. A second channel region is between the second source/drain and a third channel region is between the third source/drain. A gate insulating layer is formed above the substrate to cover the first poly-silicon islands, the second poly-silicon islands, and the third poly-silicon islands. Next, a patterned conductive material layer is formed on the gate insulating layer. Wherein the patterned conductive material layer has a plurality of first gates disposed on the gate insulating layer over the first poly-silicon islands. After that, a first ion implantation process is performed with the patterned conductive material layer as mask to form a first source/drain in each of the first poly-silicon islands. Wherein a first channel region is between the first source/drain. Next, the patterned conductive material layer is removed to expose portions of the gate insulating layer on the second poly-silicon islands and the third poly-silicon islands to form a plurality of second gates and a plurality of third gates. After that, a first patterned passivation layer is formed on the gate insulating layer to cover the first gates, the second gates, and the third gates. Wherein the first patterned passivation layer exposes portions of the gate insulating layer above the first poly-silicon islands, the second poly-silicon islands, and the third poly-silicon islands. Next, portions of the gate insulating layer are removed with the first patterned passivation layer as mask to expose portions of each of the first sources/drains, portions of each of the second sources/drains, and portions of each of the third sources/drains. After that, a plurality of first source/drain conductive layers, a plurality of second source/drain conductive layers, and a plurality of third source/drain conductive layers are formed on the first patterned passivation layer. Wherein, the first source/drain conductive layers are electrically connected to the first sources/drains respectively, the second source/drain conductive layers are electrically connected to the second sources/drains respectively, and the third source/drain conductive layers are electrically connected to the third sources/drains. Next, a second patterned passivation layer is formed on the first patterned passivation layer. Wherein the second patterned passivation layer exposes a portion of each of the third source/drain conductive layers. Next, a plurality of pixel electrodes is formed on the second patterned passivation layer. Wherein each pixel electrode is electrically connected to the corresponding third source/drain conductive layer.

According to yet another embodiment of the present invention, a lightly doped drain ion implantation process is further performed after forming the first gates, the second gates, and the third gates to form a second lightly doped drain between each second source/drain and the second channel region and a third lightly doped drain between each third source/drain and the third channel region.

To achieve the aforementioned or other objectives, the present invention further provides a manufacturing method of TFT array substrate, which includes following steps. First, a plurality of first poly-silicon islands, a plurality of second poly-silicon islands, and a plurality of third poly-silicon islands are formed on a substrate. Wherein, the substrate has a peripheral region and an array region, and the first poly-silicon islands and the second poly-silicon islands are disposed on the peripheral region and the third poly-silicon islands are disposed on the array region. Next, a second patterned photoresist layer is formed on the first poly-silicon islands, the second poly-silicon islands, and the third poly-silicon islands by using a third half-tone mask. After that, a second ion implantation process is performed to form a second source/drain in each of the second poly-silicon islands and a third source/drain in each of the third poly-silicon islands. Wherein a second channel region is between the second source/drain and a third channel region is between the third source/drain. Next, the third patterned photoresist layer on the second poly-silicon islands and the third poly-silicon islands is removed. A channel doping process is performed to implant ions into the second poly-silicon islands and the third poly-silicon islands. After that, the third patterned photoresist layer is removed. A gate insulating layer is formed above the substrate to cover the first poly-silicon islands, the second poly-silicon islands, and the third poly-silicon islands. Next, a patterned conductive material layer is formed on the gate insulating layer. Wherein the patterned conductive material layer has a plurality of first gates disposed on the gate insulating layer over the first poly-silicon islands. Next, a first ion implantation process is performed with the patterned conductive material layer as mask to form a first source/drain in each of the first poly-silicon islands. Wherein a first channel is between the first source/drain. Next, portions of the patterned conductive material layer are removed to expose portions of the gate insulating layer on the second poly-silicon islands and the third poly-silicon islands and to form a plurality of second gates and a plurality of third gates. After that, a first patterned passivation layer is formed on the gate insulating layer to cover the first gates, the second gates, and the third gates. Wherein, the first patterned passivation layer exposes portions of the gate insulating layer on the first poly-silicon islands, the second poly-silicon islands, and the third poly-silicon islands. Next, portions of the gate insulating layer are removed with the first patterned passivation layer as mask to expose portions of each of the first sources/drains, portions of each of the second sources/drains, and portions of each of the third sources/drains. Next, a plurality of first source/drain conductive layers, a plurality of second source/drain conductive layers, and a plurality of third source/drain conductive layers are formed on the first patterned passivation layer. Wherein, the first source/drain conductive layers are electrically connected to the first sources/drains respectively, the second source/drain conductive layers are electrically connected to the second sources/drains respectively, and the third source/drain conductive layers are electrically connected to the third sources/drains respectively. Next, a second patterned passivation layer is formed on the first patterned passivation layer. Wherein, the second patterned passivation layer exposes a portion of each of the third source/drain conductive layers. Next, a plurality of pixel electrodes is formed on the second patterned passivation layer. Wherein each pixel electrode is electrically connected to the corresponding third source/drain conductive layer.

According to yet another embodiment of the present invention, a lightly doped drain ion implantation process is further performed after forming the first gates, the second gates, and the third gates to form a second lightly doped drain between each second source/drain and the second channel region and a third lightly doped drain between each third source/drain and the third channel region.

According to the present invention, the number of masks required in the manufacturing process of LTPS TFT is reduced by using half-tone mask, so as to simply the process and further to increase product qualified rate and the size of panel.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

First Embodiment

Figure 1A:
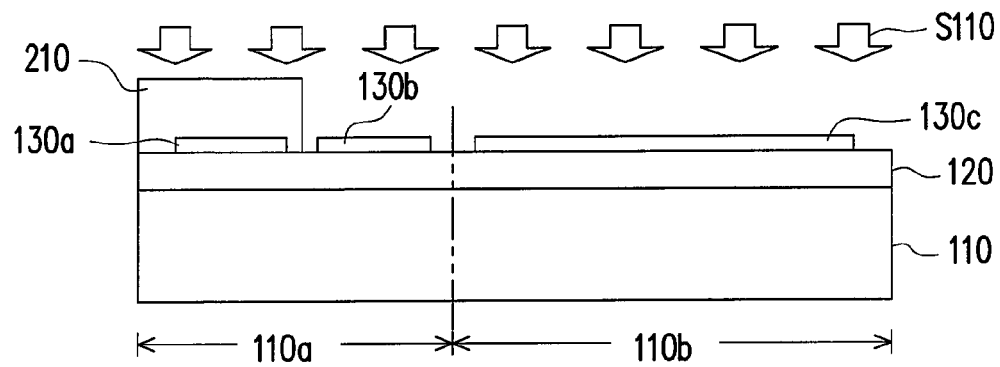
FIGS. 1A~1E are diagrams illustrating a conventional manufacturing flow of a low temperature poly-silicon thin film transistor (LTPS TFT) array substrate.
Figure 1B:
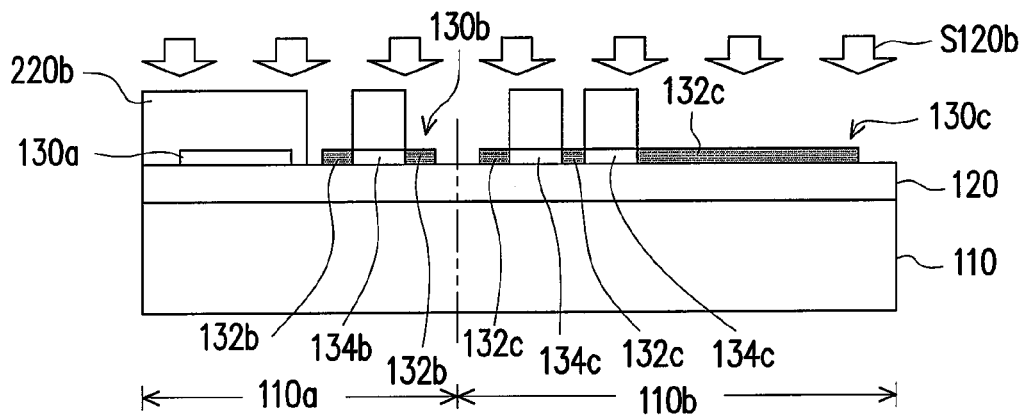
Figure 1C:
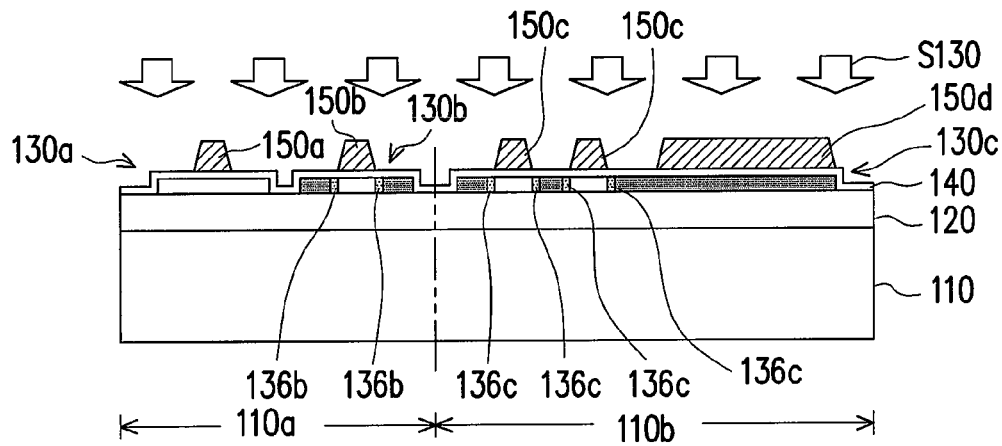
Figure 1D:
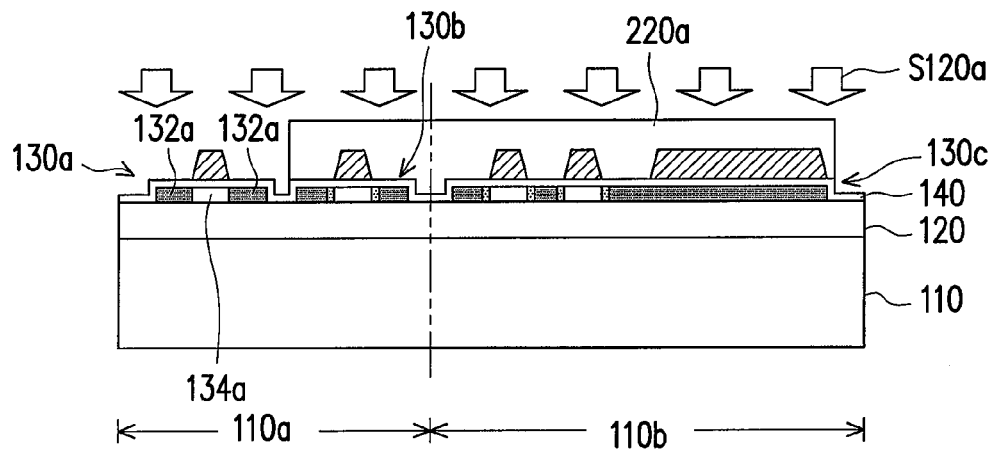
Figure 1E:
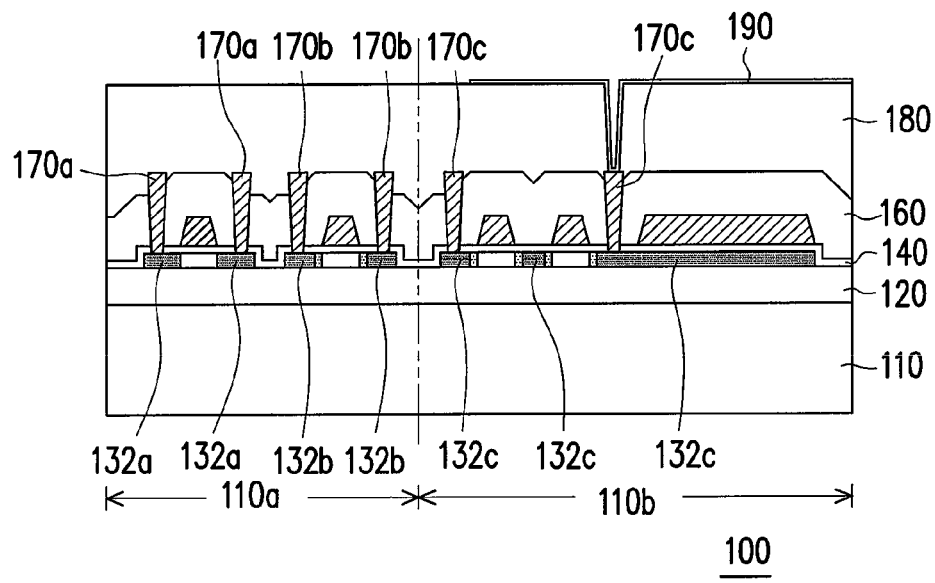
Figure 2A:
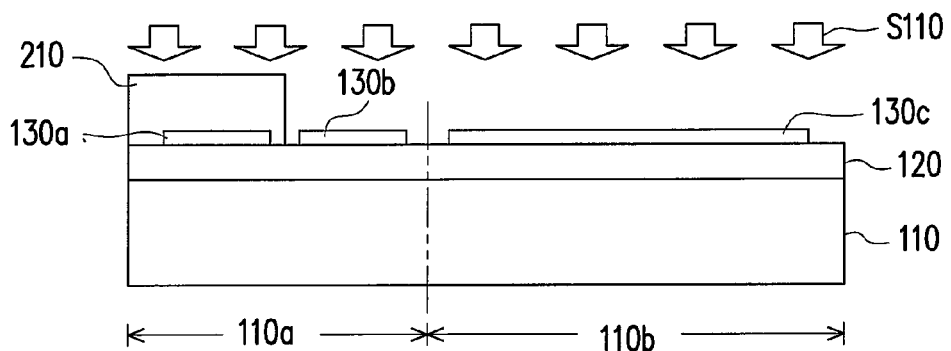
FIGS. 2A~2E are diagrams illustrating another conventional manufacturing flow of a LTPS TFT array substrate.
Figure 2B:
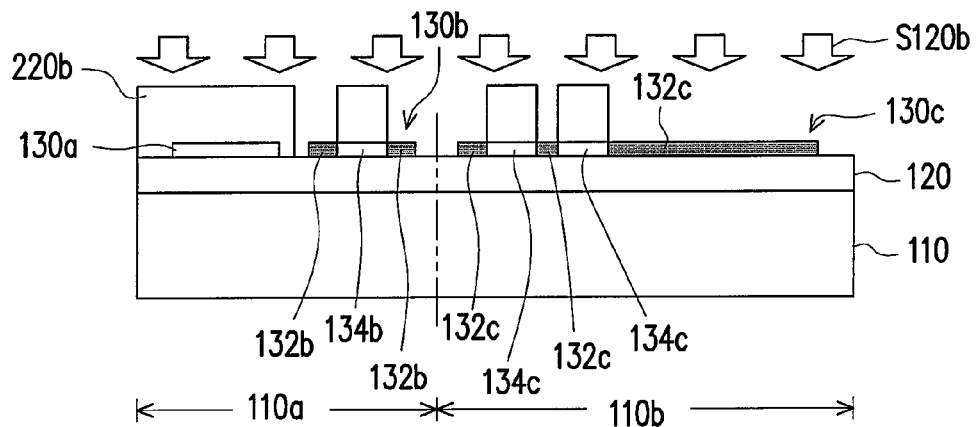
Figure 2C:
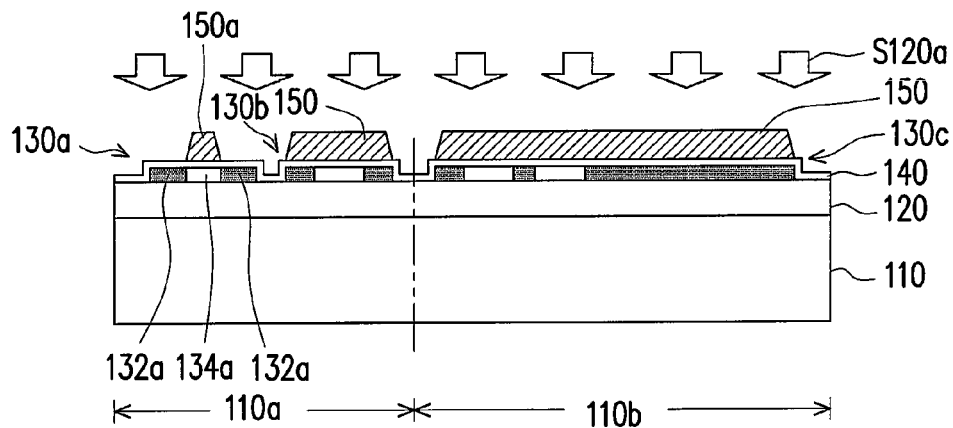
Figure 2D:
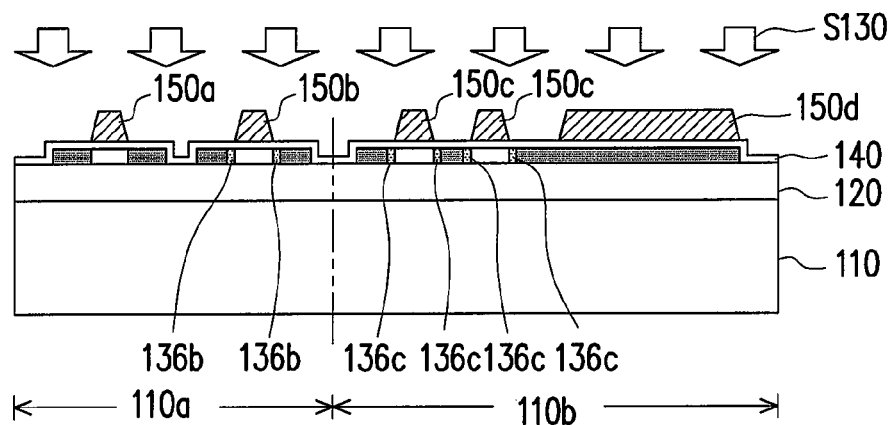
Figure 2E:
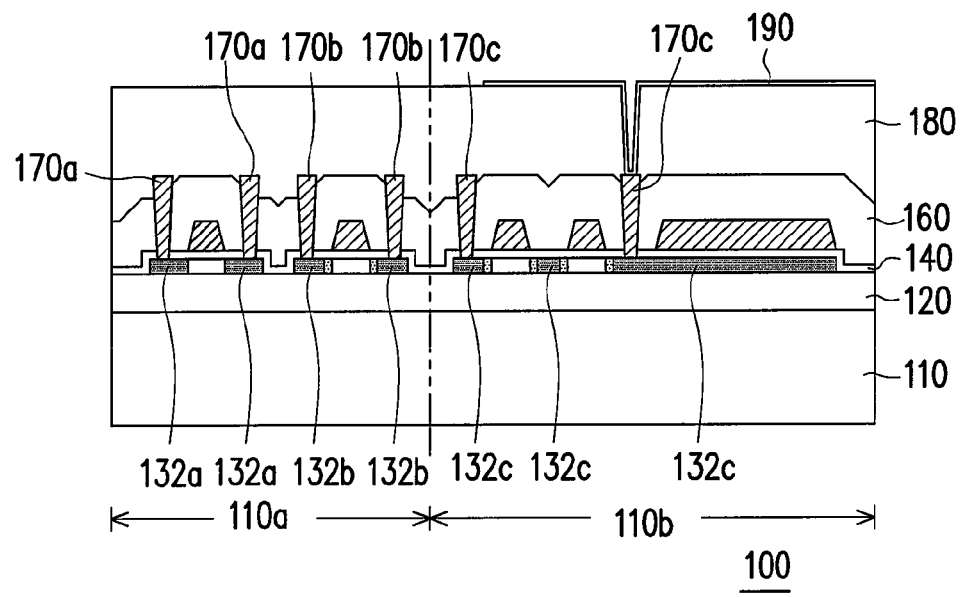

FIGS. 3A~3G are diagrams illustrating the manufacturing flow of a thin film transistor (TFT) array substrate according to the first embodiment of the present invention. Referring FIG. 3A, first, a substrate 310 which has a peripheral region 310a and an array region 310b is provided. In addition, the substrate 310 may be glass substrate, quartz substrate, or plastic substrate. Then, a poly-silicon layer 330 is formed on the substrate 310.

To be specific, the step of forming the poly-silicon layer 330 is, for example, first forming an amorphous silicon layer (not shown) on the substrate 310, and the method for forming the amorphous silicon layer is, for example, chemical vapor deposition (CVD) process or plasma enhanced CVD (PECVD) process. Next, a laser annealing process is performed to the amorphous silicon layer to transform the amorphous silicon layer into the poly-silicon layer 330. The laser annealing process is, for example, excimer laser annealing (ELR), solid-state laser, or diode pumped solid state laser (DPSS) process. Moreover, a dehydrogenation process can be performed before performing the laser annealing process to the amorphous silicon layer to reduce hydrogen content in the amorphous silicon layer. The dehydrogenation process can prevent hydrogen exploration when the hydrogen in the amorphous silicon layer is heated at performing the laser annealing process.

In addition, a buffer layer 320 can be first formed on substrate 310 through low pressure chemical vapor deposition (LPCVD) process or PECVD process before forming the poly-silicon layer 330. The buffer layer 320 can stop the dopant contained in the substrate 310 to diffuse into the poly-silicon layer 330. In addition, the buffer layer 320 can be a single layer of silicon oxide or silicon oxide/silicon nitride double-layer structure.

Referring to FIG. 3A again, a first patterned photoresist layer 420a is formed on the poly-silicon layer 330 by using a first half-tone mask 410a after forming the poly-silicon layer 330. To be specific, the first half-tone mask 410a includes a transparent substrate 412a, a metal layer 414a, and a semi-permeable film 416a, wherein the semi-permeable film 416a is disposed on the transparent substrate 412a and the metal layer 414a is disposed on the semi-permeable film 416a. The transmissivity of the semi-permeable film 416a is greater than the transmissivity of the metal layer 414a, thus, the thickness of the first patterned photoresist layer 420a is not consistent. Even the first half-tone mask 410a forms the first patterned photoresist layer 420a of inconsistent thickness by using the metal layer 414a and the semi-permeable film 416a, gray tone mask or other mask having more than two transmissivities can be used to replace the first half-tone mask 410a to form the first patterned photoresist layer 420a. In addition, the gray tone mask changes the transmissivity through slits.

Figure 3A:
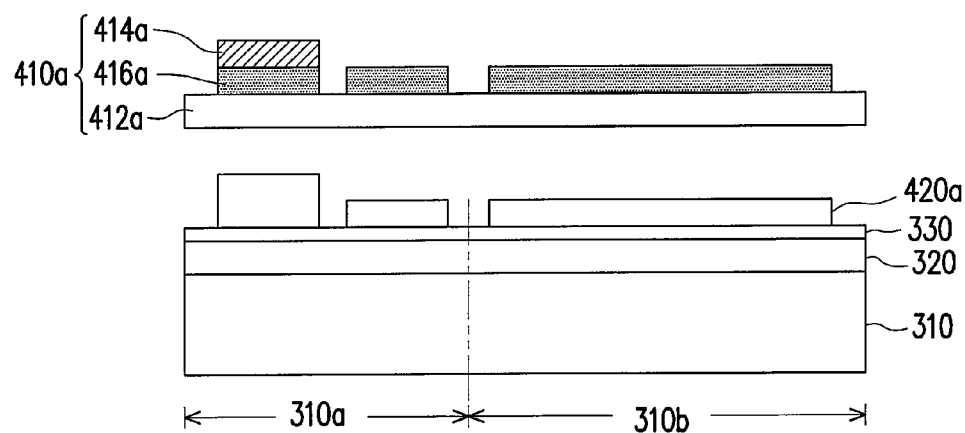
FIGS. 3A~3G are diagrams illustrating the manufacturing flow of a TFT array substrate according to the first embodiment of the present invention.
Figure 3B:
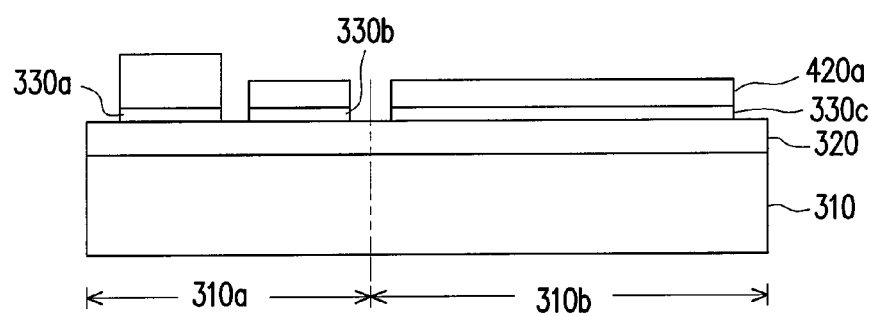

Referring to FIG. 3B, portions of the poly-silicon layer 330 are removed with the first patterned photoresist layer 420a as mask to form a plurality of first poly-silicon islands 330a, a plurality of second poly-silicon islands 330b, and a plurality of third poly-silicon islands 330c. Wherein, the first poly-silicon islands 330a and the second poly-silicon islands 330b are disposed on the peripheral region 310a and the third poly-silicon islands 330c are disposed on the array region 310b.

Figure 3C:
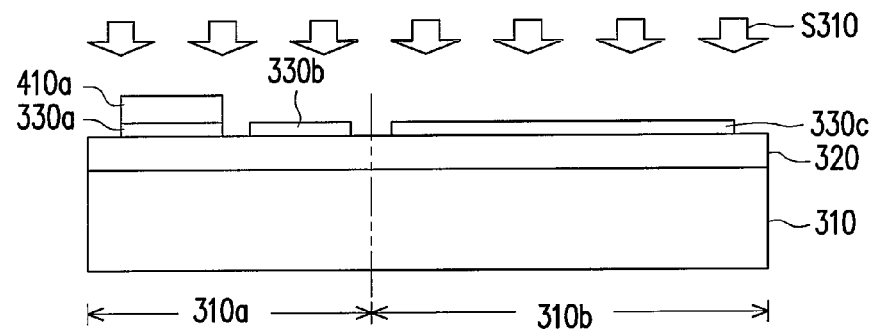

Referring to FIG. 3C, the first patterned photoresist layer 420a on the second poly-silicon islands 330b and the third poly-silicon islands 330c is removed. Next, a channel doping process S310 is performed to implant ions into the second poly-silicon islands 330b and the third poly-silicon islands 330c. Moreover, the channel doping process S310 is used for adjusting the electrical properties of the second poly-silicon islands 330b and the third poly-silicon islands 330c. Next, the remaining first patterned photoresist layer 420a is removed.

Figure 3D:
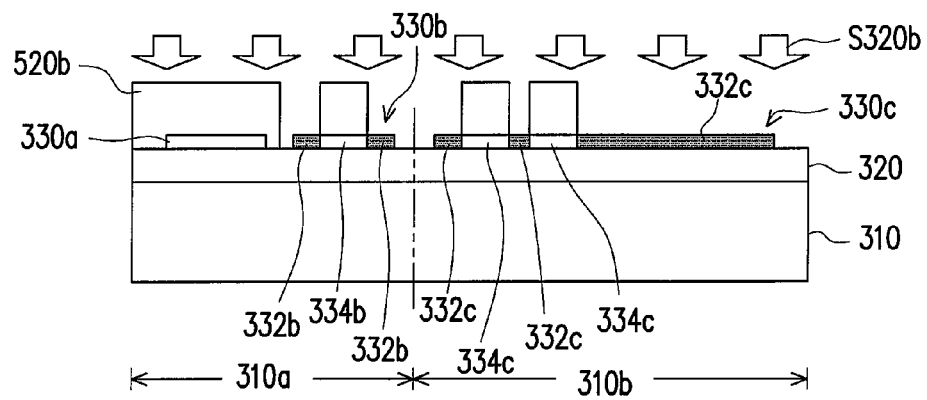

Referring to FIG. 3D, a patterned photoresist layer 520b is formed above the substrate 310 and the patterned photoresist layer 520b covers the first poly-silicon islands 330a and portions of the second and third poly-silicon islands 330b and 330c. After that, a second ion implantation process S320b is performed to form a second source/drain 332b in each of the second poly-silicon islands 330b and a third source/drain 332c in each of the third poly-silicon islands 330c. Wherein, a second channel region 334b is between the second source/drain 332b and a third channel region 334c is between the third source/drain 332c. Moreover, the patterned photoresist layer 520b is removed.

Figure 3E:
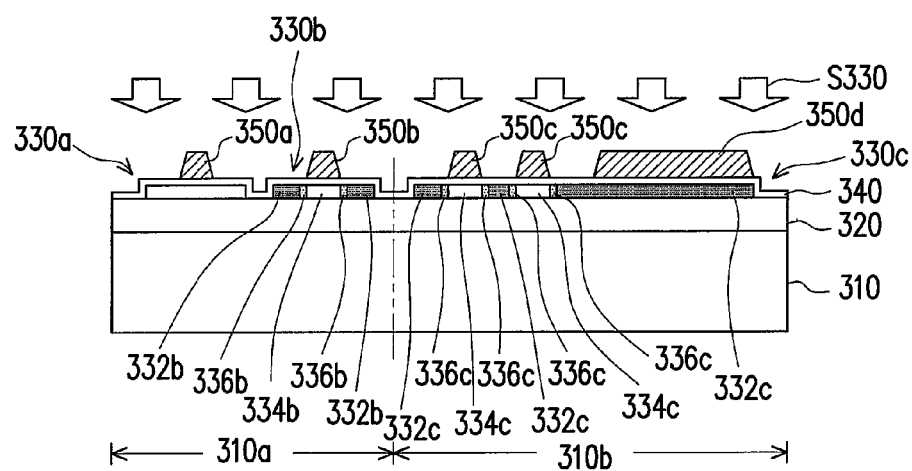

Referring to FIG. 3E, a gate insulating layer 340 is formed above the substrate 310 to cover the first, second, and third poly-silicon islands 330a, 330b, and 330c. Next, a plurality of first gates 350a, a plurality of second gates 350b, a plurality of third gates 350c, and a plurality of capacitance electrodes 350d are formed on the gate insulating layer 340. Wherein, there is a first gate 350a on each of the first poly-silicon islands 330a, a second gate 350b on each of the second poly-silicon islands 330b, and two third gates 350c and a capacitance electrode 350d on each of the third poly-silicon islands 330c. However, the present invention is not limited to the design of dual third gates 350c, which can be applied to the design of single third gate 350c too. Specifically, the method for forming the first gates 350a, the second gates 350b, the third gates 350c, and the capacitance electrodes 350d can be forming a conductive material layer (not shown) on the gate insulating layer 340 through sputtering process or physics vapor deposition (PVD) process. Wherein, the material of the conductive material layer may be Cr or other metals. Next, a photolithography process and an etching process are performed to the conductive material layer to form the first gates 350a, the second gates 350b, the third gates 350c, and the capacitance electrodes 350d.

Moreover, a lightly doped drain ion implantation process S330 is performed after forming the first gates 350a, the second gates 350b, the third gates 350c, and the capacitance electrodes 350d to form a second lightly doped drain 336b between each second source/drain 332b and the second channel region 334b and a third lightly doped drain 336c between each third source/drain 332c and the third channel region 334c. The second and the third lightly doped drains 336b and 336c can improve the hot carrier effect in negative channel metal oxide semiconductor (NMOS). Besides, the ions implanted by the lightly doped drain ion implantation process S330 may be n-type dopant, wherein n-type dopant may be phosphor ion.

Figure 3F:
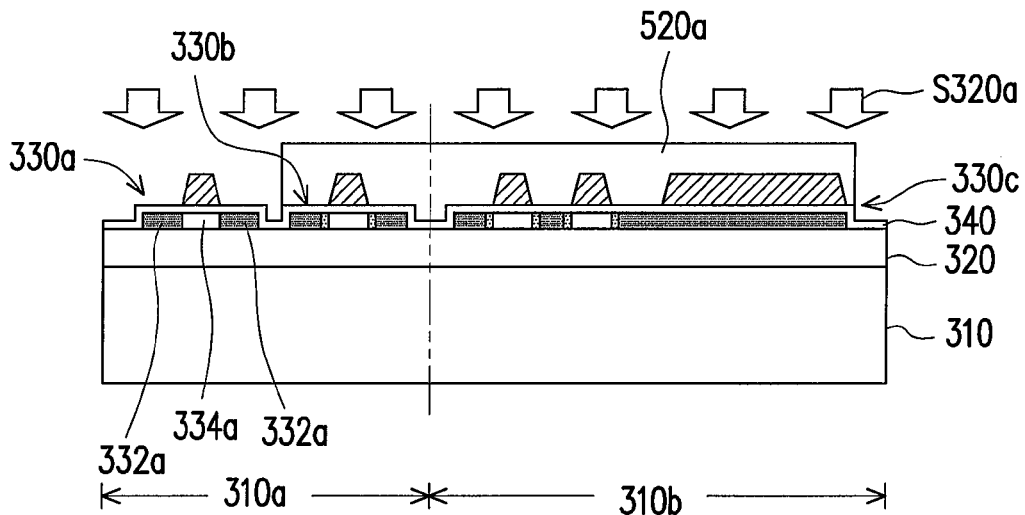

Referring to FIG. 3F, a patterned photoresist layer 520a is formed on the substrate 310, and the patterned photoresist layer 520a covers the second and the third poly-silicon islands 330b and 330c. Next, a first ion implantation process S320a is performed to form a first source/drain 332a in each of the first poly-silicon islands 330a, and a first channel region 334a is between the first source/drain 332a. After that, the patterned photoresist layer 520a is removed.

To be specific, the ions implanted by the first ion implantation process S320a may be p-type dopant, and the p-type dopant may be boron ion. Moreover, the ions implanted by the second ion implantation process S320b may be n-type dopant, and the n-type dopant may be phosphor ion.

Figure 3G:
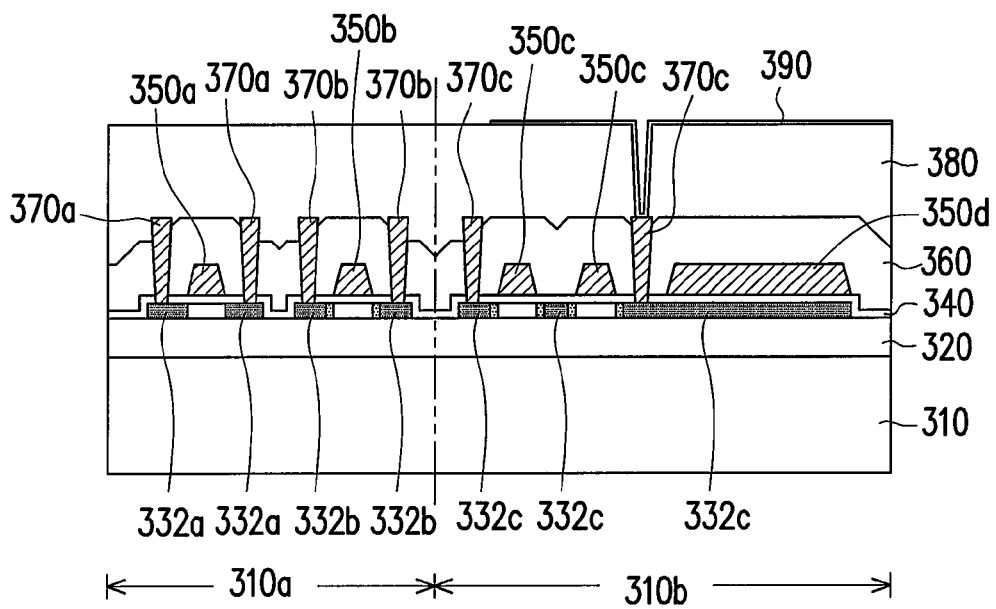

Referring to FIG. 3G, a first patterned passivation layer 360 is formed above the substrate 310 to cover the first gates 350a, the second gates 350b, the third gates 350c, and the capacitance electrodes 350d. Specifically, the method for forming the first patterned passivation layer 360 may be forming a passivation layer (not shown) on the substrate 310 through CVD process, wherein the material of the passivation layer is, for example, silicon oxide, silicon nitride, or other insulating material. Next, a photolithography process and an etching process are performed to the passivation layer to form the first patterned passivation layer 360.

Next, portions of the gate insulating layer 340 are removed with the first patterned passivation layer 360 as mask to expose portions of each of the first sources/drains 332a, portions of each of the second sources/drains 332b, and portions of two of the third sources/drains 332c. Next, a plurality of first source/drain conductive layers 370a, a plurality of second source/drain conductive layers 370b, and a plurality of third source/drain conductive layers 370c are formed on the first patterned passivation layer 360. Wherein, the first source/drain conductive layers 370a are electrically connected to the first sources/drains 332a respectively, the second source/drain conductive layers 370b are electrically connected to the second sources/drains 332b respectively, and the third source/drain conductive layers 370c are electrically connected to the third sources/drains 332c respectively. To be specific, the method for forming the first source/drain conductive layers 370a, the second source/drain conductive layers 370b, and the third source/drain conductive layers 370c may be first forming a source/drain conductive material layer (not shown) on the first patterned passivation layer 360 through sputtering or PVD process. Wherein the material of the source/drain conductive material layer may be Cr or other metals. Next, a photolithography process and an etching process are performed to the source/drain conductive material layer to form the first source/drain conductive layers 370a, the second source/drain conductive layers 370b, and the third source/drain conductive layers 370c.

Next, a second patterned passivation layer 380 is formed on the first patterned passivation layer 360. Wherein, the second patterned passivation layer 380 exposes portions of one of the third source/drain conductive layers 370c. In addition, the formation method of the second patterned passivation layer 380 is approximately the same as that of the first patterned passivation layer 360 therefore will not be described herein.

Next, a plurality of pixel electrodes 390 is formed on the second patterned passivation layer 380. Wherein, the pixel electrode 390 is electrically connected to the corresponding third source/drain conductive layer 370c. Besides, the method for forming the pixel electrode 390 may be first forming a pixel electrode material layer (not shown) on the second patterned passivation layer 380 through sputtering or PVD process. Wherein, the material of the pixel electrode material layer may be indium tin oxide (ITO) or other transparent conductive electrode material. After that, a photolithography process and an etching process are performed to the pixel electrode material layer to form the pixel electrode 390. Here the manufacturing flow of LTPS TFT array substrate 300 according to the first embodiment of the present invention has been completed.

In the present embodiment, a first patterned photoresist layer, which is formed by using a first half-tone mask, is used for forming the first, the second, and the third poly-silicon islands. Then the first patterned photoresist layer on the second and the third poly-silicon islands is removed to continue to perform a channel doping process. In short, in the present embodiment, the first half-tone mask is used to replace the two masks in conventional technology, thus, the number of masks used in the present invention can be reduced, accordingly the manufacturing process can be simplified and manufacturing cost can be reduced. However, gray tone mask or other mask having more than two transmissivities can also be used to replace the first half-tone mask in the present embodiment.

Second Embodiment

Figure 4A:
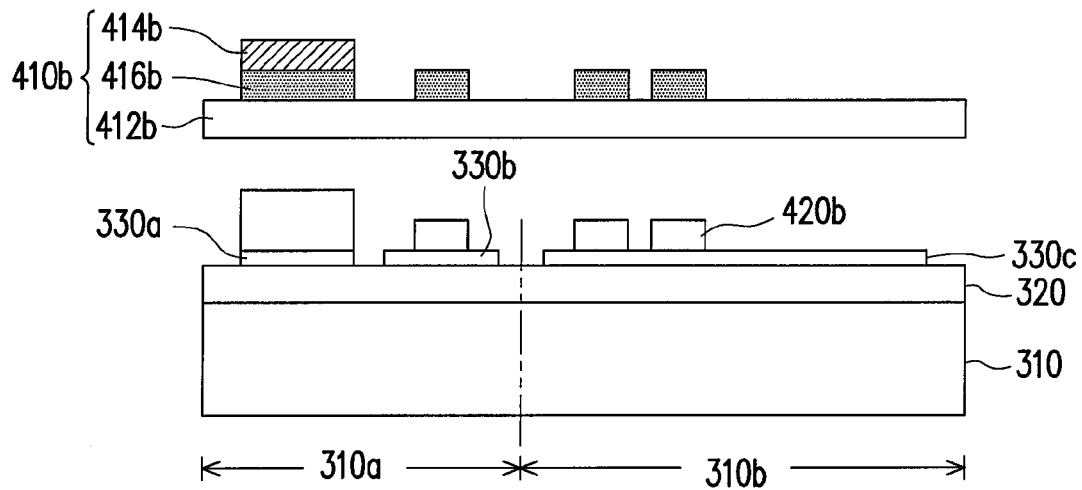
FIGS. 4A~4F are diagrams illustrating the manufacturing flow of a TFT array substrate according to the second embodiment of the present invention.

FIGS. 4A~4F are diagrams illustrating the manufacturing flow of a low temperature poly-silicon TFT array substrate according to the second embodiment of the present invention. Referring to FIG. 4A, first, a substrate 310 is provided and the substrate 310 has a peripheral region 310a and an array region 310b, and a plurality of first poly-silicon islands 330a, a plurality of second poly-silicon islands 330b, and a plurality of third poly-silicon islands 330c are formed on the substrate 310. Wherein the first poly-silicon islands 330a and the second poly-silicon islands 330b are disposed on the peripheral region 310a and the third poly-silicon islands 330c are disposed on the array region 310b. Next, a second patterned photoresist layer 420b is formed on the first, the second, and the third poly-silicon islands 330a, 330b, and 330c by using a second half-tone mask 410b, and the second patterned photoresist layer 420b covers the first poly-silicon islands 330a and portions of the second and the third poly-silicon islands 330b and 330c. Wherein the composition, material, and function of the second half-tone mask 410b are the same as those of the first half-tone mask 410a therefore will not be described herein.

To be specific, the steps of forming the first, the second, and the third poly-silicon islands 330a, 330b, and 330c include, for example, first forming a poly-silicon layer (not shown) on the substrate 310, and then performing a photolithography process and an etching process to the poly-silicon layer to form the first, the second, and the third poly-silicon islands 330a, 330b, and 330c on the substrate 310. Similarly, a buffer layer 320 can be formed on the substrate 310 before forming the poly-silicon layer. The formation methods, materials, and functions of the poly-silicon layer and the buffer layer are similar to those of the first embodiment therefore will not be described herein.

Figure 4B:
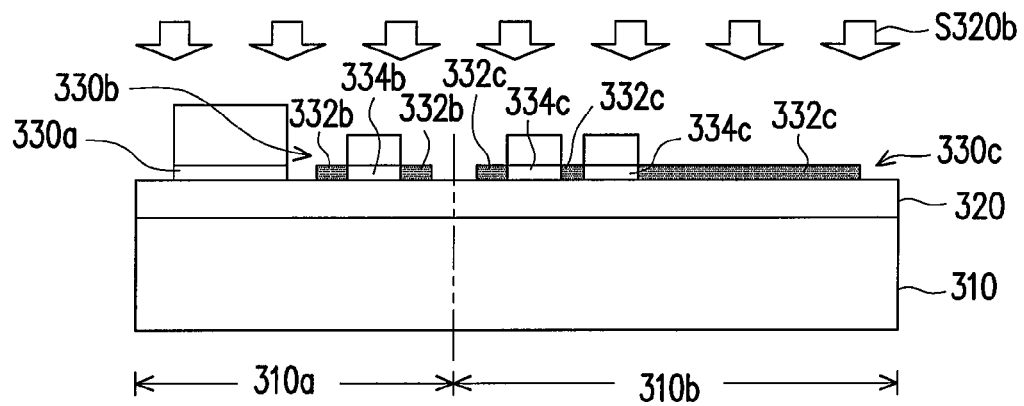

Referring to FIG. 4B, a second ion implantation process S320b is performed to form a second source/drain 332b in each of the second poly-silicon islands 330b and a third source/drain 332c in each of the third poly-silicon islands 330c. Wherein a second channel region 334b is between the second source/drain 332b and a third channel region 334c is between the third source/drain 332c.

Figure 4C:
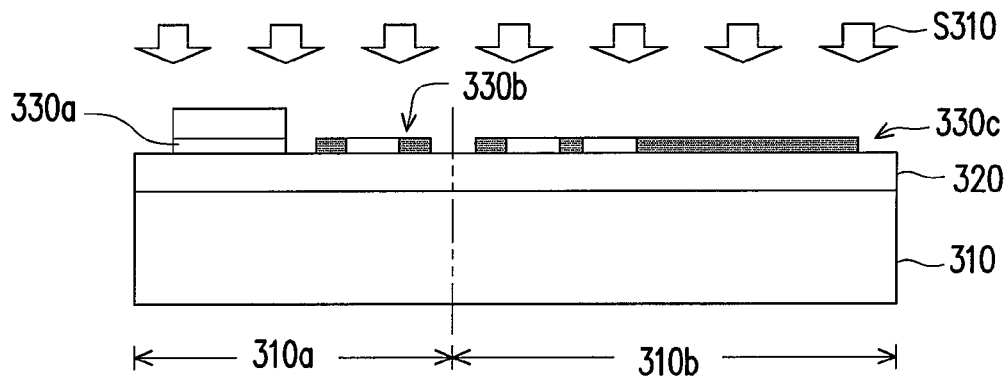

Referring to FIG. 4C, the second patterned photoresist layer 420b on the second and the third poly-silicon islands 330b and 330c is removed. Then a channel doping process S310 is performed to implant ions into the second poly-silicon islands 330b and the third poly-silicon islands 330c. Next, the second patterned photoresist layer 420b is removed.

Figure 4D:
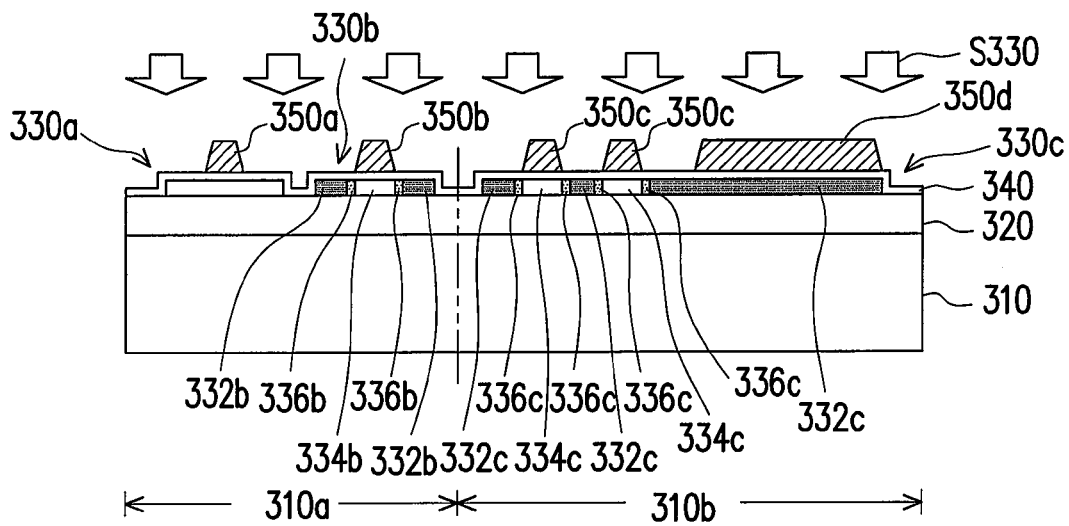
Figure 4E:
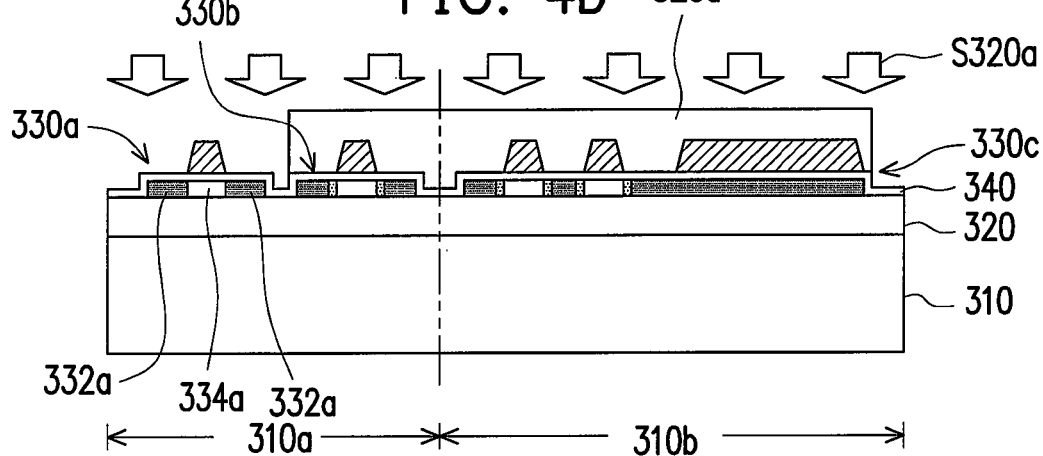
Figure 4F:
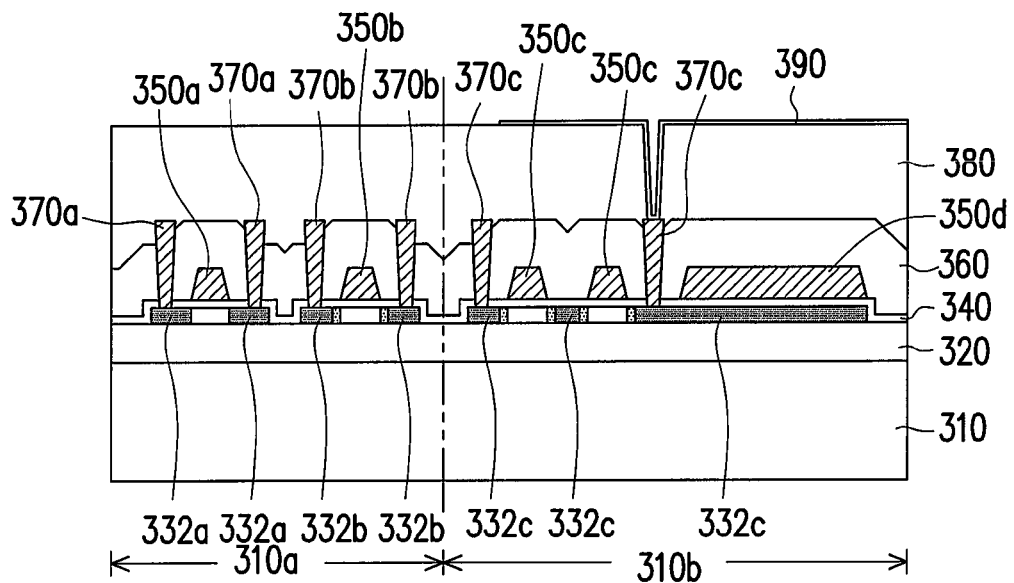

Referring to FIGS. 4D~4F, the steps in FIGS. 4D~4F are similar to those in FIGS. 3E~3G, which include forming the gate insulating layer 340, the first gates 350a, the second gates 350b, the third gates 350c, the capacitance electrodes 350d, the first sources/drains 332a, the first channel region 334a, the first patterned passivation layer 360, the first source/drain conductive layers 370a, the second source/drain conductive layers 370b, the third source/drain conductive layers 370c, the second patterned passivation layer 380, and the pixel electrode 390 in sequence to complete the manufacturing flow of TFT array substrate 300 in the present embodiment. The materials and formation methods of the foregoing various components are similar to those in the first embodiment therefore will not be described herein.

Referring to FIG. 4D, similarly, the present invention is not limited to the design of dual third gates 350c; instead, the present invention is also applicable to the design of single third gate 350c. Besides, a lightly doped drain ion implantation process S330 can also be performed after forming the first gates 350a, the second gates 350b, the third gates 350c, and the capacitance electrodes 350d to form a second lightly doped drain 336b between each of the second sources/drains 332b and the second channel region 334b and a third lightly doped drain 336c between each of the third sources/drains 332c and the third channel region 334c.

In the present embodiment, the second ion implantation process is performed by using the second patterned photoresist layer formed by the second half-tone mask. Next, the second patterned photoresist layer on the second poly-silicon islands and the third poly-silicon islands is removed to continue to perform the channel doping process. In short, in the present embodiment, a second half-tone mask is used to replace the two masks in conventional technology, thus, the number of masks used in the present invention can be reduced, accordingly the manufacturing process can be simplified and manufacturing cost can be reduced. However, gray tone mask or other mask having more than two transmissivities can also be used to replace the second half-tone mask in the present embodiment.

Third Embodiment

Figure 5A:
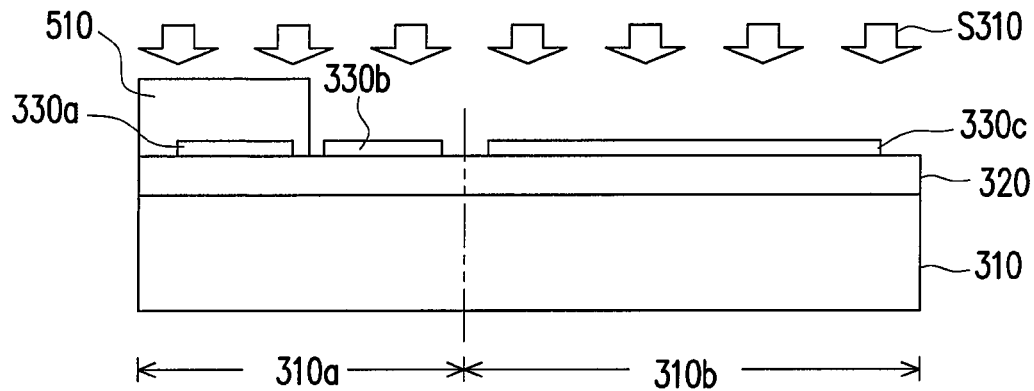
FIGS. 5A~5F are diagrams illustrating the manufacturing flow of a TFT array substrate according to the third embodiment of the present invention.

FIGS. 5A~5F are diagrams illustrating the manufacturing flow of a TFT array substrate according to the third embodiment of the present invention. Referring to FIG. 5A, first, a substrate 310 is provided and the substrate 310 has a peripheral region 310a and an array region 310b, and a plurality of first poly-silicon islands 330a, a plurality of second poly-silicon islands 330b, and a plurality of third poly-silicon islands 330c are formed on the substrate 310. Wherein the first poly-silicon islands 330a and the second poly-silicon islands 330b are disposed on the peripheral region 310a and the third poly-silicon islands 330c are disposed on the array region 310b. Similarly, a buffer layer 320 can be formed on the substrate 310 first, and then the first, the second, and the third poly-silicon islands 330a, 330b, and 330c are formed. The formation methods and materials of the buffer layer 320, the first poly-silicon islands 330a, the second poly-silicon islands 330b, and the third poly-silicon islands 330c are similar to those in the second embodiment therefore will not be described herein. After that, a patterned photoresist layer 510 is formed on the substrate 310 and the patterned photoresist layer 510 covers the first poly-silicon islands 330a. After that, a channel doping process S310 is performed to the second and the third poly-silicon islands 330b and 330c. Next, the patterned photoresist layer 510 is removed.

Figure 5B:
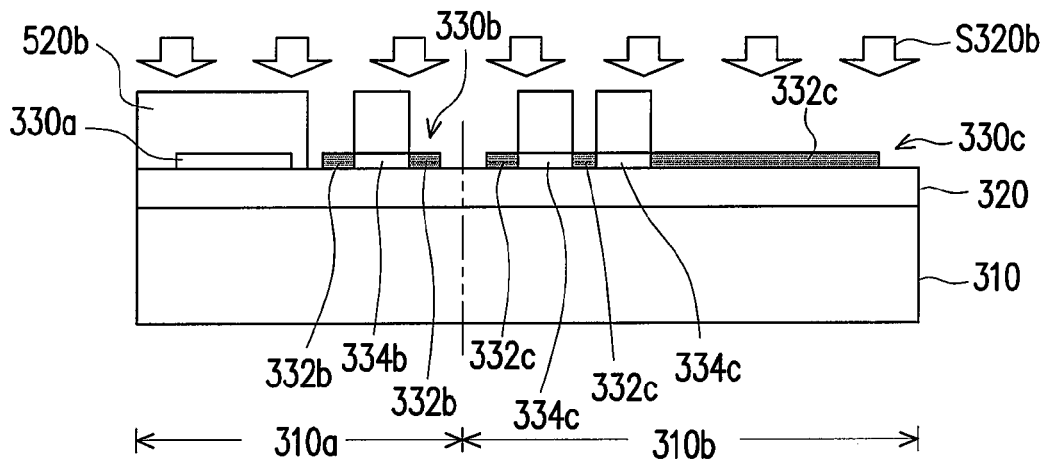

Referring to FIG. 5B, a patterned photoresist layer 520b is formed on the substrate 310 and the patterned photoresist layer 520b covers the first poly-silicon islands 330a and portions of the second and the third poly-silicon islands 330b and 330c. After that, a second ion implantation process S320b is performed to form a second source/drain 332b in each of the second poly-silicon islands 330b and a third source/drain 332c in each of the third poly-silicon islands 330c. Wherein a second channel region 334b is between the second source/drain and a third channel region 334c is between the third source/drain 332c. Next, the patterned photoresist layer 520b is removed.

Figure 5C:
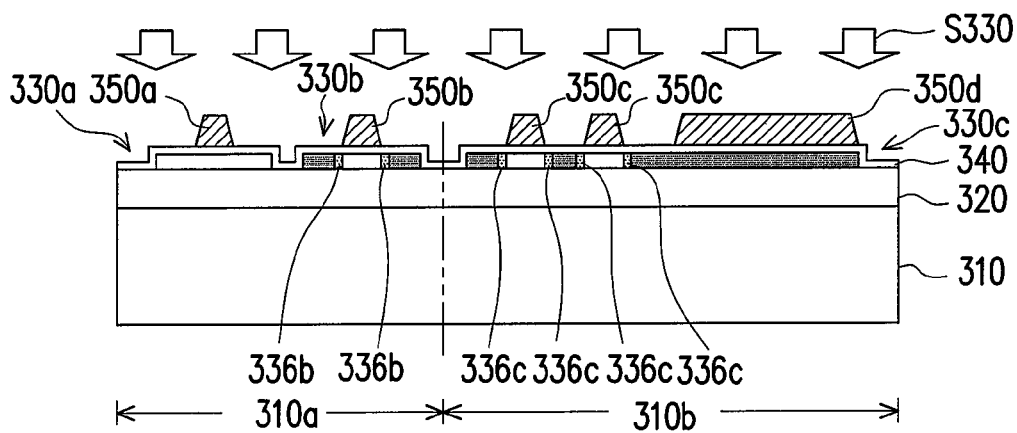

Referring to FIG. 5C, a gate insulating layer 340 is formed on the substrate 310 to cover the first, the second, and the third poly-silicon islands 330a, 330b, and 330c. Next, a plurality of first gates 350a, a plurality of second gates 350b, a plurality of third gates 350c, and a plurality of capacitance electrodes 350d are formed on the gate insulating layer 340. Wherein there is a first gate 350a above each of the first poly-silicon islands 330a, there is a second gate 350b above each of the second poly-silicon islands 330b, and there are two third gates 350c and a capacitance electrode 350d above each of the third poly-silicon islands 330c. Similarly, the present invention is not limited to the design of dual third gates 350c; instead, the present invention is also applicable to the design of single third gate 350c. Moreover, the formation methods and materials of the gate insulating layer 340, the first gates 350a, the second gates 350b, the third gates 350c, and the capacitance electrodes 350d are similar to those in the first embodiment therefore will not be described herein.

Referring to FIG. 5C again, a lightly doped drain ion implantation process S330 is further performed after forming the first gates 350a, the second gates 350b, the third gates 350c, and the capacitance electrodes 350d to form a second lightly doped drain 336b between each of the second sources/drains 332b and the second channel region 334b and a third lightly doped drain 336c between each of the third sources/drains 332c and the third channel region 334c.

Figure 5D:
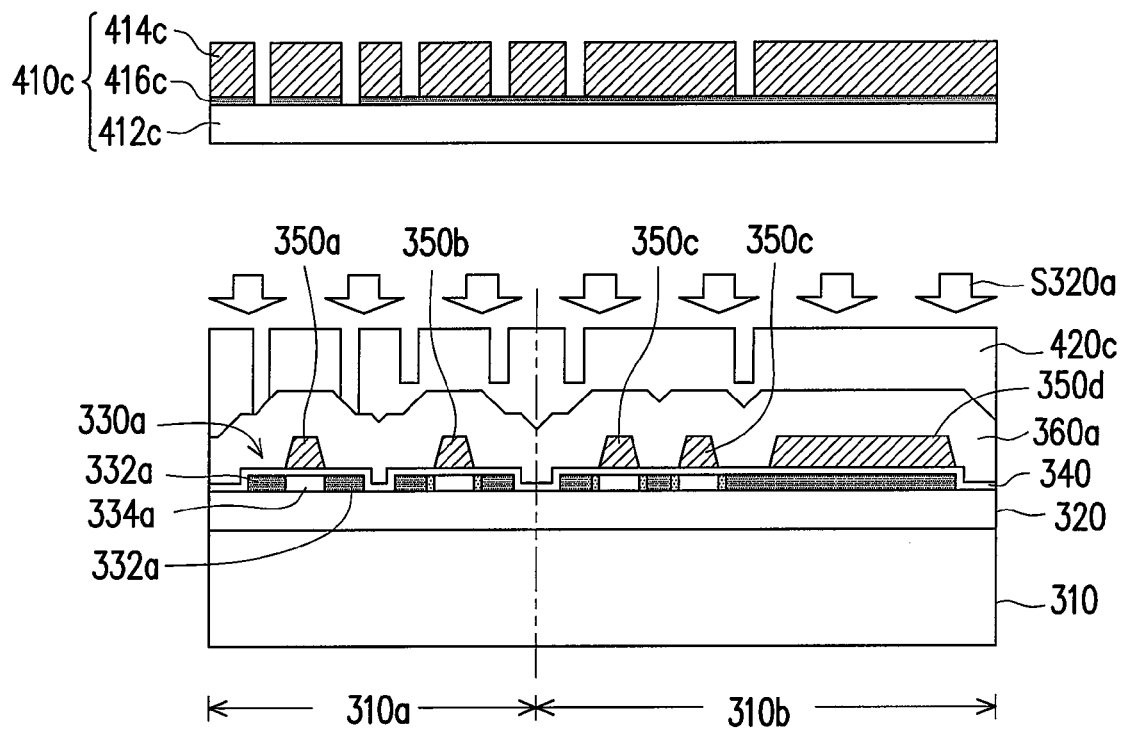

Referring to FIG. 5D, a first passivation layer 360a is formed above the substrate 310 to cover the first gates 350a, the second gates 350b, the third gates 350c, and the capacitance electrodes 350d. Next, a third patterned photoresist layer 420c is formed on the first passivation layer 360a by using a third half-tone mask 410c. Wherein, the composition, material, and function of the third half-tone mask 410c are the same as those of the first half-tone mask 410a therefore it will not be described herein. The third patterned photoresist layer 420c exposes portions of the first passivation layer 360a on each of the first poly-silicon islands 330a. Next, a first ion implantation process S320a is performed with the third patterned photoresist layer 420c as mask to form a first source/drain 332a in each of the first poly-silicon islands 330a. Wherein a first channel region 334a is between the first source/drain 332a.

Figure 5E:
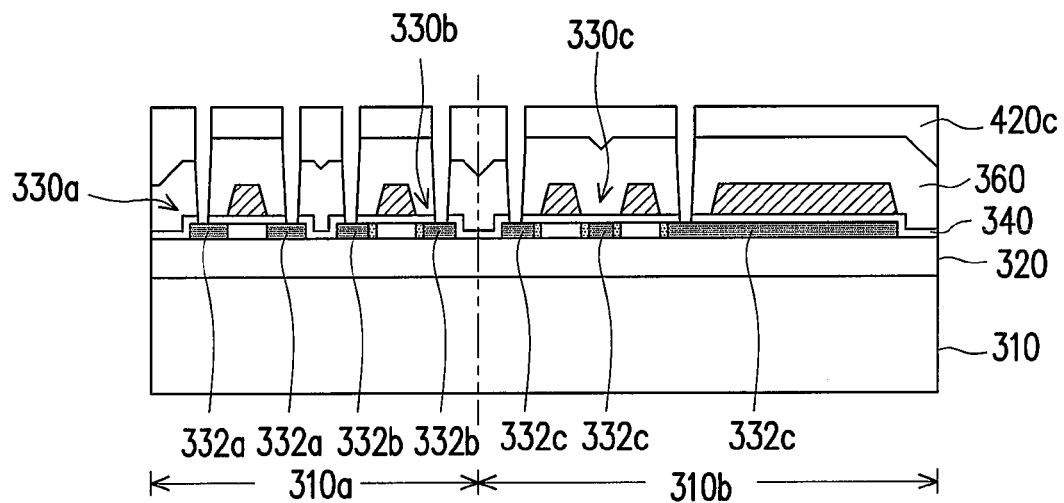

Referring to FIG. 5E, a portion of the thickness of the third patterned photoresist layer 420c is removed to expose portions of the first passivation layer 360a on the second poly-silicon islands 330b and the third poly-silicon islands 330c. Next, portions of the first passivation layer 360a and the gate insulating layer 340 are removed with the third patterned photoresist layer 420c as mask to expose portions of each of the first sources/drains 332a, portions of each of the second sources/drains 332b, and portions of each of the third sources/drains 332c and to form a first patterned passivation layer 360. After that, the third patterned photoresist layer 420c is removed.

Specifically, the method for forming the first passivation layer 360a is, for example, to form the first passivation layer 360a above the substrate 310 through CVD process, and the material of the first passivation layer 360a is, for example, silicon oxide, silicon nitride, or other insulating material. The method for removing portions of the first passivation layer 360a and the gate insulating layer 340 are performing a photolithography process and an etching process thereto.

Figure 5F:
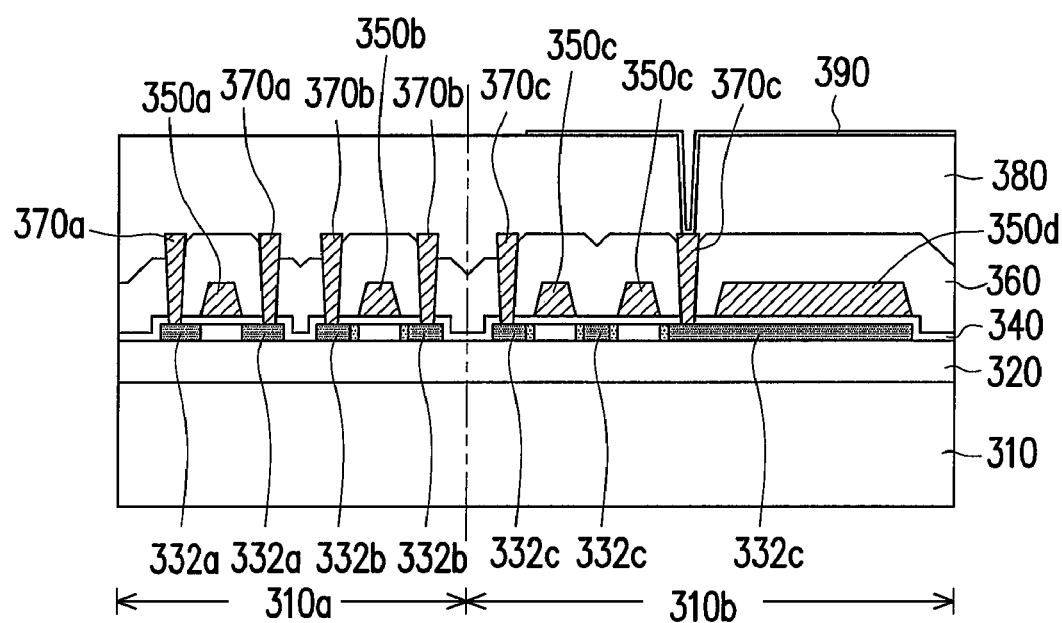

Referring to FIG. 5F, the steps of FIG. 5F are similar to those in FIG. 3G. The steps include forming the first source/drain conductive layers 370a, the second source/drain conductive layers 370b, the third source/drain conductive layers 370c, the second patterned passivation layer 380, and the pixel electrode 390 in sequence after forming the first patterned passivation layer 360 to complete the manufacturing flow of LTPS TFT 300 in the present embodiment. The materials and formation methods of the foregoing various components are approximately the same as those in the first embodiment therefore will not be described herein.

In the present embodiment, the first ion implantation process is performed by using the third patterned photoresist layer formed by the third half-tone mask. Next, a portion of the thickness of the third patterned photoresist layer is removed to transform the first passivation layer into the first patterned passivation layer. In short, in the present embodiment, a third half-tone mask is used to replace the two masks in conventional technology, thus, the number of masks used in the present invention can be reduced, accordingly the manufacturing process can be simplified and manufacturing cost can be reduced. However, gray tone mask or other mask having more than two transmissivities can also be used to replace the third half-tone mask in the present embodiment.

Fourth Embodiment

FIGS. 6A~6H are diagrams illustrating the manufacturing flow of a TFT array substrate according to the fourth embodiment of the present invention. Referring to FIGS. 6A~6E, the contents of FIGS. 6A~6E are approximately the same as those in FIGS. 3A~3E. In short, the first patterned photoresist layer 420a is formed by using a first half-tone mask 410a to complete the first poly-silicon islands 330a, the second poly-silicon islands 330b, the third poly-silicon islands 330c, and the channel doping process S310 on the substrate 310. Next, the steps of forming the second sources/drains 332b, the third sources/drains 332c, the second channel region 334b, the third channel region 334c, the gate insulating layer 340, the first gates 350a, the second gates 350b, the third gates 350c, and the capacitance electrodes 350d are performed in sequence.

Similarly, a buffer layer 320 is formed on the substrate 310 first, and then the first poly-silicon islands 330a, the second poly-silicon islands 330b, and the third poly-silicon islands 330c are formed. Moreover, the present invention is not limited to the design of dual third gates 350c; instead, the present invention is also applicable to the design of single third gate 350c. In addition, a lightly doped drain ion implantation process S330 is further performed after forming the first gates 350a, the second gates 350b, the third gates 350c, and the capacitance electrodes 350d to form the second lightly doped drain 336b and the third lightly doped drain 336c. The materials and formation methods of the foregoing various components are approximately the same as those in the first embodiment therefore will not be described herein.

Figure 6A:
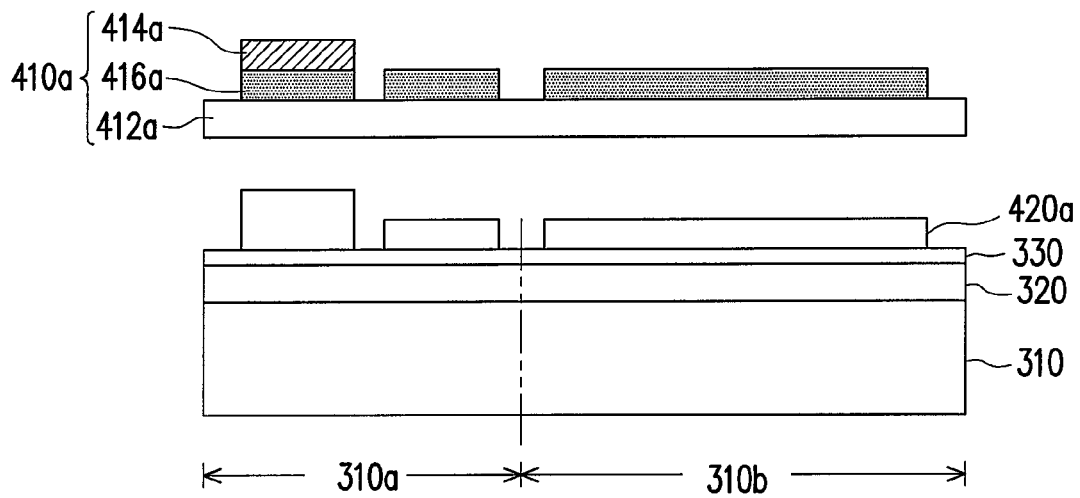
FIGS. 6A~6H are diagrams illustrating the manufacturing flow of a TFT array substrate according to the fourth embodiment of the present invention.
Figure 6B:
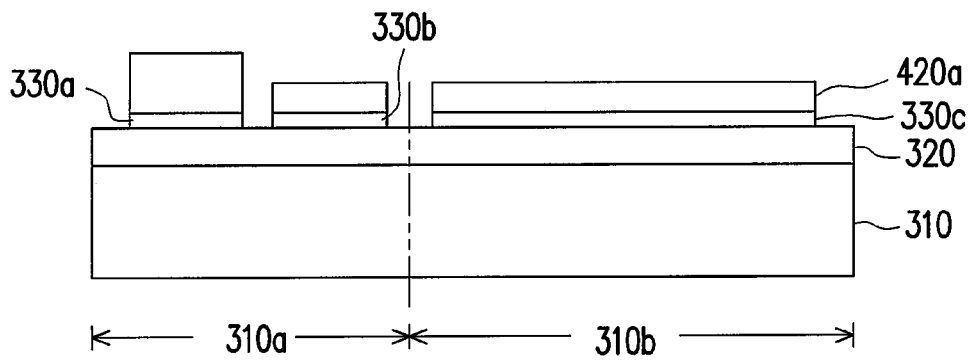
Figure 6C:
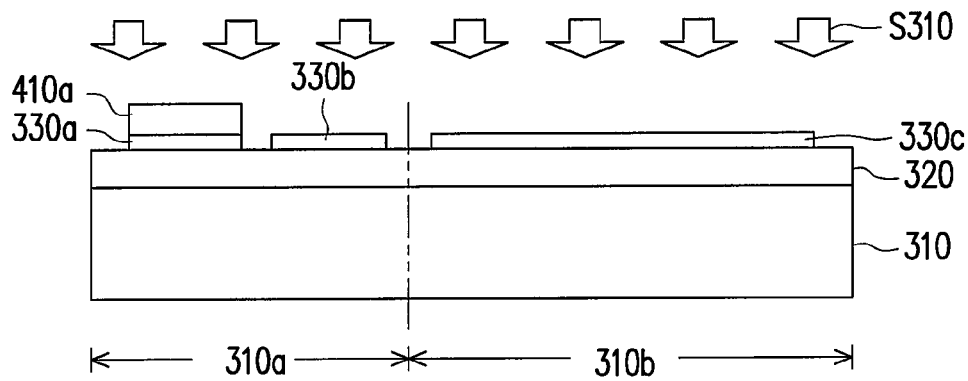
Figure 6D:
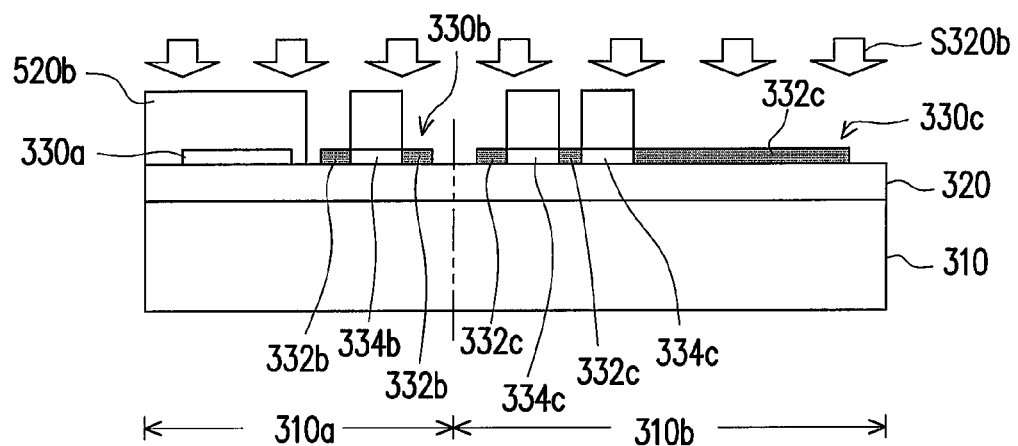
Figure 6E:
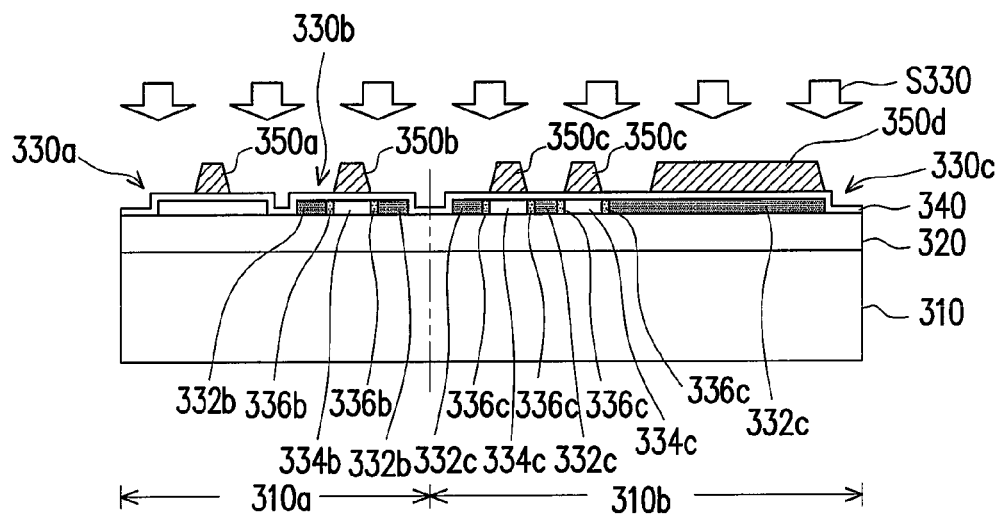
Figure 6F:
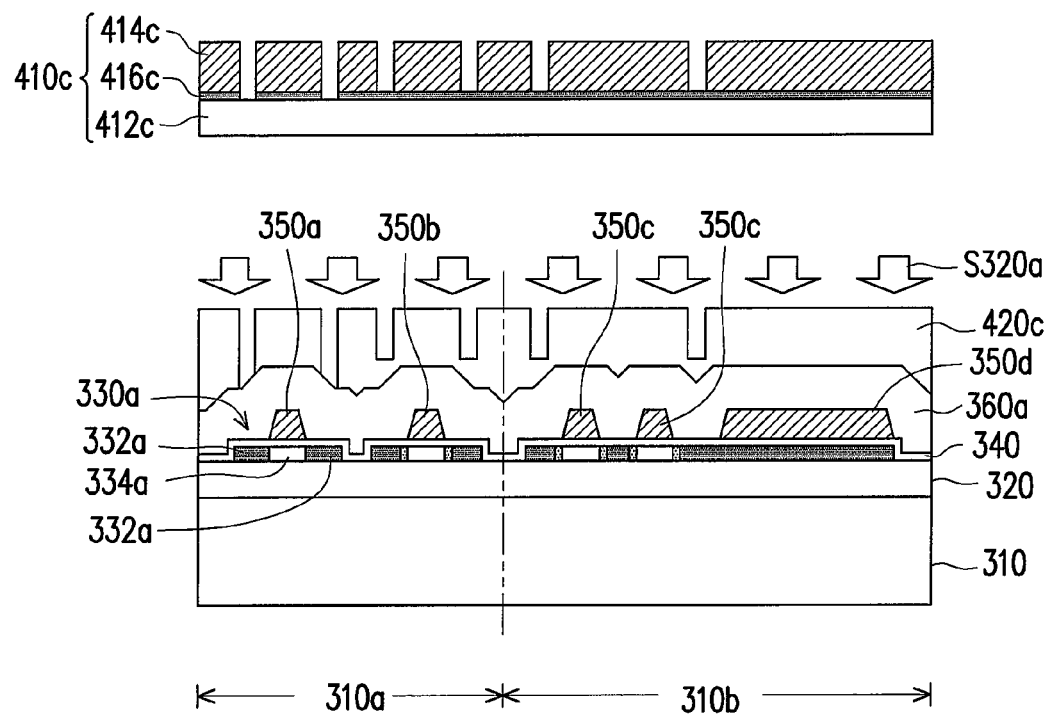
Figure 6G:
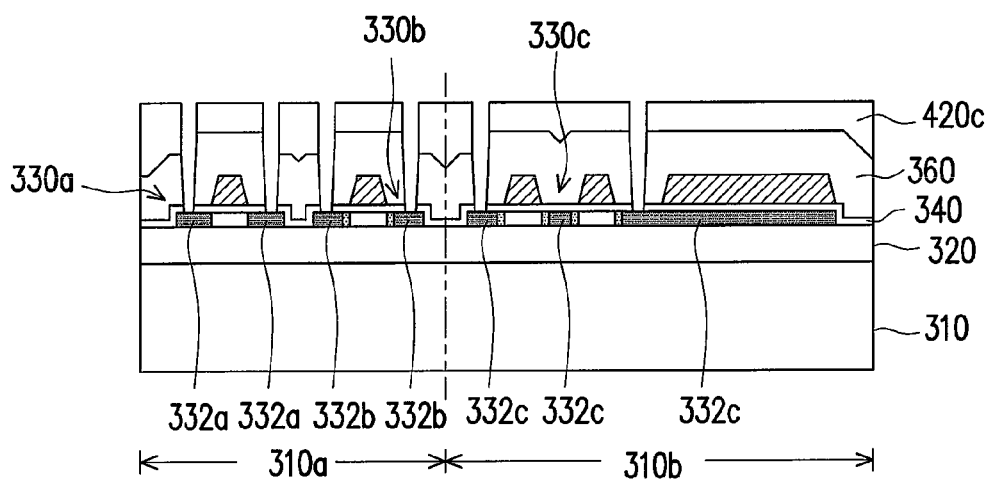
Figure 6H:
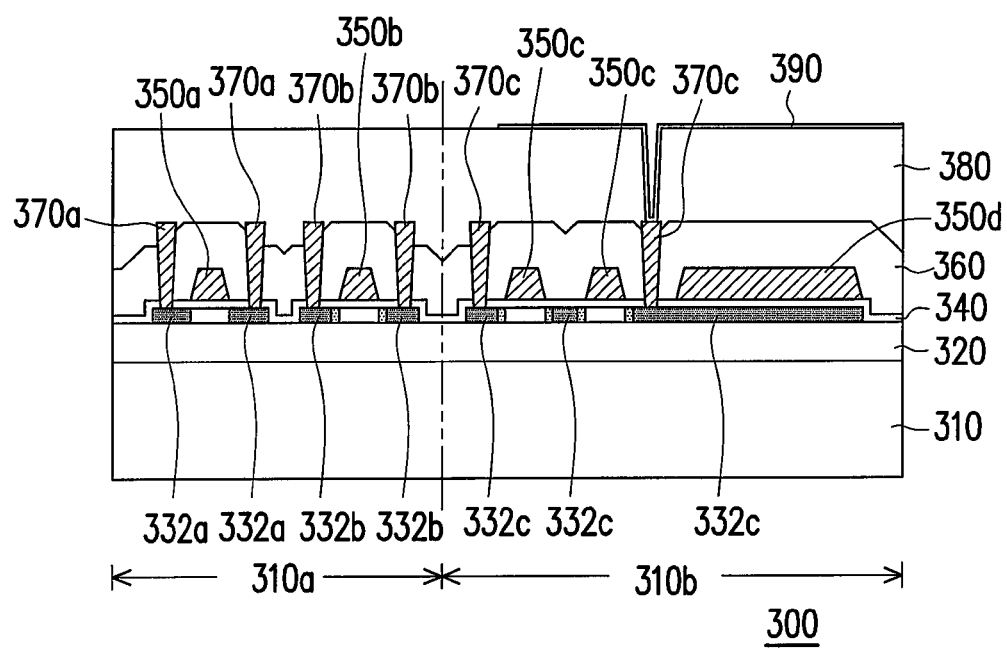

Referring to FIGS. 6F~6H, the steps in FIGS. 6F~6H are similar to those in FIGS. 5D~5F. First, a first passivation layer 360a is formed on the substrate 310. After that, the third patterned photoresist layer 420c is formed by using the third half-tone mask 410c to form the first sources/drains 332a, the first channel region 334a, and the first patterned passivation layer 360. Next, the first source/drain conductive layers 370a, the second source/drain conductive layers 370b, the third source/drain conductive layers 370c, the second patterned passivation layer 380, and the pixel electrode 390 are formed in sequence to complete the manufacturing flow of TFT array substrate 300 in the present embodiment. The materials and formation methods of the foregoing various components are approximately the same as those in the third embodiment therefore will not be described herein.

In the present embodiment, a first patterned photoresist layer, which is formed by using a first half-tone mask, is used for forming the first, the second, and the third poly-silicon islands. Then the first patterned photoresist layer on the second and the third poly-silicon islands is removed to continue to perform a channel doping process. Next, the first ion implantation process is performed by using the third patterned photoresist layer formed by the third half-tone mask. After that, a portion of the thickness of the third patterned photoresist layer is removed to transform the first passivation layer into the first patterned passivation layer. In short, in the present embodiment, the first half-tone mask is used to replace the two masks in conventional technology, and then the third half-tone mask is used to replace another two masks in conventional technology, so that the number of masks used in the present invention can be reduced, accordingly the manufacturing process can be simplified and manufacturing cost can be reduced. Similarly, gray tone mask or other mask having more than two transmissivities can also be used to replace the first and/or the third half-tone mask in the present embodiment.

Fifth Embodiment

Figure 7A:
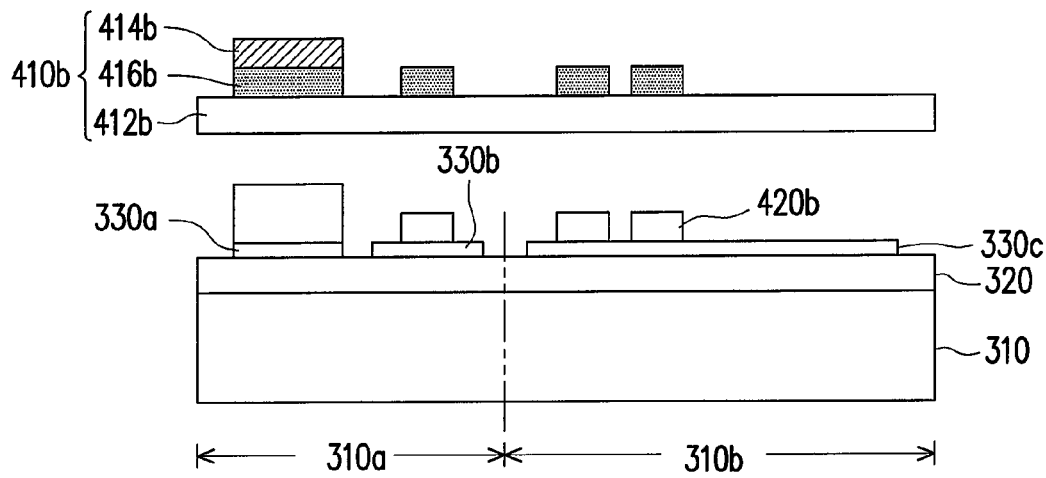
FIGS. 7A~7G are diagrams illustrating the manufacturing flow of a TFT array substrate according to the fifth embodiment of the present invention.
Figure 7B:
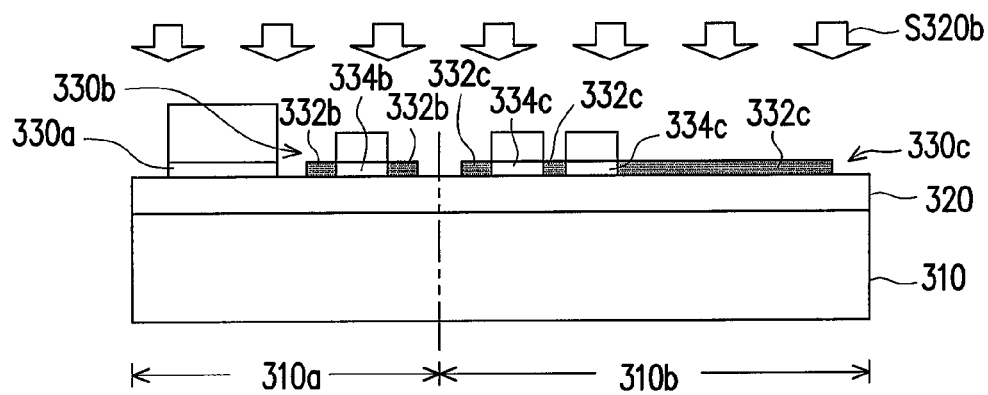
Figure 7C:
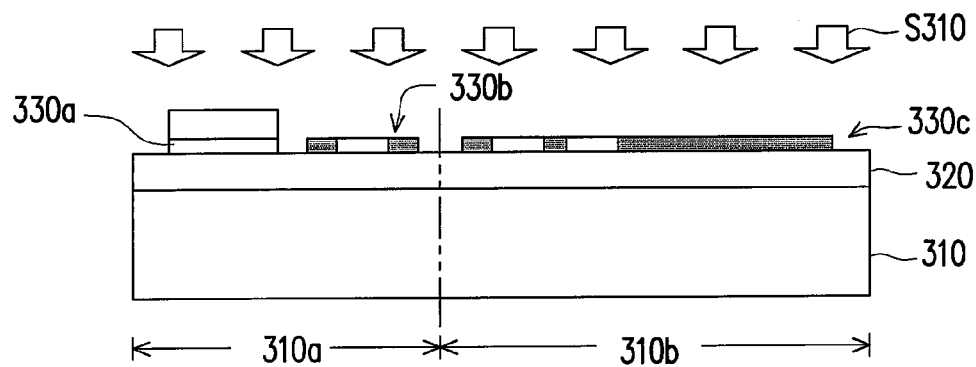

FIGS. 7A~7G are diagrams illustrating the manufacturing flow of a TFT array substrate according to the fifth embodiment of the present invention. Referring to FIGS. 7A~7C, the contents of FIGS. 7A~7C are approximately the same as those of FIGS. 4A~4C. In short, a plurality of first poly-silicon islands 330a, a plurality of second poly-silicon islands 330b, and a plurality of third poly-silicon islands 330c are formed on the substrate 310. After that, the second patterned photoresist layer 420b is formed by using the second half-tone mask 410b to complete the second sources/drains 332b, the third sources/drains 332c, the second channel region 334b, the third channel region 334c, and the channel doping process S310. Similarly, a buffer layer 320 can be formed on the substrate 310 first and then the first, the second, and the third poly-silicon islands 330a, 330b, and 330c are formed. The materials and formation methods of the foregoing various components are approximately the same as those in the second embodiment therefore will not be described herein.

Figure 7D:
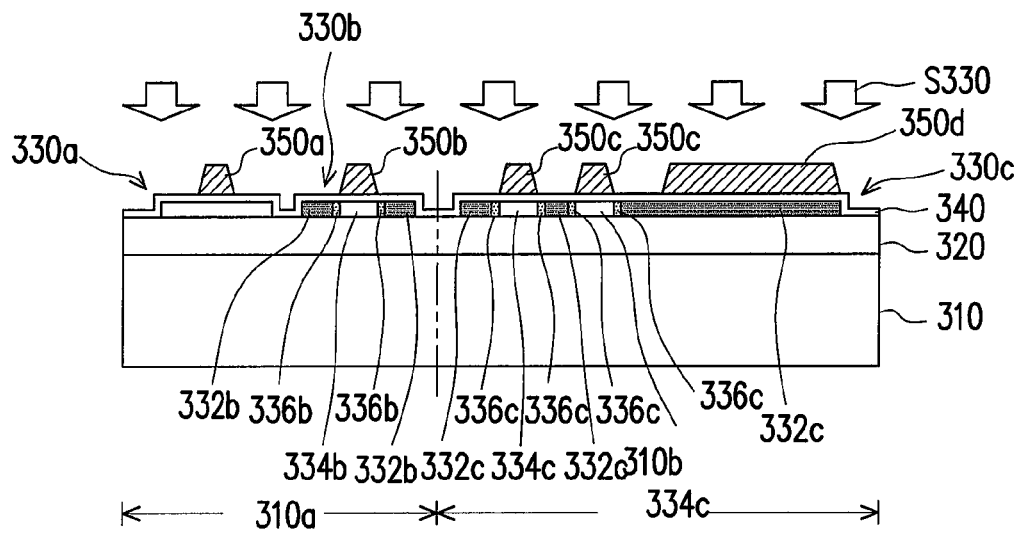

Referring to FIG. 7D, a gate insulating layer 340 is formed above the substrate 310 to cover the first, the second, and the third poly-silicon islands 330a, 330b, and 330c. After that, a plurality of first gates 350a, a plurality of second gates 350b, a plurality of third gates 350c, and a plurality of capacitance electrodes 350d are formed on the gate insulating layer 340. Wherein, there is a first gate 350a on each of the first poly-silicon islands 330a, there is a second gate 350b on each of the second poly-silicon islands 330b, and there are two third gates 350c and a capacitance electrodes 350d on each of the third poly-silicon islands 330c. Similarly, the present invention is not limited to the design of dual third gates 350c; instead, the present invention is also applicable to the design of single third gate 350c. In addition, the formation methods and materials of the gate insulating layer 340, the first gates 350a, the second gates 350b, the third gates 350c, and the capacitance electrodes 350d are similar those in the first embodiment therefore will not be described herein.

Referring to FIG. 7D again, a lightly doped drain ion implantation process S330 is further performed after forming the first gates 350a, the second gates 350b, the third gates 350c, and the capacitance electrodes 350d to form a second lightly doped drain 336b between each of the second sources/drains 332b and the second channel region 334b and a third lightly doped drain 336c between each of the third sources/drains 332c and the third channel region 334c.

Figure 7E:
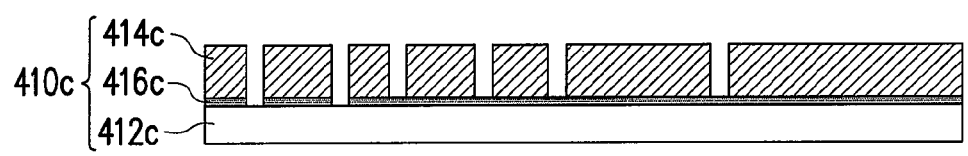
Figure 7E:
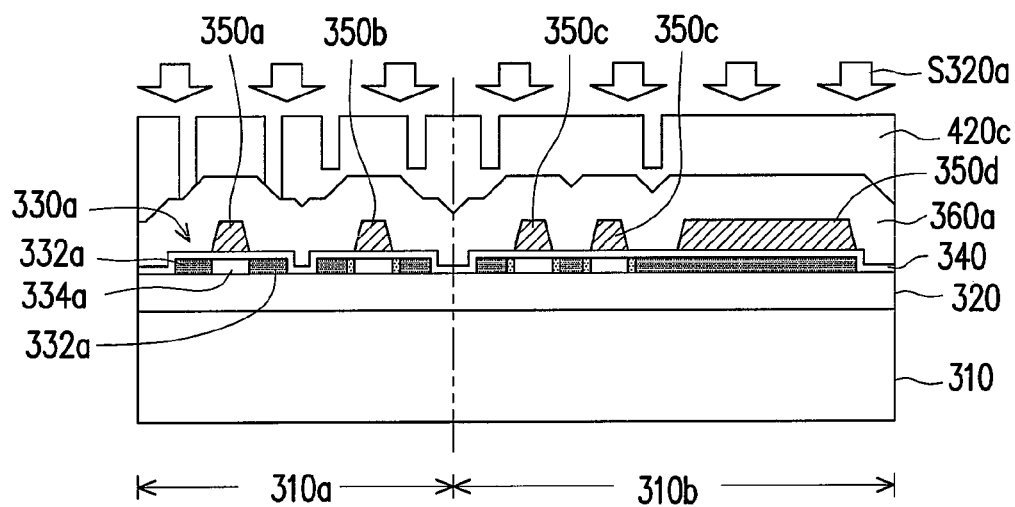
Figure 7F:
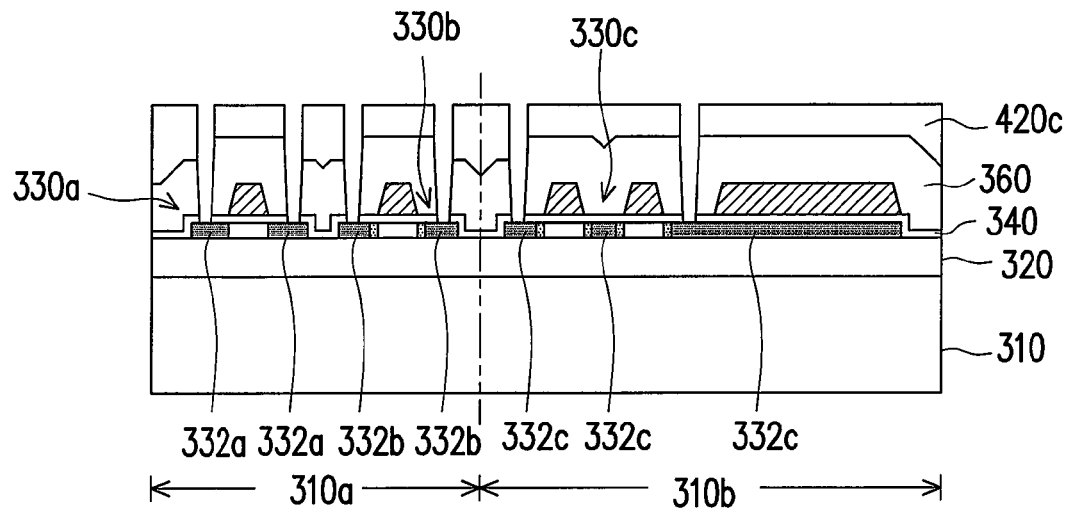
Figure 7G:
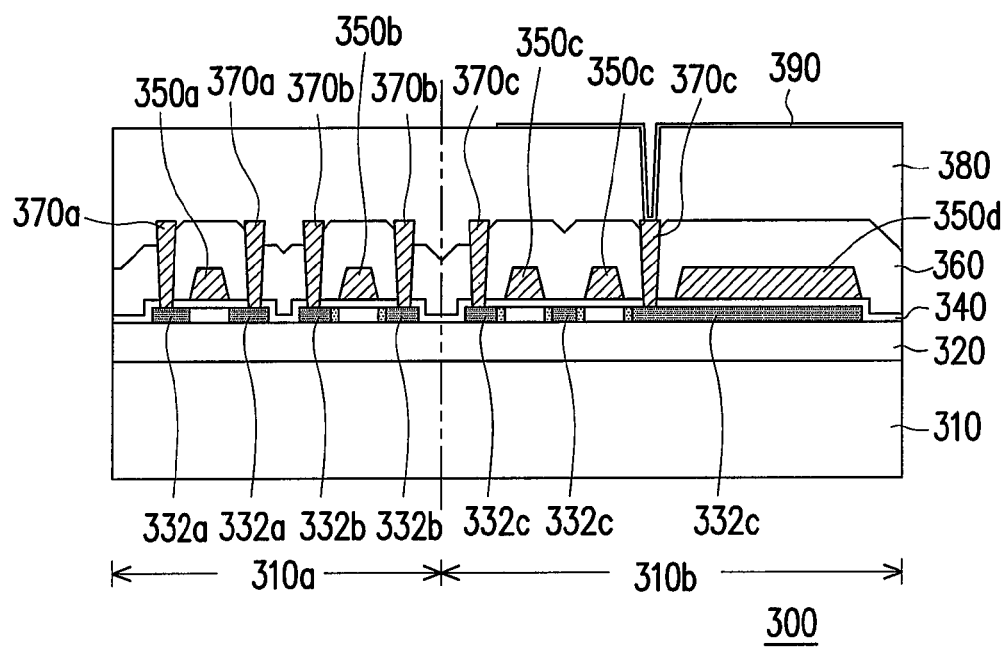

Referring to FIGS. 7E~7G, the steps in FIGS. 7E~7G are approximately the same as those in FIGS. 5D~5F. First, a first passivation layer 360a is formed on the substrate 310. After that, the third patterned photoresist layer 420c is formed by using the third half-tone mask 410c to form the first sources/drains 332a, the first channel region 334a, and the first patterned passivation layer 360. Next, the first source/drain conductive layers 370a, the second source/drain conductive layers 370b, the third source/drain conductive layers 370c, the second patterned passivation layer 380, and the pixel electrode 390 are formed in sequence to complete the manufacturing flow of the TFT array substrate 300 in the present embodiment. The materials and formation methods of the foregoing various components are approximately the same as those in the third embodiment therefore will not be described herein.

In the present embodiment, the second ion implantation process is performed by using the second patterned photoresist layer formed by the second half-tone mask. After that, the second patterned photoresist layer on the second poly-silicon islands and the third poly-silicon islands is removed to continue to perform the channel doping process. Next, the first ion implantation process is performed by using the third patterned photoresist layer formed by the third half-tone mask. After that, a portion of the thickness of the third patterned photoresist layer is removed to transform the first passivation layer into the first patterned passivation layer. In short, in the present embodiment, the second half-tone mask is used to replace the two masks in conventional technology, and then the third half-tone mask is used to replace another two masks in conventional technology, thus, the number of masks used in the present invention can be reduced, accordingly the manufacturing process can be simplified and manufacturing cost can be reduced. Similarly, gray tone mask or other mask having more than two transmissivities can also be used to replace the second and/or the third half-tone mask in the present embodiment.

Sixth Embodiment

FIGS. 8A~8G are diagrams illustrating the manufacturing flow of a LTPS TFT according to the sixth embodiment of the present invention. Referring to FIGS. 8A~8D, the contents of FIGS. 8A~8D are approximately the same as those of FIGS. 3A~3D. In short, the first patterned photoresist layer 420a is formed by using the first half-tone mask 410a to complete the first poly-silicon islands 330a, the second poly-silicon islands 330b, the third poly-silicon islands 330c, and the channel doping process S310 on the substrate 310. Next, a second ion implantation process S320b is further performed to form the second sources/drains 332b, the third sources/drains 332c, the second channel region 334b, and the third channel region 334c. Similarly, a buffer layer 320 can be formed on the substrate 310 first, and then the first, the second, and the third poly-silicon islands 330a, 330b, and 330c are formed. The materials and formation methods of the foregoing various components are approximately the same as those in the first embodiment therefore will not be described herein.

Figure 8A:
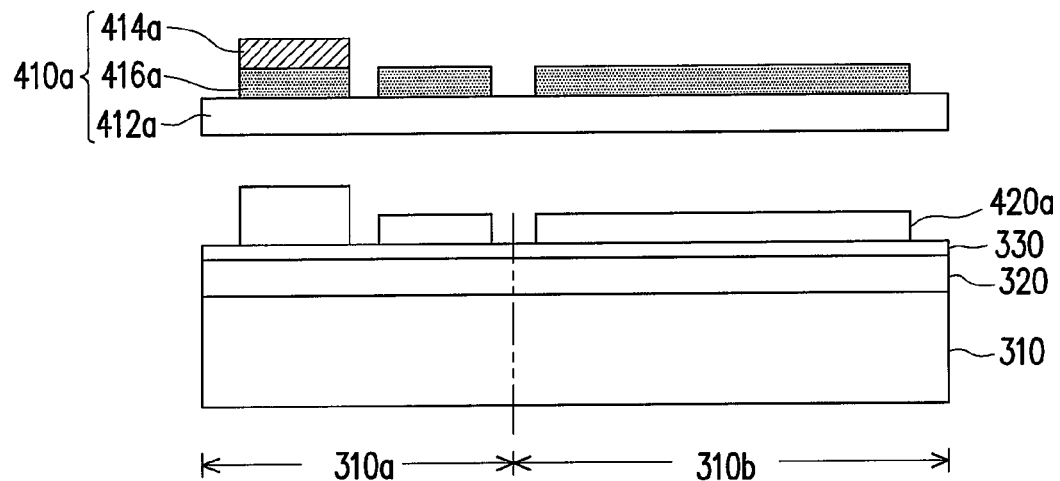
FIGS. 8A~8G are diagrams illustrating the manufacturing flow of a TFT array substrate according to the sixth embodiment of the present invention.
Figure 8B:
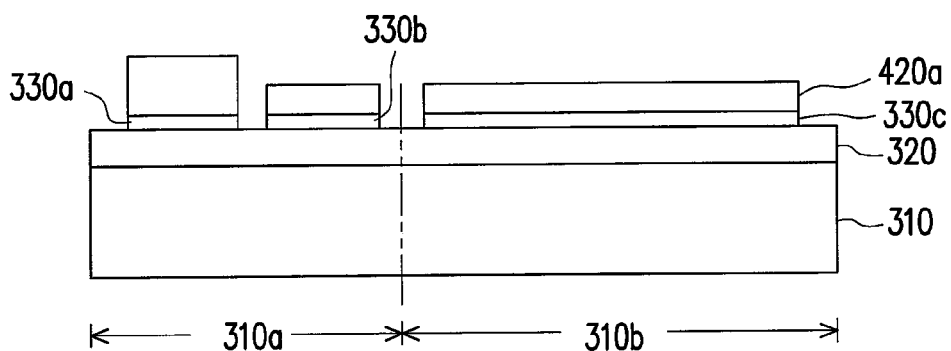
Figure 8C:
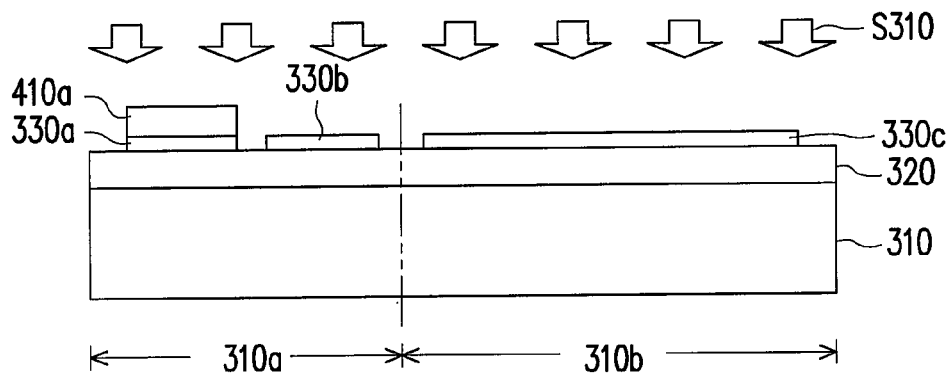
Figure 8D:
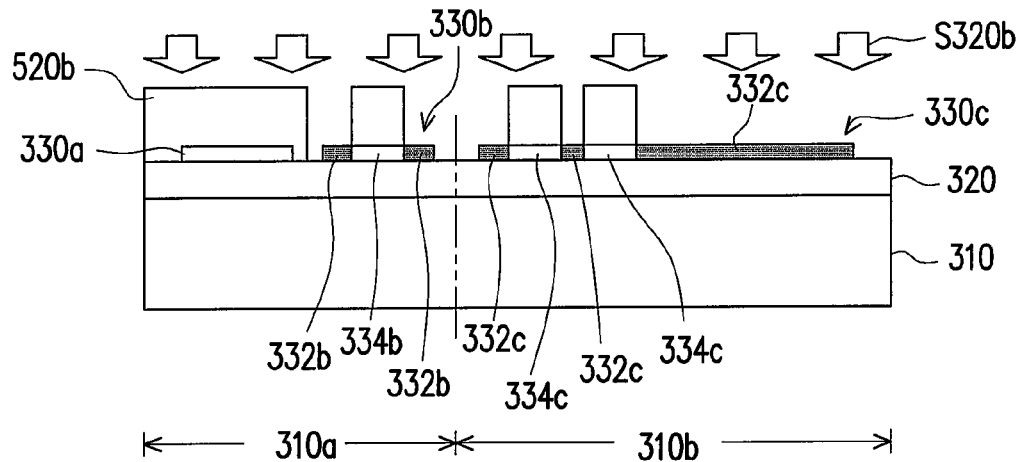
Figure 8E:
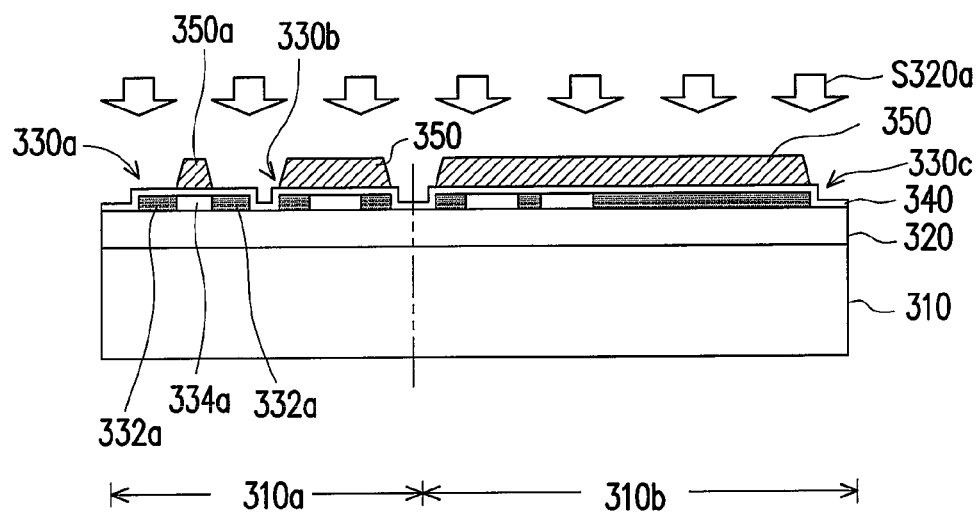

Referring to FIG. 8E, a gate insulating layer 340 is formed above the substrate 310 to cover the first, the second, and the third poly-silicon islands 330a, 330b, and 330c. After that, a patterned conductive material layer 350 and a plurality of first gates 350a are formed on the gate insulating layer 340. Wherein, the patterned conductive material layer 350 covers the second poly-silicon islands 330b and the third poly-silicon islands 330c. Next, a first ion implantation process S320a is performed with the first gates 350a as mask to form a first source/drain 332a in each of the first poly-silicon islands 130a. Wherein a first channel region 334a is between the first source/drain 332a.

To be specific, the material of the gate insulating layer 340 may be silicon oxide or other insulating materials. The silicon oxide is formed through PECVD process along with reactive gas such as $SiH_4/N_2O$ or $TEOS/O_2$. Moreover, to form the patterned conductive material layer 350, a conductive material layer can be formed on the gate insulating layer 340 through sputtering process or PVD process first. Wherein, the material of the conductive material layer may be Cr or other metal material. After that, photolithography and etching processes are performed to the conductive material layer to form the patterned conductive material layer 350 and the first gates 350a.

Figure 8F:
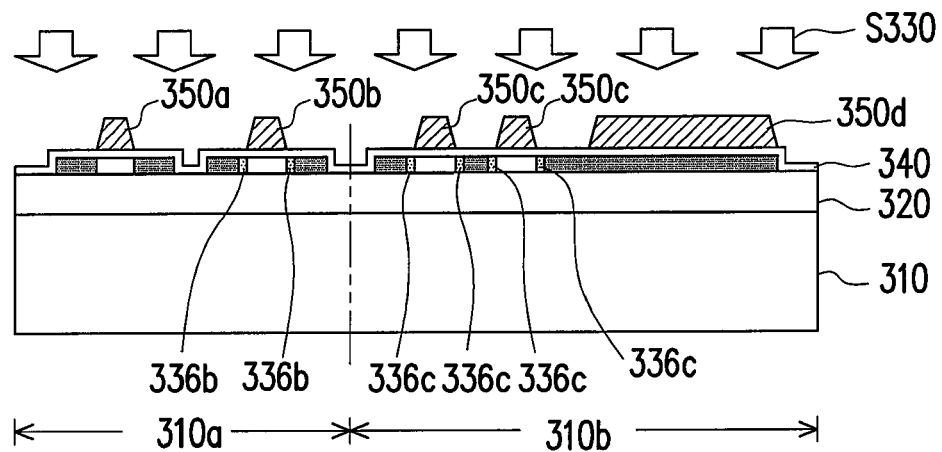

Referring to FIG. 8F, portions of the patterned conductive material layer 350 are removed to expose portions of the gate insulating layer 340 on the second poly-silicon islands 330b and the third poly-silicon islands 330c and to form a plurality of second gates 350b, a plurality of third gates 350c, and a plurality of capacitance electrodes 350d. Wherein there is a second gate 350b on each of the second poly-silicon islands 330b, there are two third gates 350c and a capacitance electrode 350d above each of the third poly-silicon islands 330c. Similarly, the present invention is not limited to the design of dual third gates 350c; instead, the present invention is also applicable to the design of single third gate 350c. Specifically, the method for forming the second gates 350b, the third gates 350c, and the capacitance electrodes 350d is, for example, performing a photolithography and an etching processes to the patterned conductive material layer 350. Besides, a lightly doped drain ion implantation process S330 may be further performed after forming the first gates 350a, the second gates 350b, the third gates 350c, and the capacitance electrodes 350d to form a second lightly doped drain 336b between each second source/drain 332b and the second channel region 334b and a third lightly doped drain 336c between each third source/drain 332c and the third channel region 334c.

Figure 8G:
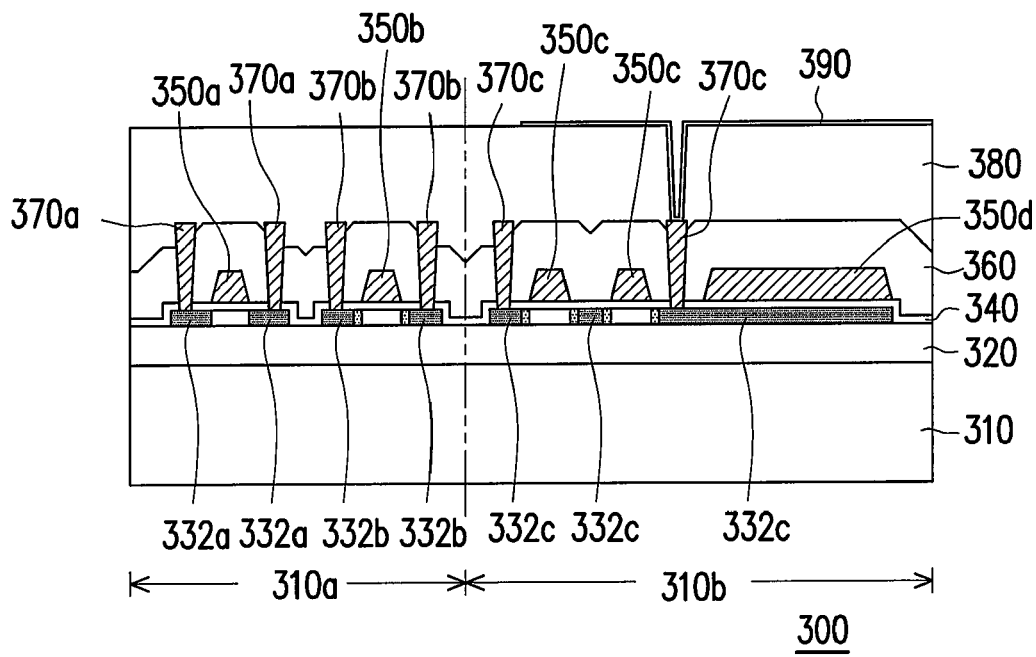

Referring to FIG. 8G, the steps in FIG. 8G are similar to those in FIG. 3G. The steps in FIG. 8G include forming the first patterned passivation layer 360, the first source/drain conductive layers 370a, the second source/drain conductive layers 370b, the third source/drain conductive layers 370c, the second patterned passivation layer 380, and the pixel electrode 390 in sequence to complete the manufacturing flow of the TFT array substrate 300 in the present embodiment. The materials and formation methods of the foregoing various components are approximately the same as those in the first embodiment therefore will not be described herein.

In the present embodiment, a first patterned photoresist layer, which is formed by using a first half-tone mask, is used for forming the first, the second, and the third poly-silicon islands. Then the first patterned photoresist layer on the second and the third poly-silicon islands is removed to continue to perform a channel doping process. In short, in the present embodiment, the first half-tone mask is used to replace the two masks in conventional technology, and then the third half-tone mask is used to replace another two masks in conventional technology, so that the number of masks used in the present invention can be reduced, accordingly the manufacturing process can be simplified and manufacturing cost can be reduced. Similarly, gray tone mask or other mask having more than two transmissivities can also be used to replace the first half-tone mask in the present embodiment.

Seventh Embodiment

Figure 9A:
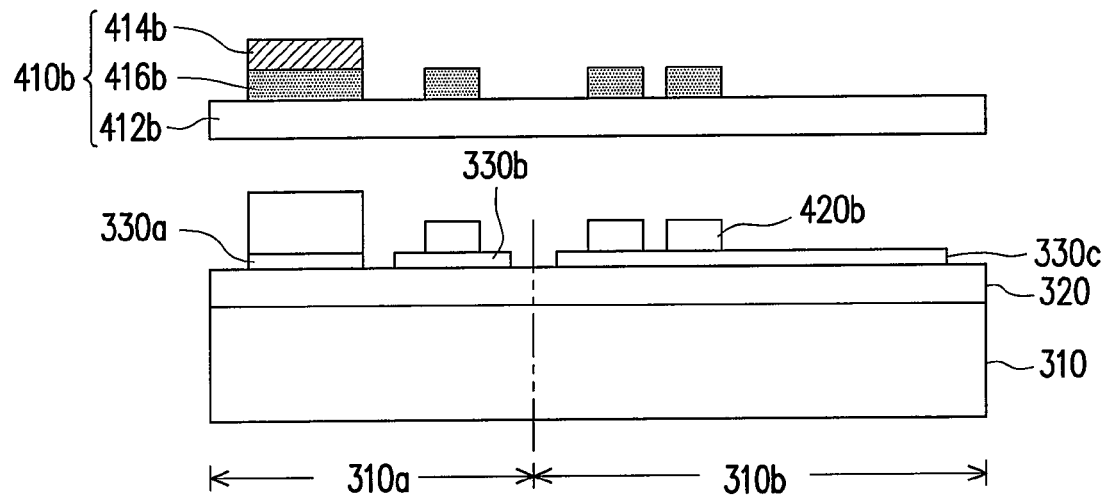
FIGS. 9A~9F are diagrams illustrating the manufacturing flow of a TFT array substrate according to the seventh embodiment of the present invention.
Figure 9B:
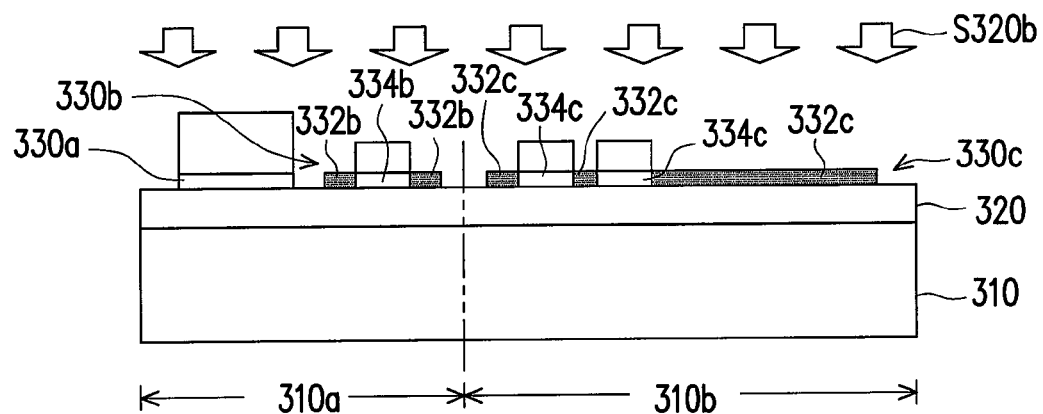
Figure 9C:
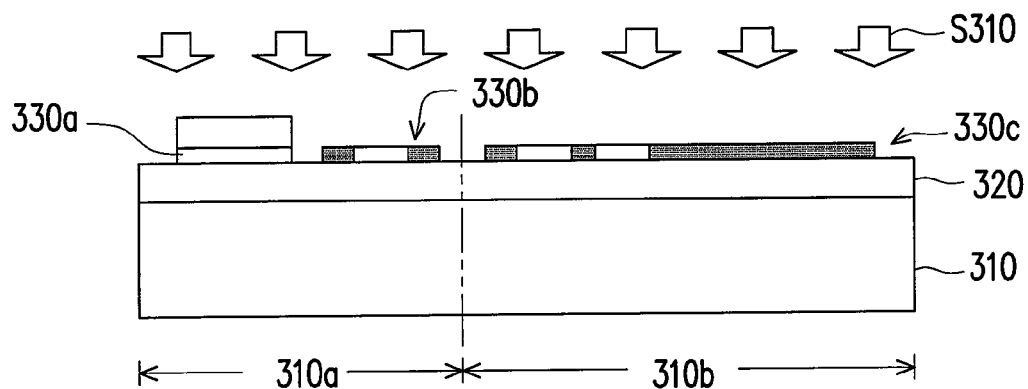

FIGS. 9A~9F are diagrams illustrating the manufacturing flow of a TFT array substrate according to the seventh embodiment of the present invention. Referring to FIGS. 9A~9C, the contents of FIGS. 9A~9C are approximately the same as those of FIGS. 4A~4C. In short, a plurality of first poly-silicon islands 330a, a plurality of second poly-silicon islands 330b, and a plurality of third poly-silicon islands 330c are formed on the substrate 310. After that, the second patterned photoresist layer 420b is formed by using the second half-tone mask 410b to complete the second sources/drains 332b, the third sources/drains 332c, the second channel region 334b, the third channel region 334c, and the channel doping process S310. Similarly, a buffer layer 320 can be formed on the substrate 310 first, and then the first, the second, and the third poly-silicon islands 330a, 330b, and 330c are formed. The materials and formation methods of the foregoing various components are approximately the same as those in the second embodiment therefore will not be described herein.

Figure 9D:
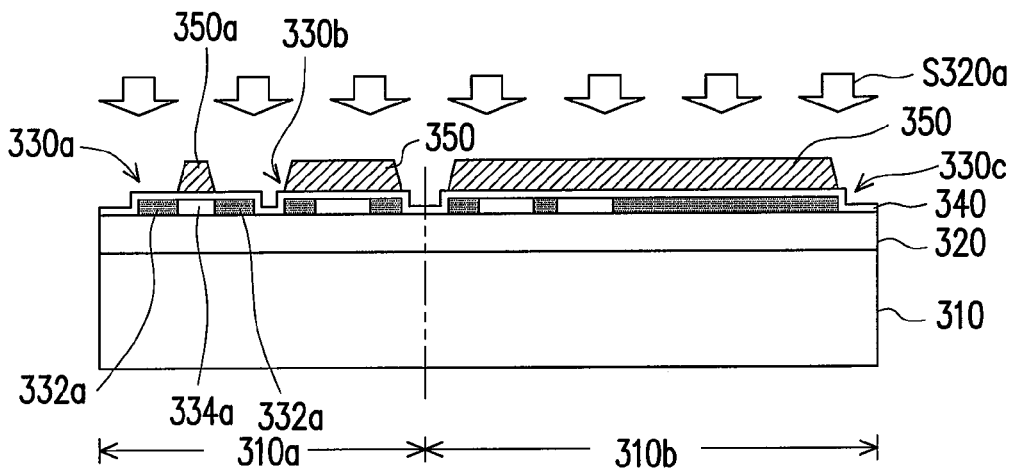
Figure 9E:
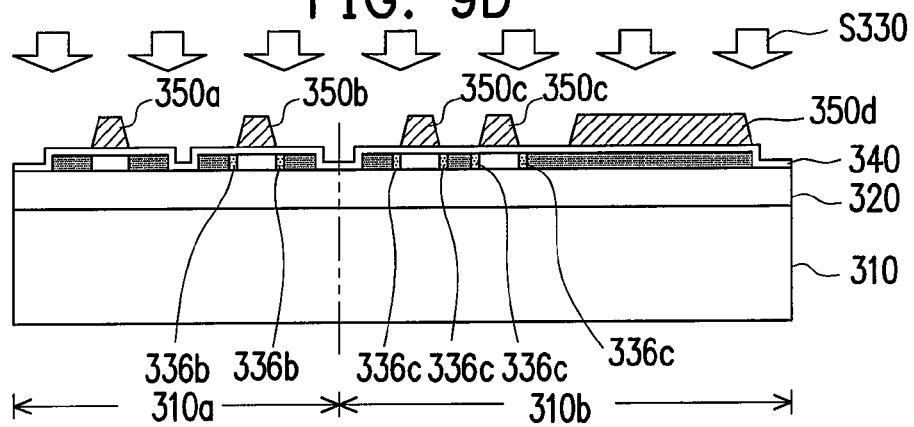
Figure 9F:
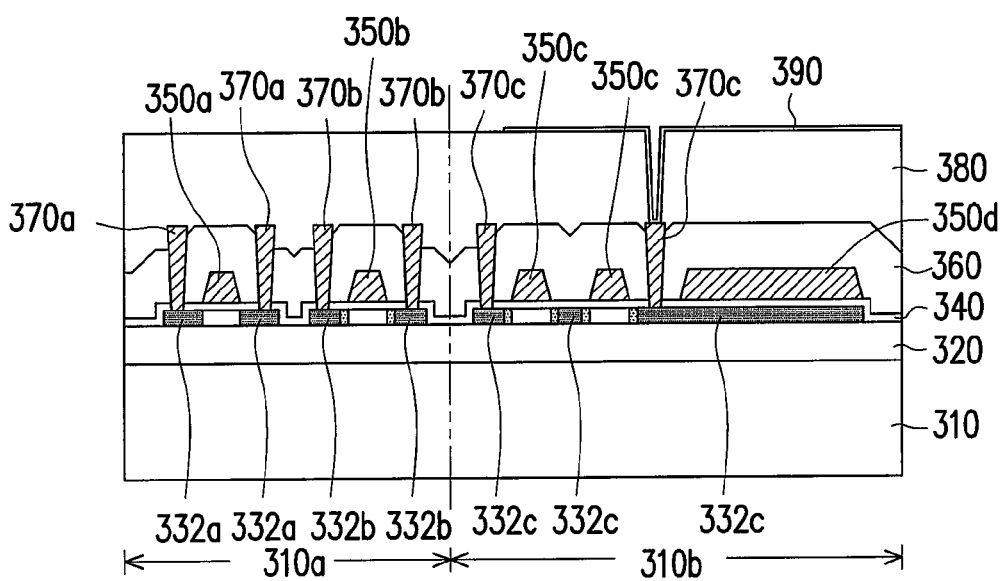

Referring to FIGS. 9D~9F, the steps in FIGS. 9D~9F are similar to those in FIGS. 8E~8G, which include forming the gate insulating layer 340, the first gates 350a, the first sources/drains 332a, the first channel region 334a, the second gates 350b, the third gates 350c, the capacitance electrodes 350d, the first patterned passivation layer 360, the first source/drain conductive layers 370a, the second source/drain conductive layers 370b, the third source/drain conductive layers 370c, the second patterned passivation layer 380, and the pixel electrode 390 in sequence to complete the manufacturing flow of TFT array substrate 300 in the present embodiment. Similarly, the present invention is not limited to the design of dual third gates 350c; instead, the present invention may also be applied to the design of single third gate 350c. In addition, a lightly doped drain ion implantation process S330 may be further performed after forming the first gates 350a, the second gates 350b, the third gates 350c, and the capacitance electrodes 350d to form the second lightly doped drain 336b and the third lightly doped drain 336c. The materials and formation methods of the foregoing various components are approximately the same as those in the sixth embodiment therefore will not be described herein.

In the present embodiment, the second ion implantation process is performed by using the second patterned photoresist layer formed by the second half-tone mask. Then the second patterned photoresist layer on the second poly-silicon islands and the third poly-silicon islands is removed to continue to perform the channel doping process. In short, in the present embodiment, the second half-tone mask is used to replace the two masks in conventional technology, thus, the number of masks used in the present invention can be reduced, accordingly the manufacturing process can be simplified and manufacturing cost can be reduced. Similarly, gray tone mask or other mask having more than two transmissivities can also be used to replace the second half-tone mask in the present embodiment.

Eighth Embodiment

Figure 10A:
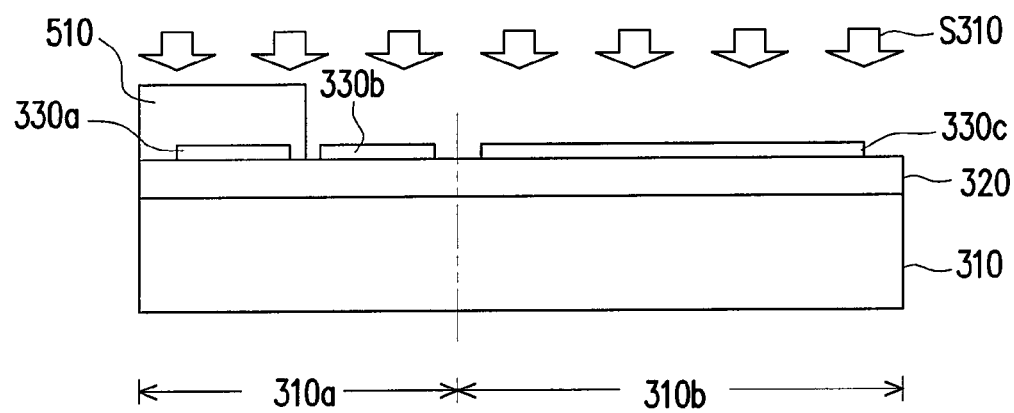
FIGS. 10A~10E are diagrams illustrating the manufacturing flow of a TFT array substrate according to the eighth embodiment of the present invention.
Figure 10B:
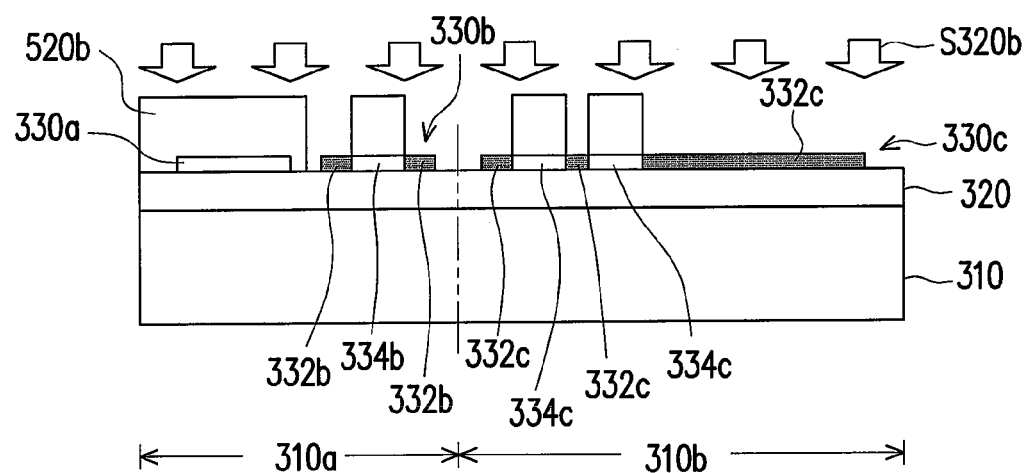

FIGS. 10A~10E are diagrams illustrating the manufacturing flow of a TFT array substrate according to the eighth embodiment of the present invention. Referring to FIGS. 10A~10B, the contents of FIGS. 10A~10B are approximately the same as those in FIGS. 5A~5B. In short, the first poly-silicon islands 330a, the second poly-silicon islands 330b, the third poly-silicon islands 330c, the second sources/drains 332b, the third sources/drains 332c, the second channel region 334b, and the third channel region 334c are first formed in sequence. Similarly, a buffer layer 320 can be formed on the substrate 310 first, and then the first, the second, and the third poly-silicon islands 330a, 330b, and 330c are formed. The formation methods and materials of the buffer layer 320, the first poly-silicon islands 330a, the second poly-silicon islands 330b, and the third poly-silicon islands 330c are similar to those in the third embodiment therefore will not be described herein.

Figure 10C:
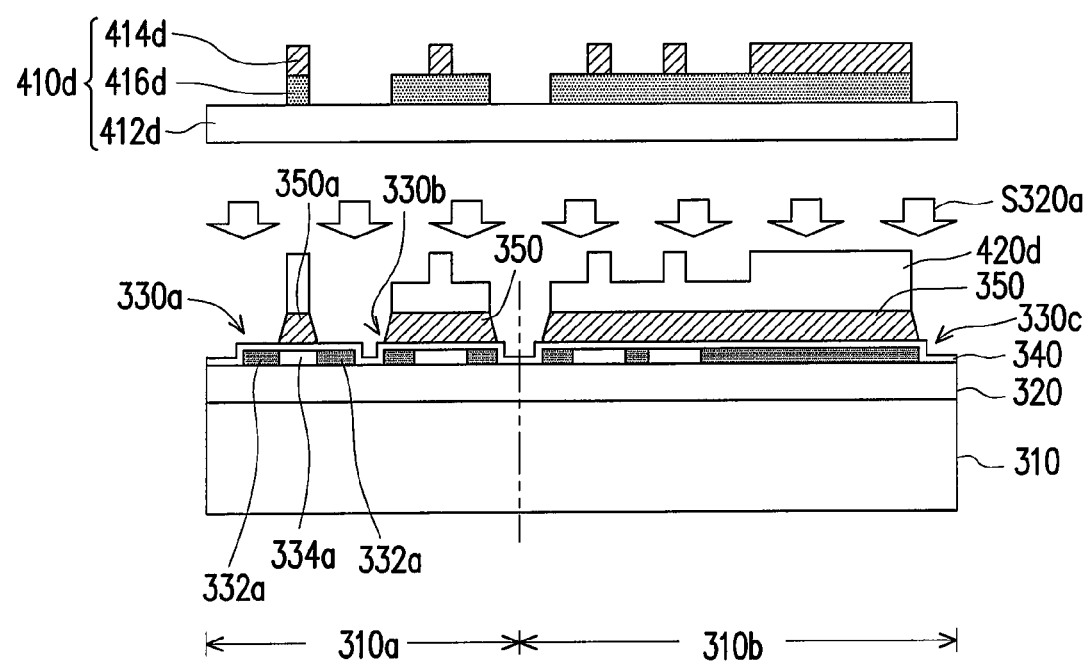

Referring to FIG. 10C, first, a gate insulating layer 340 and a conductive material layer (not shown) are formed in sequence above the substrate 310. After that, a fourth patterned photoresist layer 420d is formed on the conductive material layer by using a fourth half-tone mask 410d. Wherein the composition, material, and function of the fourth half-tone mask 410d are the same as those of the first half-tone mask 410a and are not described herein. Next, portions of the conductive material layer are removed with the fourth patterned photoresist layer 420d as mask to form a patterned conductive material layer 350 and a plurality of first gates 350a. Wherein the patterned conductive material layer 350 covers the second poly-silicon islands 330b and the third poly-silicon islands 330c. Specifically, the method for forming the conductive material layer is, for example, sputtering process or PVD process, and the method for forming the patterned conductive material layer 350 is, for example, a photolithography process and an etching process. Wherein the material of the conductive material layer may be Cr or other metal material.

Referring to FIG. 10C again, a first ion implantation process S320a is performed with the fourth patterned photoresist layer 420d as mask to form a first source/drain 332a in each of the first poly-silicon islands 330a. Wherein a first channel region 334a is between the first source/drain 332a. Next, a portion of the thickness of the fourth patterned photoresist layer 420d is removed to expose portions of the gate insulating layer 340 on the second poly-silicon islands 330b and the third poly-silicon islands 330c.

Figure 10D:
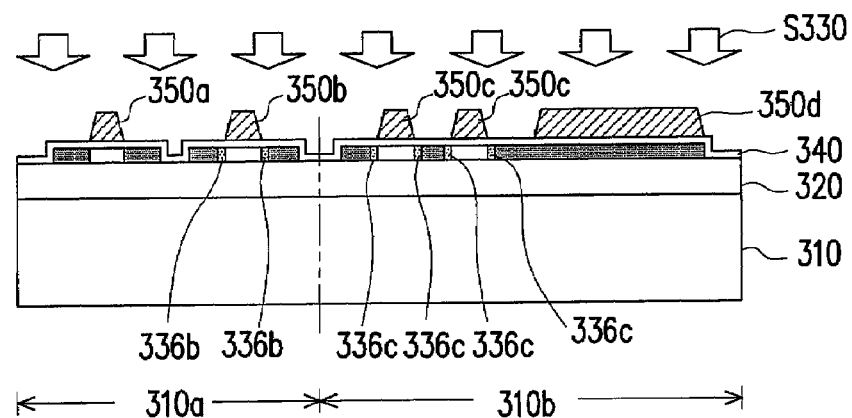

Referring to FIG. 10D, portions of the patterned conductive material layer 350 are removed with the fourth patterned photoresist layer 420d as mask to form a plurality of second gates 350b, a plurality of third gates 350c, and a plurality of capacitance electrodes 350d. Wherein there is a second gate 350b above each of the second poly-silicon islands 330b, and there are two third gates 350c and a capacitance electrode 350d above each of the third poly-silicon islands 330c. Similarly, the present invention is not limited to the design of dual third gates 350c; instead, the present invention may also be applied to the design of single third gate 350c. To be specific, the method for forming the second gates 350b, the third gates 350c, and the capacitance electrodes 350d is, for example, performing a photolithography process and an etching process to the patterned conductive material layer 350. Besides, a lightly doped drain ion implantation process S330 may be further performed after forming the first gates 350a, the second gates, 350b, the third gates 350c, and the capacitance electrodes 350d to form a second lightly doped drain 336b between each second source/drain 332b and the second channel region 334b and a third lightly doped drain 336c between each third source/drain 332c and the third channel region 334c.

Figure 10E:
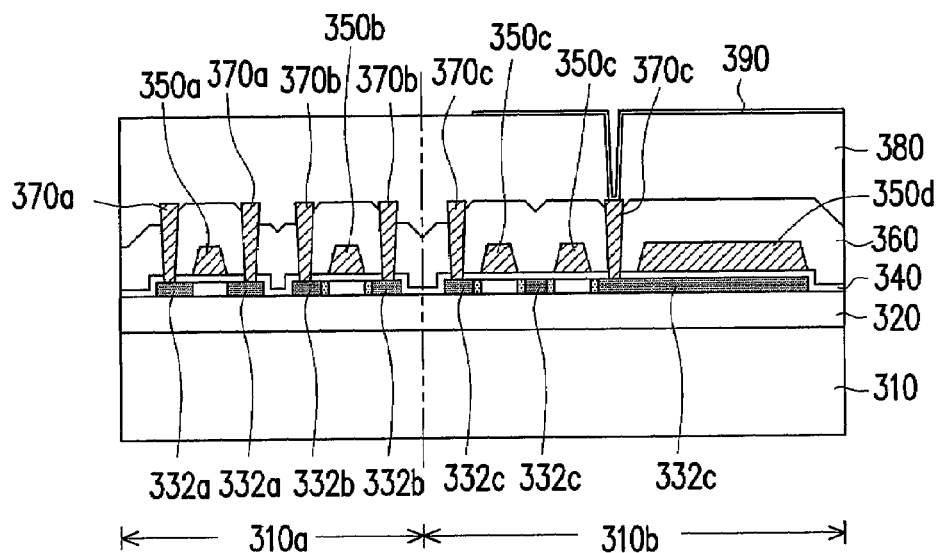

Referring to FIG. 10E, the steps in FIG. 10E are similar to those in FIG. 9F, which include forming the first patterned passivation layer 360, the first source/drain conductive layers 370a, the second source/drain conductive layers 370b, the third source/drain conductive layers 370c, the second patterned passivation layer 380, and the pixel electrode 390 in sequence to complete the manufacturing flow of LTPS TFT 300 in the present embodiment. The materials and formation methods of the foregoing various components are approximately the same as those in the seventh embodiment therefore will not be described herein.

In the present embodiment, a gate is formed by using the fourth patterned photoresist layer formed by the fourth half-tone mask and then a first ion implantation process is perform. After that, a portion of the thickness of the fourth patterned photoresist layer is removed to continue to form the second gates, the third gates, and the capacitance electrodes. In short, in the present embodiment, the fourth half-tone mask is used to replace the two masks in conventional technology, thus, the number of masks used in the present invention can be reduced, accordingly the manufacturing process can be simplified and manufacturing cost can be reduced. Similarly, gray tone mask or other mask having more than two transmissivities can also be used to replace the fourth half-tone mask in the present embodiment.

Ninth Embodiment

FIGS. 11A~11G are diagrams illustrating the manufacturing flow of a TFT array substrate according to the ninth embodiment of the present invention. Referring to FIGS. 11A~11D, the contents of FIGS. 11A~11D are approximately the same as those of FIGS. 3A~3D. In short, the first patterned photoresist layer 420a is formed by using the first half-tone mask 410a to complete the first poly-silicon islands 330a, the second poly-silicon islands 330b, the third poly-silicon islands 330c, and the channel doping process S310 on the substrate 310. Next, the second sources/drains 332b, the third sources/drains 332c, the second channel region 334b, and the third channel region 334c are completed through the second ion implantation process S320b.

Similarly, a buffer layer 320 can be formed on the substrate 310 first, and then the first, the second, and the third poly-silicon islands 330a, 330b, and 330c are formed. The materials and formation methods of the foregoing various components are approximately the same as those in the first embodiment therefore will not be described herein.

Figure 11A:
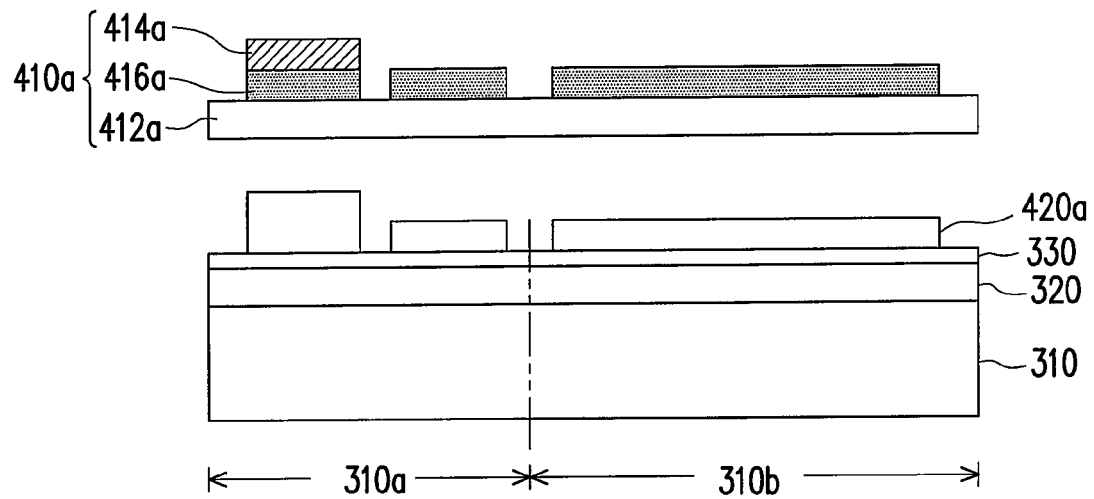
FIGS. 11A~11G are diagrams illustrating the manufacturing flow of a TFT array substrate according to the ninth embodiment of the present invention.
Figure 11B:
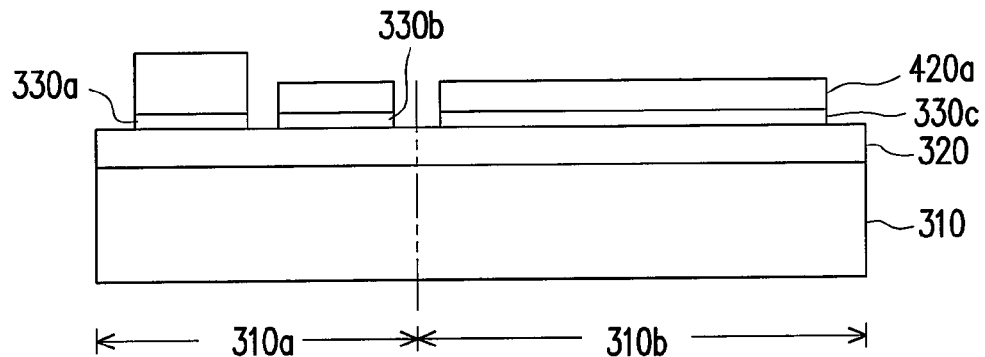
Figure 11C:
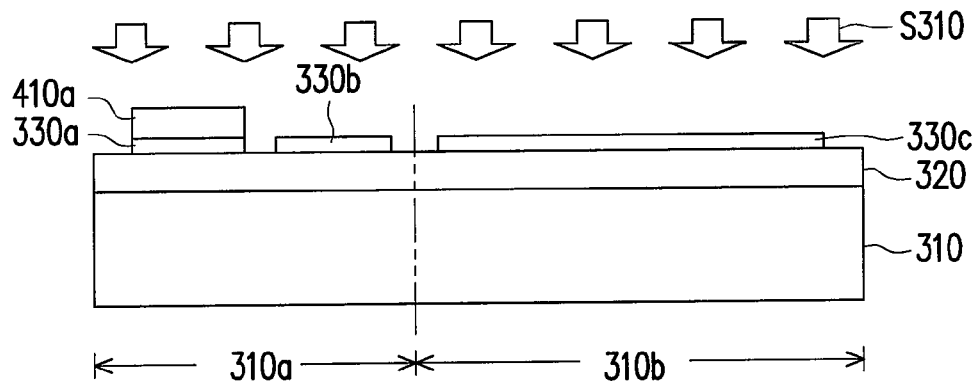
Figure 11D:
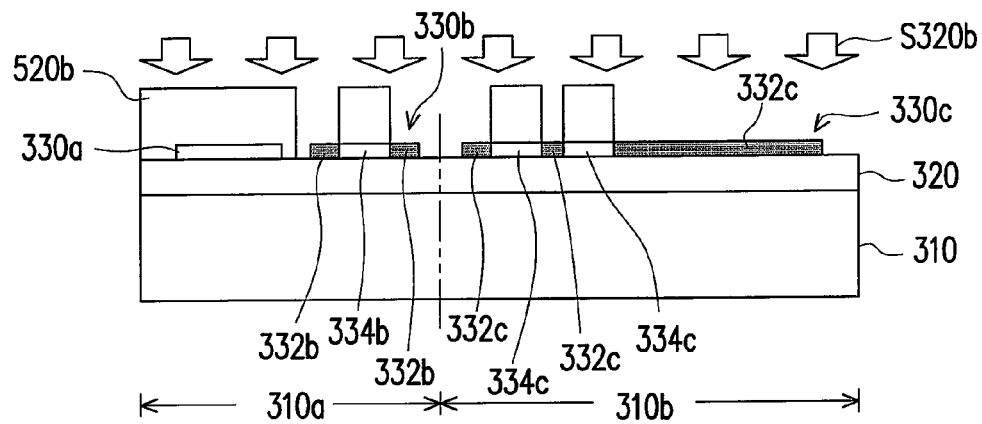
Figure 11E:
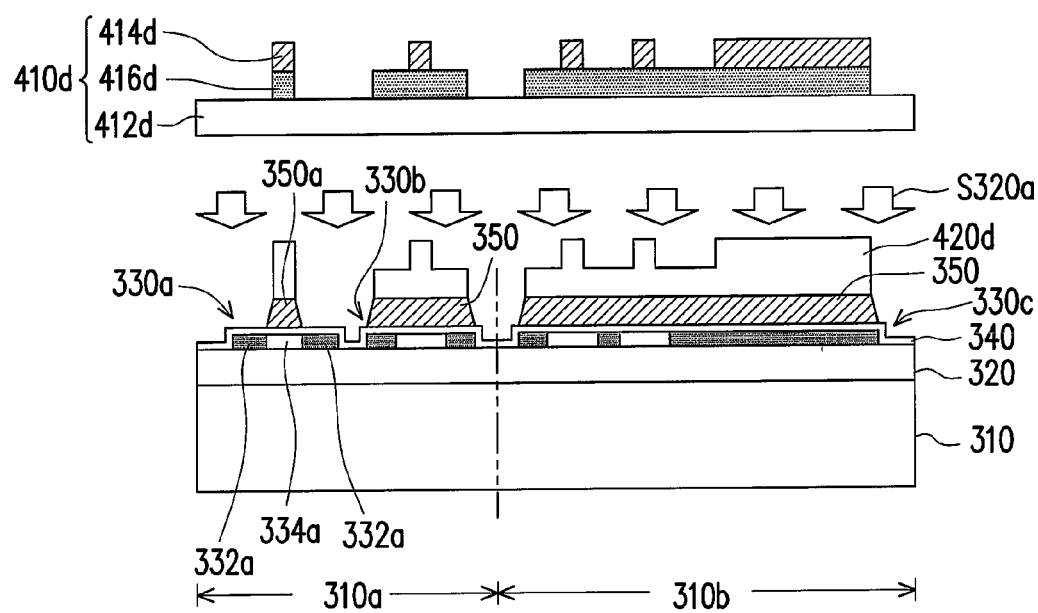
Figure 11F:
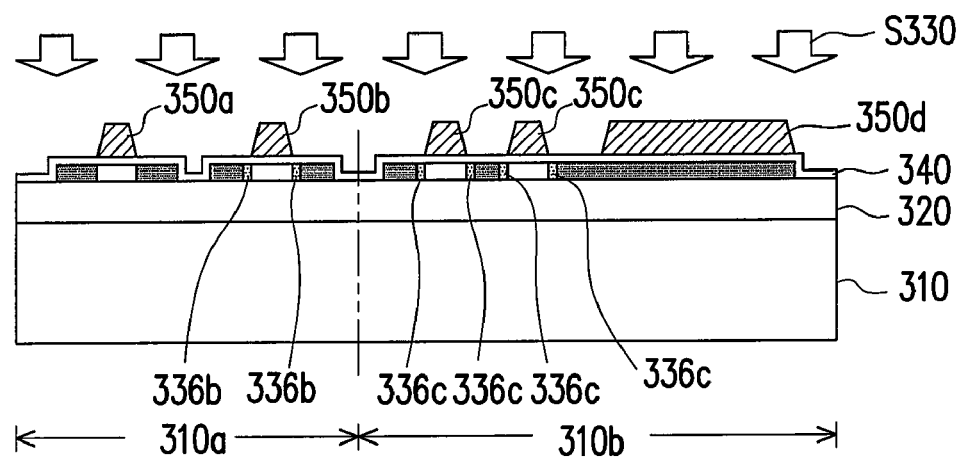
Figure 11G:
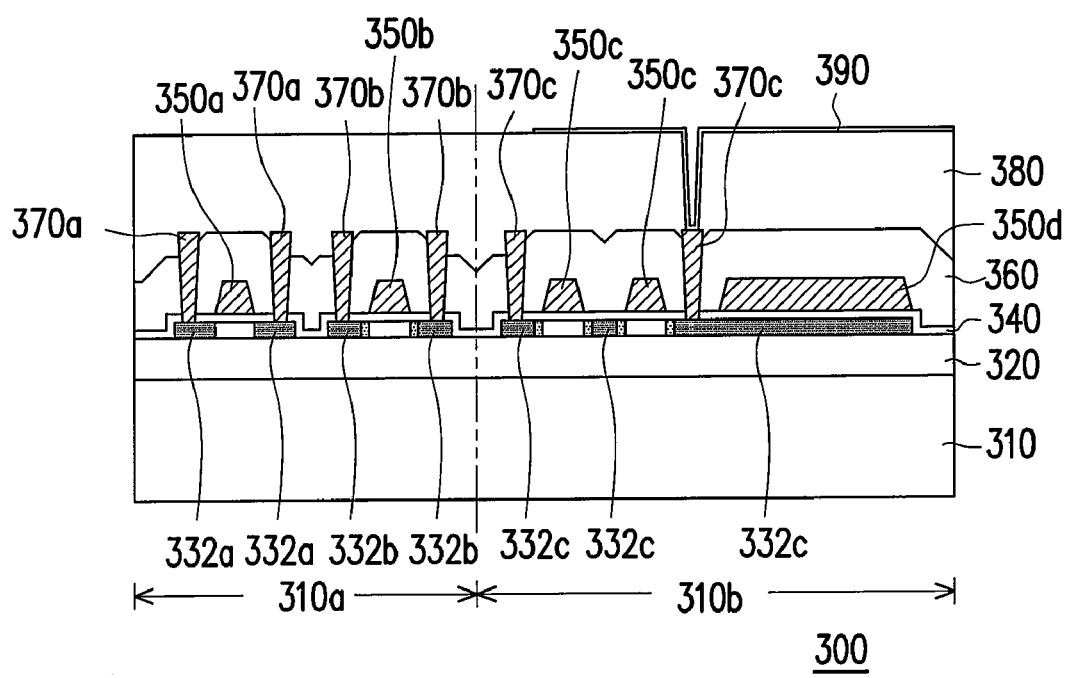

Referring to FIGS. 11E~11G, the steps in FIGS. 11E~11G are similar to those in FIGS. 10C~10E. First, a gate insulating layer 340 and a conductive material layer (not shown) are formed on the substrate 310 in sequence. After that, the fourth patterned photoresist layer 420d is formed by using the fourth half-tone mask 410d to form the first gates 350a, the first source/drain 332a, the first channel region 334a, the second gates 350b, the third gates 350c, and the capacitance electrodes 350d in sequence. Next, the first patterned passivation layer 360, the first source/drain conductive layers 370a, the second source/drain conductive layers 370b, the third source/drain conductive layers 370c, the second patterned passivation layer 380, and the pixel electrode 390 are formed in sequence to complete the manufacturing flow of TFT array substrate 300 in the present embodiment.

Similarly, the present invention is not limited to the design of dual third gates 350c; instead, the present invention may also be applied to the design of single third gate 350c. In addition, a lightly doped drain ion implantation process S330 is further performed after forming the first gates 350a, the second gates 350b, the third gates 350c, and the capacitance electrodes 350d to form a second lightly doped drain 336b between each second source/drain 332b and the second channel region 334b and a third lightly doped drain 336c between each third source/drain 332c and the third channel region 334c. The materials and formation methods of the foregoing various components are approximately the same as those in the eighth embodiment therefore will not be described herein.

In the present embodiment, a first patterned photoresist layer, which is formed by using a first half-tone mask, is used for forming the first, the second, and the third poly-silicon islands. Then the first patterned photoresist layer on the second and the third poly-silicon islands is removed to continue to perform a channel doping process. Next, the first gates are formed first by using the fourth patterned photoresist layer formed by using the fourth half-tone mask, and then the first ion implantation process is performed. After that, a portion of the thickness of the fourth patterned photoresist layer is removed to continue to form the second gates, the third gates, and the capacitance electrodes. In short, in the present embodiment, the first half-tone mask is used to replace the two masks in conventional technology, and then the fourth half-tone mask is used to replace another two masks in conventional technology, so that the number of masks used in the present invention can be reduced, accordingly the manufacturing process can be simplified and manufacturing cost can be reduced. Similarly, gray tone mask or other mask having more than two transmissivities can also be used to replace the first and/or the fourth half-tone mask in the present embodiment.

Tenth Embodiment

Figure 12A:
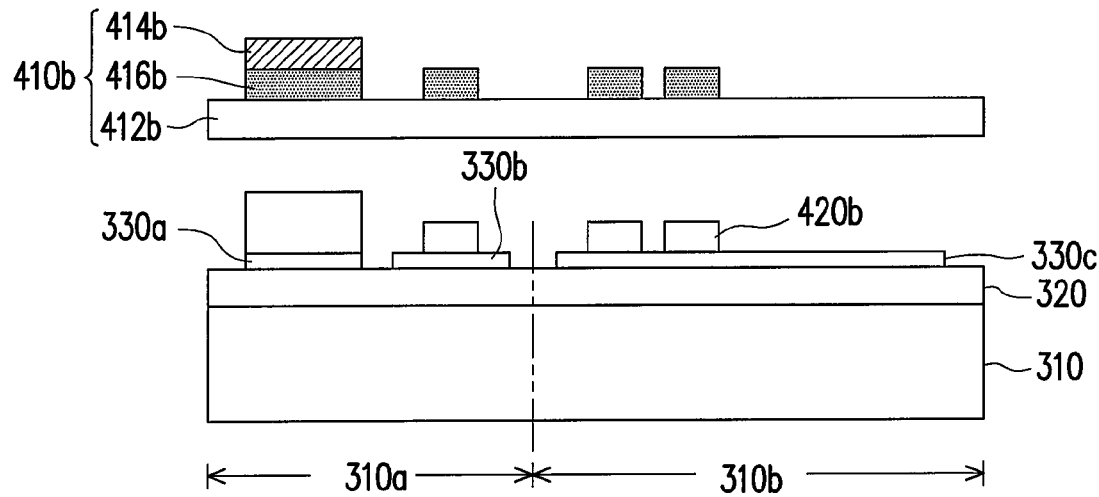
FIGS. 12A~12F are diagrams illustrating the manufacturing flow of a TFT array substrate according to the tenth embodiment of the present invention.
Figure 12B:
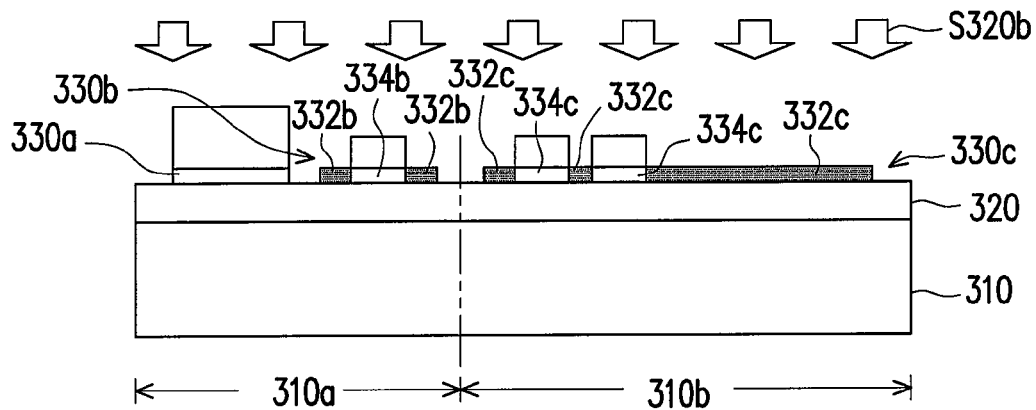
Figure 12C:
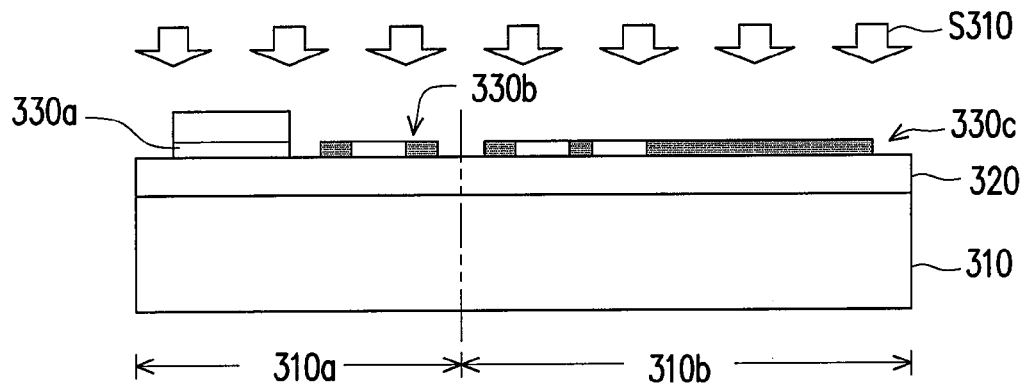

FIGS. 12A~12F are diagrams illustrating the manufacturing flow of a LTPS TFT according to the tenth embodiment of the present invention. Referring to FIGS. 12A~12C, the contents of FIGS. 12A~12C are approximately the same as those of FIGS. 4A~4C. In short, a plurality of first poly-silicon islands 330a, a plurality of second poly-silicon islands 330b, and a plurality of third poly-silicon islands 330c are formed on the substrate 310. After that, the second patterned photoresist layer 420b is formed by using the second half-tone mask 410b to complete the second sources/drains 332b, the third sources/drains 332c, the second channel region 334b, the third channel region 334c, and the channel doping process S310. Similarly, a buffer layer 320 can be formed on the substrate 310 first, and then the first, the second, and the third poly-silicon islands 330a, 330b, and 330c are formed. The materials and formation methods of the foregoing various components are approximately the same as those in the second embodiment therefore will not be described herein.

Figure 12D:
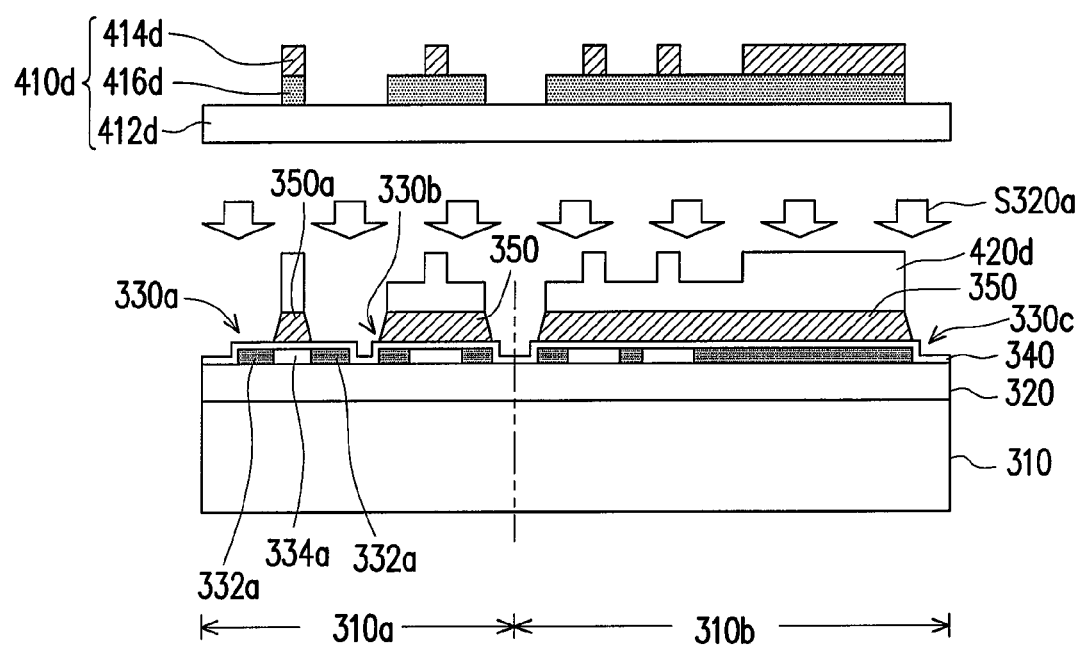
Figure 12E:
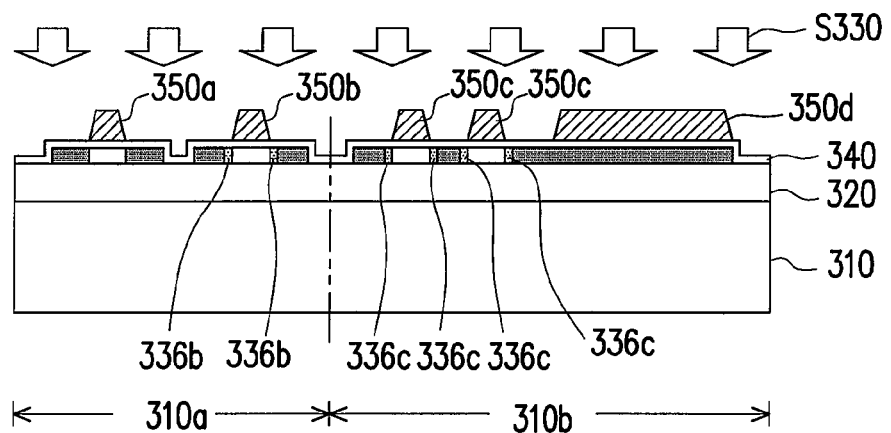
Figure 12F:
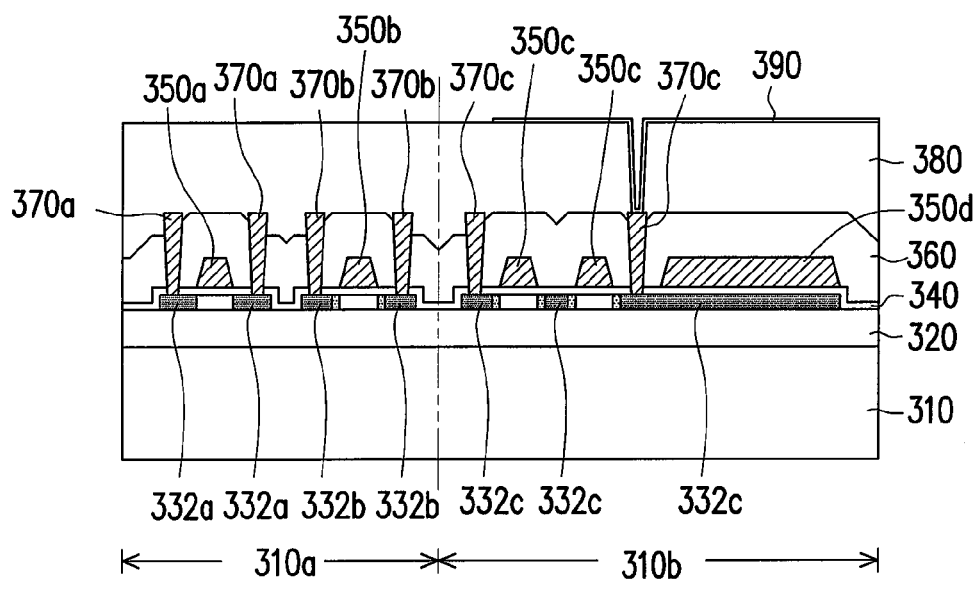

Referring to FIGS. 12D~12F, the steps in FIGS. 12D~12F are similar to those in FIGS. 10C~10E. First, a gate insulating layer 340 and a conductive material layer (not shown) are formed above the substrate 310 in sequence. After that, the fourth patterned photoresist layer 420d is formed by using the fourth half-tone mask 410d to complete the first gates 350a, the first source/drain 332a, the first channel region 334a, the second gates 350b, the third gates 350c, and the capacitance electrodes 350d in sequence. Next, the first patterned passivation layer 360, the first source/drain conductive layers 370a, the second source/drain conductive layers 370b, the third source/drain conductive layers 370c, the second patterned passivation layer 380, and the pixel electrode 390 are formed in sequence to complete the manufacturing flow of TFT array substrate 300 in the present embodiment.

Similarly, the present invention is not limited to the design of dual third gates 350c; instead, the present invention may also be applied to the design of single third gates 350c. In addition, a lightly doped drain ion implantation process S330 is further performed after forming the first gates 350a, the second gates 350b, the third gates 350c, and the capacitance electrodes 350d to form a second lightly doped drain 336b between each second source/drain 332b and the second channel region 334b and a third lightly doped drain 336c between each third source/drain 332c and the third channel region 334c. The materials and formation methods of the foregoing various components are approximately the same as those in the eighth embodiment therefore will not be described herein.

In the present embodiment, the second ion implantation process is performed by using the second patterned photoresist layer formed by the second half-tone mask. Then the second patterned photoresist layer on the second poly-silicon islands and the third poly-silicon islands is removed to continue to perform channel doping process. Next, the fourth patterned photoresist layer formed by the fourth half-tone mask is used for forming the first gate and then performing the first ion implantation process. After that, a portion of the thickness of the fourth patterned photoresist layer is removed to continue to form the second gates, the third gates, and the capacitance electrodes. In short, in the present embodiment, the second half-tone mask is used to replace the two masks in conventional technology, and then the fourth half-tone mask is used to replace another two masks in conventional technology, thus, the number of masks used in the present invention can be reduced, accordingly the manufacturing process can be simplified and manufacturing cost can be reduced. Similarly, gray tone mask or other mask having more than two transmissivities can also be used to replace the second and/or fourth half-tone mask in the present embodiment.

In overview, according to the present invention, half-tone masks or gray tone masks are used for forming the two continuous photoresist layers required during the manufacturing process with the same thicknesses at the same time, thus, the 9 masks of conventional LTPS TFT can be simplified into 7 or 8 masks through half-tone mask or gray tone mask. Accordingly, the manufacturing process of TFT array substrate can be simplified, and furthermore, the product qualified rate and the panel size can be increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A manufacturing method of thin film transistor array substrate, comprising:

providing a substrate, a plurality of first poly-silicon islands, a plurality of second poly-silicon islands, a plurality of third poly-silicon islands, a gate insulating layer, a plurality of first gates, a plurality of second gates, a plurality of third gates, and a first passivation layer having been formed on the substrate, wherein the substrate has a peripheral region and an array region, the first poly-silicon islands and the second poly-silicon islands are disposed on the peripheral region, and the third poly-silicon islands are disposed on the array region, the gate insulating layer covers the first poly-silicon islands, the second poly-silicon islands, and the third poly-silicon islands, the first gates, the second gates, and the third gates are respectively disposed on the gate insulating layer over the first poly-silicon islands, the second poly-silicon islands, and the third poly-silicon islands, the first passivation layer covers the first gates, the second gates, and the third gates, and a second source/drain has been formed in each of the second poly-silicon islands, a third source/drain has been formed in each of the third poly-silicon islands, the second poly-silicon islands and the third poly-silicon islands have been implanted with ions;

forming a third patterned photoresist layer on the first passivation layer by using a third half-tone mask, wherein the third patterned photoresist layer exposes portions of the first passivation layer on the first poly-silicon islands;

performing a first ion implantation process with the third patterned photoresist layer as mask to form a first source/drain in each of the first poly-silicon islands, wherein a first channel region is between the first source/drain;

removing a portion of the thickness of the third patterned photoresist layer to expose portions of the first passivation layer on the second poly-silicon islands and the third poly-silicon islands;

removing portions of the first passivation layer and the gate insulating layer with the third patterned photoresist layer as mask to expose portions of each of the first sources/drains, portions of each of the second sources/drains, and portions of each of the third sources/drains and to form a first patterned passivation layer;

removing the third patterned photoresist layer;

forming a plurality of first source/drain conductive layers, a plurality of second source/drain conductive layers, and a plurality of third source/drain conductive layers on the first patterned passivation layer, wherein the first source/drain conductive layers are electrically connected to the first sources/drains respectively, the second source/drain conductive layers are electrically connected to the second sources/drains respectively, and the third source/drain conductive layers are electrically connected to the third sources/drains respectively;

forming a second patterned passivation layer on the first patterned passivation layer, wherein the second patterned passivation layer exposes portions of each of the third source/drain conductive layers; and forming a plurality of pixel electrodes on the second patterned passivation layer, wherein each of the pixel electrodes is electrically connected to the corresponding third source/drain conductive layers.

2. The thin film transistor manufacturing method as claimed in claim 1, wherein the method for forming the first poly-silicon islands, the second poly-silicon islands, and the third poly-silicon islands comprises:

forming a poly-silicon layer on the substrate;

forming a first patterned photoresist layer on the poly-silicon layer by using a first half-tone mask;

removing portions of the poly-silicon layer with the first patterned photoresist layer as mask to form the first poly-silicon islands, the second poly-silicon islands, and the third poly-silicon islands;

removing the first patterned photoresist layer on the second poly-silicon islands and the third poly-silicon islands;

performing a channel doping process to implant ions into the second poly-silicon islands and the third poly-silicon islands; and removing the first patterned photoresist layer.

3. The thin film transistor manufacturing method as claimed in claim 2, wherein after removing the first patterned photoresist layer, the method further comprising:

performing a second ion implantation process to form the second source/drain in each of the second poly-silicon islands and the third source/drain in each of the third poly-silicon islands, wherein a second channel region is between the second source/drain and a third channel region is between the third source/drain;

forming a gate insulating layer above the substrate to cover the first poly-silicon islands, the second poly-silicon islands, and the third poly-silicon islands;

forming the first gates, the second gates, and the third gates on the gate insulating layer, wherein the first gates, the second gates, and the third gates are respectively disposed above the first poly-silicon islands, the second poly-silicon islands, and the third poly-silicon islands; and forming the first passivation layer above the substrate to cover the first gates, the second gates, and the third gates.

4. The thin film transistor manufacturing method as claimed in claim 3, wherein after forming the first gates, the second gates, and the third gates, the method further comprises performing a lightly doped drain ion implantation process to form a second lightly doped drain between each of the second sources/drains and the second channel region and a third lightly doped drain between each of the third sources/drains and the third channel region.

5. The thin film transistor manufacturing method as claimed in claim 1, wherein the method for forming the second sources/drains and the third sources/drains comprises:

forming the first poly-silicon islands, the second poly-silicon islands, and the third poly-silicon islands on the substrate;

forming a second patterned photoresist layer on the first poly-silicon islands, the second poly-silicon islands, and the third poly-silicon islands by using a second half-tone mask;

performing a second ion implantation process to form a second source/drain in each of the second poly-silicon islands and a third source/drain in each of the third poly-silicon islands, wherein a second channel region is between the second source/drain and a third channel region is between the third source/drain;

removing the second patterned photoresist layer on the second poly-silicon islands and the third poly-silicon islands;

performing a channel doping process to implant ions into the second poly-silicon islands and the third poly-silicon islands; and removing the second patterned photoresist layer.

6. The thin film transistor manufacturing method as claimed in claim 5, wherein after removing the second patterned photoresist layer, the method further comprises:

forming a gate insulating layer above the substrate to cover the first poly-silicon islands, the second poly-silicon islands, and the third poly-silicon islands;

forming the first gates, the second gates, and the third gates on the gate insulating layer, wherein the first gates, the second gates, and the third gates are respectively disposed on the first poly-silicon islands, the second poly-silicon islands, and the third poly-silicon islands; and forming the first passivation layer above the substrate to cover the first gates, the second gates, and the third gates.

7. The thin film transistor manufacturing method as claimed in claim 6, wherein after forming the first gates, the second gates, and the third gates, the method further comprises performing a lightly doped drain ion implantation process to form a second lightly doped drain between each of the second sources/drains and the second channel region and a third lightly doped drain between each of the third sources/drains and the third channel region.

8. A manufacturing method of thin film transistor array substrate, comprising:

providing a substrate, a plurality of first poly-silicon islands, a plurality of second poly-silicon islands, a plurality of third poly-silicon islands, and a gate insulating layer having been formed on the substrate, wherein the substrate has a peripheral region and an array region, the first poly-silicon islands and the second poly-silicon islands are disposed on the peripheral region, and the third poly-silicon islands are disposed on the array region, the gate insulating layer covers the first poly-silicon islands, the second poly-silicon islands, and the third poly-silicon islands, the second poly-silicon islands and the third poly-silicon islands have been implanted with ions, and a second source/drain has been formed in each of the second poly-silicon islands, a third source/drain has been formed in each of the third poly-silicon islands, a second channel region is between the second source/drain, and a third channel region is between the third source/drain;

forming a conductive material layer on the gate insulating layer;

forming a fourth patterned photoresist layer on the conductive material layer by using a fourth half-tone mask;

removing portions of the conductive material layer with the fourth patterned photoresist layer as mask to form a plurality of first gates;

performing a first ion implantation process with the fourth patterned photoresist layer as mask to form a first source/drain in each of the first poly-silicon islands, wherein a first channel region is between the first source/drain;

removing a portion of the thickness of the fourth patterned photoresist layer to expose portions of the gate insulating layer on the second poly-silicon islands and the third poly-silicon islands;

removing portions of the conductive material layer with the fourth patterned photoresist layer as mask to form a plurality of second gates and a plurality of third gates;

removing the fourth patterned photoresist layer;

forming a first patterned passivation layer on the gate insulating layer to cover the first gates, the second gates, and the third gates, wherein the first patterned passivation layer exposes portions of the gate insulating layer on the first poly-silicon islands, the second poly-silicon islands, and the third poly-silicon islands;

removing portions of the gate insulating layer with the first patterned passivation layer as mask to expose portions of each of the first sources/drains, portions of each of the second sources/drains, and portions of each of the third sources/drains;

forming a plurality of first source/drain conductive layers, a plurality of second source/drain conductive layers, and a plurality of third source/drain conductive layers on the first patterned passivation layer, wherein the first source/drain conductive layers are electrically connected to the first sources/drains respectively, the second source/drain conductive layers are electrically connected to the second sources/drains respectively, and the third source/drain conductive layers are electrically connected to the third sources/drains respectively;

forming a second patterned passivation layer on the first patterned passivation layer, wherein the second patterned passivation layer exposes portions of each of the third source/drain conductive layers; and forming a plurality of pixel electrodes on the second patterned passivation layer, wherein each of the pixel electrodes is electrically connected to the corresponding third source/drain conductive layer.

9. The thin film transistor manufacturing method as claimed in claim 8, wherein after removing the fourth patterned photoresist layer, the method further comprises performing a lightly doped drain ion implantation process to form a second lightly doped drain between each of the second sources/drains and the second channel region and a third lightly doped drain between each of the third sources/drains and the third channel region.

10. The thin film transistor manufacturing method as claimed in claim 8, wherein the method for forming the first poly-silicon islands, the second poly-silicon islands, and the third poly-silicon islands comprises:

forming a poly-silicon layer on the substrate;

forming a first patterned photoresist layer on the poly-silicon layer by using a first half-tone mask;

removing portions of the poly-silicon layer with the first patterned photoresist layer as mask to form the first poly-silicon islands, the second poly-silicon islands, and the third poly-silicon islands;

removing the first patterned photoresist layer on the second poly-silicon islands and the third poly-silicon islands;

performing a channel doping process to implant ions into the second poly-silicon islands and the third poly-silicon islands; and removing the first patterned photoresist layer.

11. The thin film transistor manufacturing method as claimed in claim 10, wherein after removing the first patterned photoresist layer, the method further comprises:
  Performing a second ion implantation process to form the second source/drain in each of the second poly-silicon islands and the third source/drain in each of the third poly-silicon islands; and
  forming a gate insulating layer above the substrate to cover the first poly-silicon islands, the second poly-silicon islands, and the third poly-silicon islands.

12. The thin film transistor manufacturing method as claimed in claim 8, wherein the method for forming the second sources/drains and the third sources/drains comprises:
  forming the first poly-silicon islands, the second poly-silicon islands, and the third poly-silicon islands on the substrate;
  forming a second patterned photoresist layer on the first poly-silicon islands, the second poly-silicon islands, and the third poly-silicon islands by using a second half-tone mask;
  performing a second ion implantation process to form a second source/drain in each of the second poly-silicon islands and a third source/drain in each of the third poly-silicon islands;
  removing the second patterned photoresist layer on the second poly-silicon islands and the third poly-silicon islands;
  performing a channel doping process to implant ions into the second poly-silicon islands and the third poly-silicon islands; and
  removing the second patterned photoresist layer.

13. The thin film transistor manufacturing method as claimed in claim 12, wherein after removing the second patterned photoresist layer, the method further comprises forming a gate insulating layer above the substrate to cover the first poly-silicon islands, the second poly-silicon islands, and the third poly-silicon islands.

14. A manufacturing method of thin film transistor array substrate, comprising:
  forming a poly-silicon layer on a substrate, the substrate having a peripheral region and an array region;
  forming a first patterned photoresist layer on the poly-silicon layer by using a first half-tone mask;
  removing portions of the poly-silicon layer with the first patterned photoresist layer as mask to form a plurality of first poly-silicon islands, a plurality of second poly-silicon islands, and a plurality of third poly-silicon islands, wherein the first poly-silicon islands and the second poly-silicon islands are disposed on the peripheral region, and the third poly-silicon islands are disposed on the array region;
  removing the first patterned photoresist layer on the second poly-silicon islands and the third poly-silicon islands;
  performing a channel doping process to implant ions into the second poly-silicon islands and the third poly-silicon islands;
  removing the first patterned photoresist layer;
  performing a second ion implantation process to form a second source/drain in each of the second poly-silicon islands and a third source/drain in each of the third poly-silicon islands, wherein a second channel region is between the second source/drain and a third channel region is between the third source/drain;
  forming a gate insulating layer above the substrate to cover the first poly-silicon islands, the second poly-silicon islands, and the third poly-silicon islands;
  forming a plurality of first gates, a plurality of second gates, and a plurality of third gates on the gate insulating layer, wherein the first gates, the second gates, and the third gates are respectively disposed on the first poly-silicon islands, the second poly-silicon islands, and the third poly-silicon islands;
  performing a first ion implantation process to form a first source/drain in each of the first poly-silicon islands, there being a first channel region between the first source/drain;
  forming a first patterned passivation layer above the substrate to cover the first gates, the second gates, and the third gates;
  removing portions of the gate insulating layer with the first patterned passivation layer as mask to expose portions of each of the first sources/drains, portions of each of the second sources/drains, and portions of each of the third sources/drains;
  forming a plurality of first source/drain conductive layers, a plurality of second source/drain conductive layers, and a plurality of third source/drain conductive layers on the first patterned passivation layer, wherein the first source/drain conductive layers are electrically connected to the first sources/drains respectively, the second source/drain conductive layers are electrically connected to the second sources/drains respectively, and the third source/drain conductive layers are electrically connected to the third sources/drains respectively;
  forming a second patterned passivation layer on the first patterned passivation layer, wherein the second patterned passivation layer exposes portions of each of the third source/drain conductive layers; and
  forming a plurality of pixel electrodes on the second patterned passivation layer, wherein each of the pixel electrodes is electrically connected to the corresponding third source/drain conductive layer.

15. The thin film transistor manufacturing method as claimed in claim 14, wherein after forming the first gates, the second gates, and the third gates, the method further comprise performing a lightly doped drain ion implantation process to form a second lightly doped drain between each of the second sources/drains and the second channel region and a third lightly doped drain between each of the third sources/drains and the third channel region.

16. A manufacturing method of thin film transistor array substrate, comprising:
  forming a plurality of first poly-silicon islands, a plurality of second poly-silicon islands, and a plurality of third poly-silicon islands on a substrate, wherein the substrate has a peripheral region and an array region, the first poly-silicon islands and the second poly-silicon islands are disposed on the peripheral region, and the third poly-silicon islands are disposed on the array region;
  forming a second patterned photoresist layer on the first poly-silicon islands, the second poly-silicon islands, and the third poly-silicon islands by using a second half-tone mask;
  performing a second ion implantation process to form a second source/drain in each of the second poly-silicon islands and a third source/drain in each of the third poly-silicon islands, wherein a second channel region is between the second source/drain and a third channel region is between the third source/drain;

removing the second patterned photoresist layer on the second poly-silicon islands and the third poly-silicon islands;
performing a channel doping region to implant ions into the second poly-silicon islands and the third poly-silicon islands;
removing the second patterned photoresist layer;
forming a gate insulating layer above the substrate to cover the first poly-silicon islands, the second poly-silicon islands, and the third poly-silicon islands;
forming a plurality of first gates, a plurality of second gates, and a plurality of third gates on the gate insulating layer, wherein the first gates, the second gates, and the third gates are respectively disposed on the first poly-silicon islands, the second poly-silicon islands, and the third poly-silicon islands;
performing a first ion implantation process to form a first source/drain in each of the first poly-silicon islands, a first channel region being between the first source/drain;
forming a first patterned passivation layer above the substrate to cover the first gates, the second gates, and the third gates;
removing portions of the gate insulating layer with the first patterned passivation layer as mask to expose portion of each of the first sources/drains, portion of each of the second sources/drains, and portion of each of the third sources/drains;
forming a plurality of first source/drain conductive layers, a plurality of second source/drain conductive layers, and a plurality of third source/drain conductive layers on the first patterned passivation layer, wherein the first source/drain conductive layers are electrically connected to the first sources/drains respectively, the second source/drain conductive layers are electrically connected to the second sources/drains respectively, and the third source/drain conductive layers are electrically connected to the third sources/drains respectively;
forming a second patterned passivation layer on the first patterned passivation layer, wherein the second patterned passivation layer exposes portions of each of the third source/drain conductive layers; and
forming a plurality of pixel electrodes on the second patterned passivation layer, wherein each of the pixel electrodes is electrically connected to the corresponding third source/drain conductive layer.

17. The thin film transistor manufacturing method as claimed in claim 16, wherein after forming the first gates, the second gates, and the third gates, the method further comprises performing a lightly doped drain ion implantation process to forming a second lightly doped drain between each of the second sources/drains and the second channel region and a third lightly doped drain between each of the third sources/drains and the third channel region.

18. A manufacturing method of thin film transistor array substrate, comprising:
forming a poly-silicon layer on a substrate, the substrate having a peripheral region and an array region;
forming a first patterned photoresist layer on the poly-silicon layer by using a first half-tone mask;
removing portions of the poly-silicon layer with the first patterned photoresist layer as mask to form a plurality of first poly-silicon islands, a plurality of second poly-silicon islands, and a plurality of third poly-silicon islands, wherein the first poly-silicon islands and the second poly-silicon islands are disposed on the peripheral region, and the third poly-silicon islands are disposed on the array region;
removing the first patterned photoresist layer on the second poly-silicon islands and the third poly-silicon islands;
performing a channel doping process to implant ions into the second poly-silicon islands and the third poly-silicon islands;
removing the first patterned photoresist layer;
performing a second ion implantation process to form a second source/drain in each of the second poly-silicon islands and a third source/drain in each of the third poly-silicon islands, wherein a second channel region is between the second source/drain and a third channel region is between the third source/drain;
forming a gate insulating layer above the substrate to cover the first poly-silicon islands, the second poly-silicon islands, and the third poly-silicon islands;
forming a patterned conductive material layer on the gate insulating layer, wherein the patterned conductive material layer has a plurality of first gates disposed on the gate insulating layer over the first poly-silicon islands;
performing a first ion implantation process with the patterned conductive material layer as mask to form a first source/drain in each of the first poly-silicon islands, wherein a first channel region is between the first source/drain;
removing portions of the patterned conductive material layer to expose portions of the gate insulating layer on the second poly-silicon islands and the third poly-silicon islands and to form a plurality of second gates and a plurality of third gates;
forming a first patterned passivation layer on the gate insulating layer to cover the first gates, the second gates, and the third gates, wherein the first patterned passivation layer exposes portions of the gate insulating layer on the first poly-silicon islands, the second poly-silicon islands, and the third poly-silicon islands;
removing the gate insulating layer with the first patterned passivation layer as mask to expose portions of each of the first sources/drains, portions of each of the second sources/drains, and portions of each of the third sources/drains;
forming a plurality of first source/drain conductive layers, a plurality of second source/drain conductive layers, and a plurality of third source/drain conductive layers on the first patterned passivation layer, wherein the first source/drain conductive layers are electrically connected to the first sources/drains respectively, the second source/drain conductive layers are electrically connected to the second sources/drains respectively, and the third source/drain conductive layers are electrically connected to the third sources/drains respectively;
forming a second patterned passivation layer on the first patterned passivation layer, wherein the second patterned passivation layer exposes portions of each of the third source/drain conductive layers; and
forming a plurality of pixel electrodes on the second patterned passivation layer, wherein each of the pixel electrodes is electrically connected to the corresponding third source/drain conductive layer.

19. The thin film transistor manufacturing method as claimed in claim 18, wherein after forming the first gates, the second gates, and the third gates, the method further comprises performing a lightly doped drain ion implantation process to form a second lightly doped drain between each of the second sources/drains and the second channel region and a third lightly doped drain between each of the third sources/drains and the third channel region.

20. A manufacturing method of thin film transistor array substrate, comprising:

forming a plurality of first poly-silicon islands, a plurality of second poly-silicon islands, and a plurality of third poly-silicon islands on a substrate, wherein the substrate has a peripheral region and an array region, the first poly-silicon islands and the second poly-silicon islands are disposed on the peripheral region, and the third poly-silicon islands are disposed on the array region;

forming a third patterned photoresist layer on the first poly-silicon islands, the second poly-silicon islands, and the third poly-silicon islands by using a third half-tone mask;

performing a second ion implantation process to form a second source/drain in each of the second poly-silicon islands and a third source/drain in each of the third poly-silicon islands, wherein a second channel region is between the second source/drain and a third channel region is between the third source/drain;

removing the third patterned photoresist layer on the second poly-silicon islands and the third poly-silicon islands;

performing a channel doping process to implant ions into the second poly-silicon islands and the third poly-silicon islands;

removing the third patterned photoresist layer;

forming a gate insulating layer above the substrate to cover the first poly-silicon islands, the second poly-silicon islands, and the third poly-silicon islands;

forming a patterned conductive material layer on the gate insulating layer, wherein the patterned conductive material layer has a plurality of first gates disposed on the gate insulating layer over the first poly-silicon islands;

performing a first ion implantation process with the patterned conductive material layer as mask to form a first source/drain in each of the first poly-silicon islands, wherein a first channel region is between the first source/drain;

removing portions of the patterned conductive material layer to expose portions of the gate insulating layer on the second poly-silicon islands and the third poly-silicon islands and to form a plurality of second gates and a plurality of third gates;

forming a first patterned passivation layer on the gate insulating layer to cover the first gates, the second gates, and the third gates, wherein the first patterned passivation layer exposes portions of the gate insulating layer on the first poly-silicon islands, the second poly-silicon islands, and the third poly-silicon islands;

removing portions of the gate insulating layer with the first patterned passivation layer as mask to expose portions of each of the first sources/drains, portions of each of the second sources/drains, and portions of each of the third sources/drains;

forming a plurality of first source/drain conductive layers, a plurality of second source/drain conductive layers, and a plurality of third source/drain conductive layers on the first patterned passivation layer, wherein the first source/drain conductive layers are electrically connected to the first sources/drains respectively, the second source/drain conductive layers are electrically connected to the second sources/drains respectively, and the third source/drain conductive layers are electrically connected to the third sources/drains respectively;

forming a second patterned passivation layer on the first patterned passivation layer, wherein the second patterned passivation layer exposes portions of each of the third source/drain conductive layers; and forming a plurality of pixel electrodes on the second patterned passivation layer, wherein each of the pixel electrodes is electrically connected to the corresponding third source/drain conductive layer.

21. The thin film transistor manufacturing method as claimed in claim 20, wherein after forming the first gates, the second gates, and the third gates, the method further comprises performing a lightly doped drain ion implantation process to form a second lightly doped drain between each of the second sources/drains and the second channel region and a third lightly doped drain between each of the third sources/drains and the third channel region.

* * * * *